United States Patent [19]

Tanimoto

[11] Patent Number: 4,711,567
[45] Date of Patent: Dec. 8, 1987

[54] EXPOSURE APPARATUS

[75] Inventor: Akikazu Tanimoto, Yokohama, Japan

[73] Assignee: Nippon Kogaku K.K., Tokyo, Japan

[21] Appl. No.: 897,644

[22] Filed: Aug. 18, 1986

Related U.S. Application Data

[63] Continuation of Ser. No. 800,094, Nov. 20, 1985, Pat. No. 4,629,313.

[30] Foreign Application Priority Data

| Oct. 22, 1982 | [JP] | Japan | 57-184443 |
| Nov. 22, 1982 | [JP] | Japan | 57-204856 |
| Mar. 7, 1983 | [JP] | Japan | 58-35737 |
| Jul. 11, 1983 | [JP] | Japan | 58-125889 |
| Jul. 22, 1983 | [JP] | Japan | 58-133691 |

[51] Int. Cl.$^4$ ............................................. G03B 27/42
[52] U.S. Cl. .......................................... 355/53; 355/41
[58] Field of Search ............................ 355/41, 53, 54; 356/354, 356

[56] References Cited

U.S. PATENT DOCUMENTS

| 3,569,718 | 3/1971 | Borner | 355/53 |
| 4,465,368 | 8/1984 | Matsuura et al. | 355/53 |
| 4,506,977 | 3/1985 | Sato et al. | 355/53 |

Primary Examiner—Monroe H. Hayes
Attorney, Agent, or Firm—Michael N. Meller

[57] ABSTRACT

An exposure apparatus for optically transferring a pattern of a circuit such as an integrated circuit on a semiconductor wafer. The positioning control of stepping movement of a movable stage holding the wafer thereon is effected in such a manner that even if a rotational displacement is present in the optical image of a mask pattern with respect to the moving coordinate axes of the stage the rotational displacement is substantially cancelled in a printed pattern.

23 Claims, 66 Drawing Figures

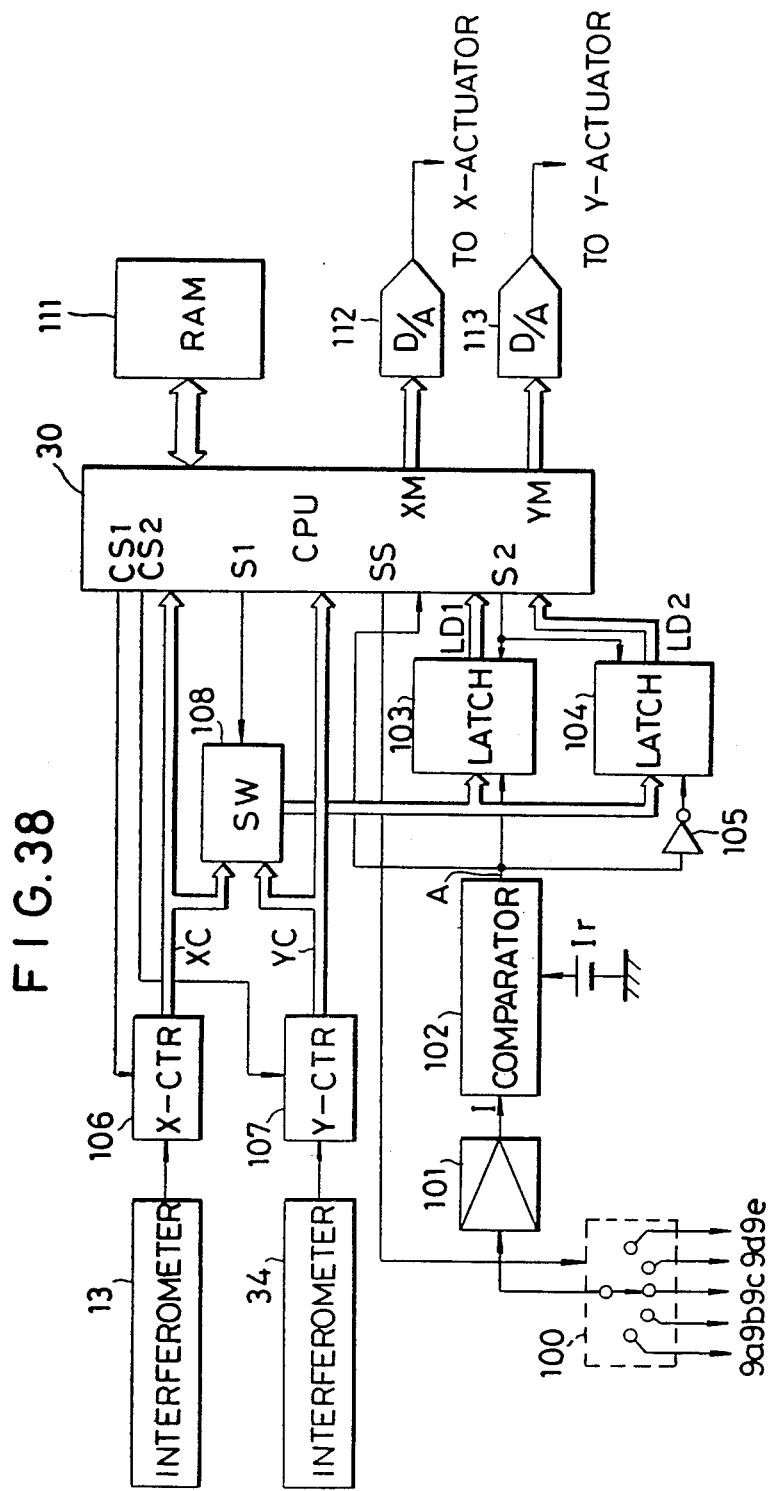
F I G. 38

FIG. 40
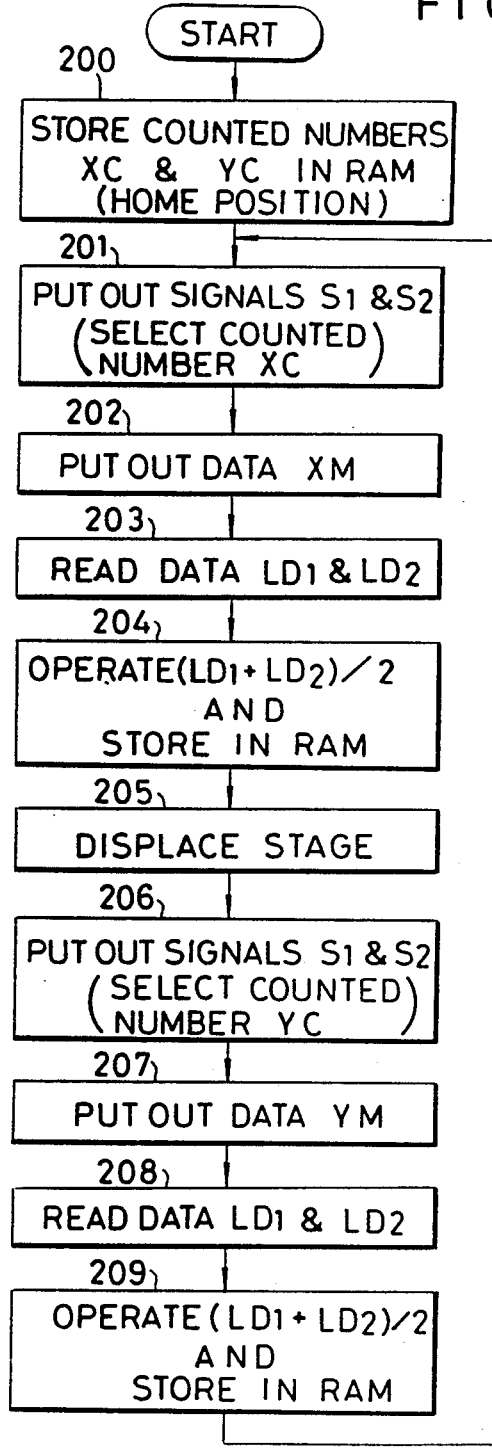
FIG. 39
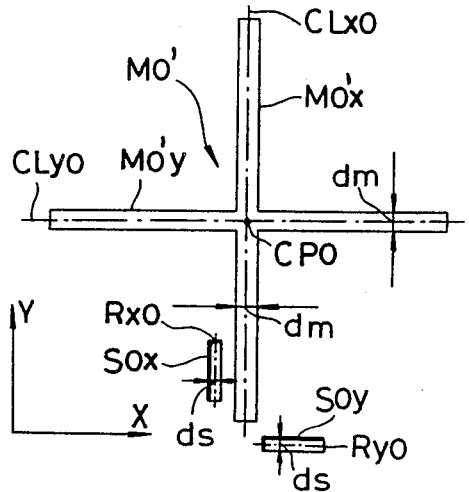
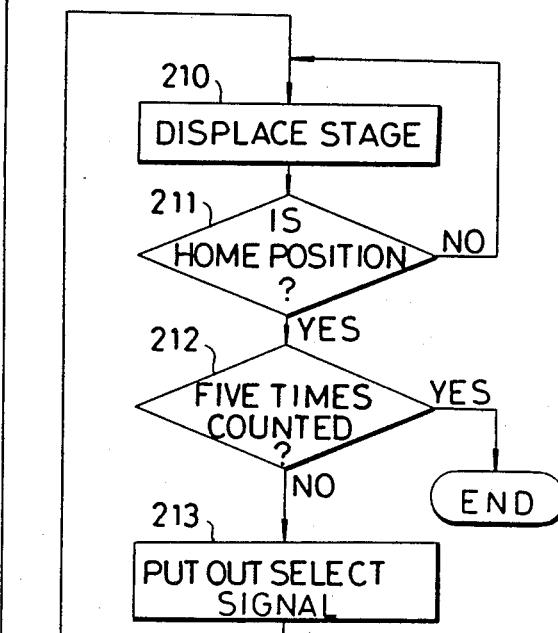

FIG. 43
|  | X | Y |
|---|---|---|
| CP0 | Xc0 | Yc0 |
| CP1 | Xc1 | Yc1 |
| CP2 | Xc2 | Yc2 |
| CP3 | Xc3 | Yc3 |
| CP4 | Xc4 | Yc4 |
FIG. 44
|  | x | y |
|---|---|---|
| M0 | x0 | y0 |
| M1 | x1 | y1 |
| M2 | x2 | y2 |
| M3 | x3 | y3 |
| M4 | x4 | y4 |
FIG. 45
|  | X | Y |
|---|---|---|
| S0 | a0 | b0 |
| S1 | a1 | b1 |
| S2 | a2 | b2 |
| S3 | a3 | b3 |
| S4 | a4 | b4 |
FIG. 46
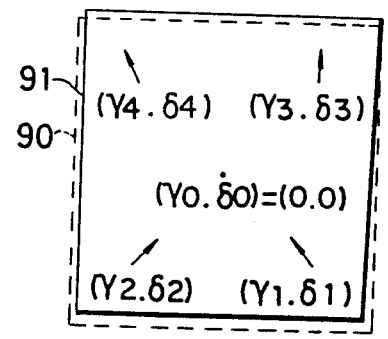
FIG. 47
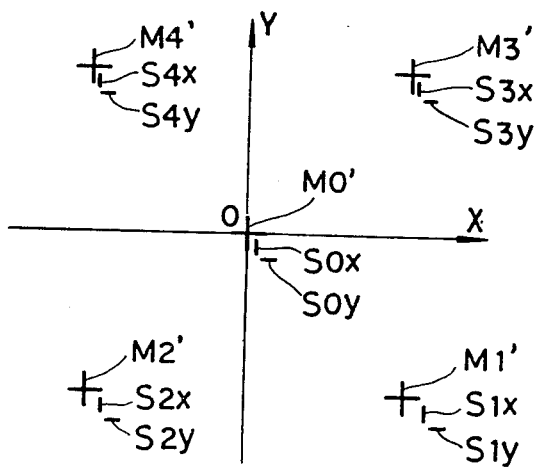

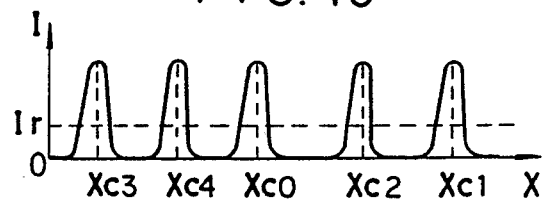
FIG. 48
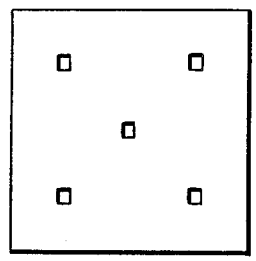
FIG. 49A
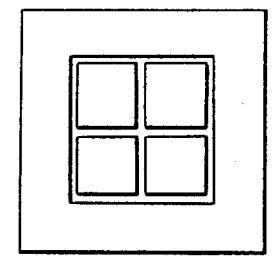
FIG. 49B
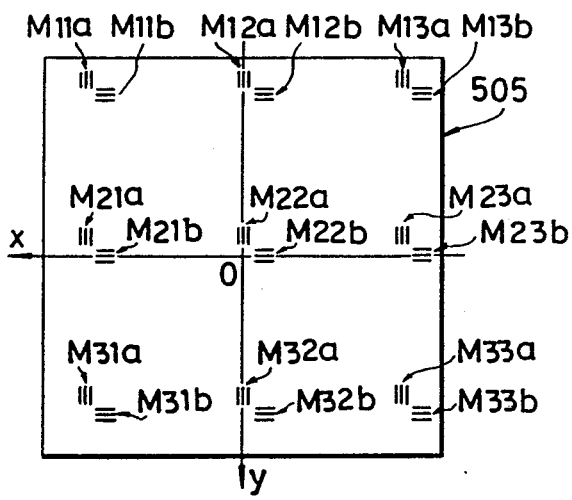
FIG. 50
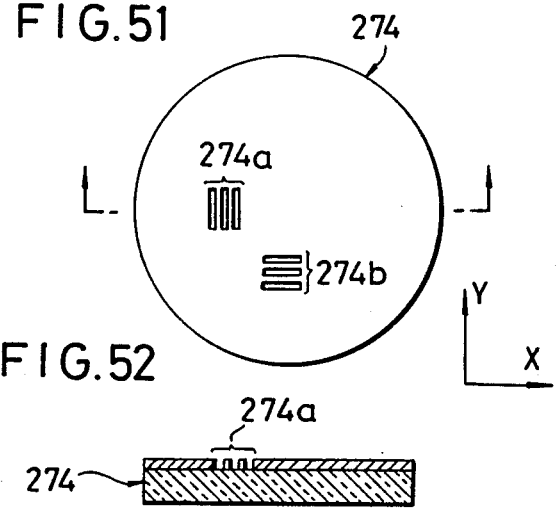
FIG. 51
FIG. 52
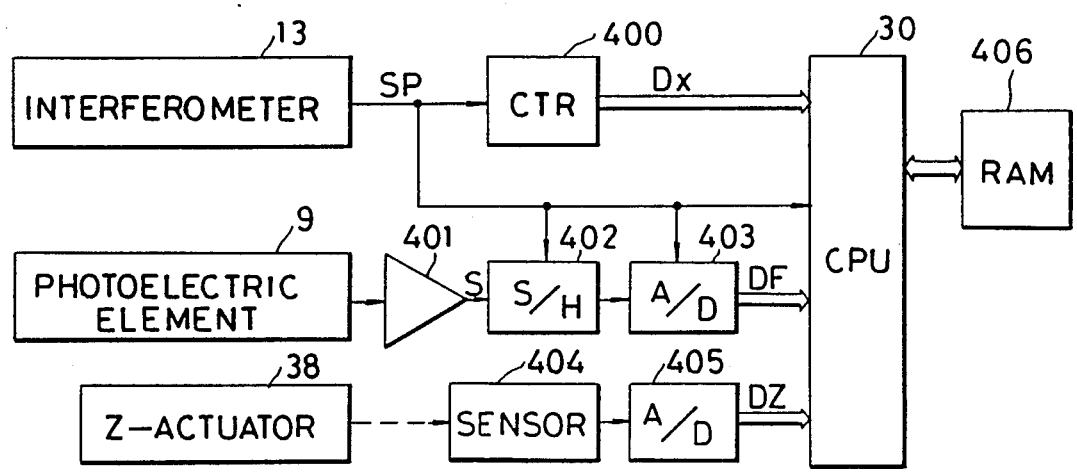
FIG. 53

EXPOSURE APPARATUS

This is a continuation of application Ser. No. 800,094 filed Nov. 20, 1985, now U.S. Pat. No. 4,629,313.

BACKGROUND OF THE INVENTION

Field of the Invention

The present invention relates to an exposure apparatus for optically transferring a circuit pattern, e.g., integrated circuit (IC) or the like, and more particularly the invention relates to an apparatus for detecting the characteristics of a focusing optical system which accurately aligns a mask or reticle with a wafer or an object to be exposed and forming an image of the mask or reticle on the object to be exposed.

Recently, there has been a rapid progress in the production of increasingly minute patterns of large-scale integrated circuits (LSI) and reduction projection type exposure apparatus have been becoming popular as circuit pattern printing apparatus which satisfy the needs for the production of increasingly minute patterns and increase the productivity. The apparatus uses a mask or reticle (hereinafter typically referred to as a reticle) containing a circuit pattern which is many times (e.g., ten tiems) a circuit pattern to be transferred or placed on a silicon wafer or the like and the pattern of the reticle is projected on a reduced scale on the wafer through a projection lens. As a result, that which can be printed by a single exposure is a square area of the order of 10 ×10 mm on the wafer at the most. Therefore, in order to print a circuit pattern on the entire surface of a wafer of about 125 mm in diameter, a method is used which repeats the operation of moving a wafer-supporting stage a predetermined distance two dimensionally and then exposing the wafer (this method is hereinafter referred to as a step-and-repeat method). As a result, this type of exposure apparatus is sometimes known as a stepper.

Also, in the production of LSI circuits, more than several layers of patterns are registered and printed and in this case the registration error between the layers must be kept below a given value, that is, the registration error of as small as about 0.2 $\mu$m, for example, is tolerable in the case of patterns having a minimum linewidth of 1 $\mu$m. Among the causes for such registration errors due to the exposure apparatus are ① a relative positional misplacement between the projected image and the wafer and ② a projection magnification error and projection distortion. To attain a highly accurate alignment for the purpose of reducing the registration error due to the cause of ①, two methods, i.e., an on-axis method and off-axis method have heretofore been in use.

Of these methods, the on-axis method is also called as a through-the lens method (hereinafter referred to as a TTL), since the alignment marks of both a reticle and a wafer are observed simultaneously through a projection lens. On the contrary, the off-axis method is one which involves no such observation through a projection lens.

In the conventional reduction projection-type exposure apparatus, the step-and-repeat operation is performed in such a manner that a wafer is placed on a stage through a wafer holder and the stage is moved on the basis of the origin of rectangular coordinates forming a plane of movement of the stage. A reticle containing a circuit pattern is positioned and held above the wafer in such a way that the projected image of the reticle has as small a rotational displacement as possible with respect to the rectangular coordinates. In this condition, a series of exposure and printing operations by the step-and-repeat method, that is, the operation of determining a coordinate position on the rectangular coordinates, moving and holding the stage in position and effecting the exposure is performed repeatedly. However, if there is any shift in the detection center of a position sensor of a photoelectric microscope used in the alignment of the reticle, the reticle aligned on the basis of the position sensor involves an alignment error with respect to the rectangular coordinate system and therefore the resulting pattern area printed on the wafer generally tends to cause a rotational error.

On the other hand, the projection lens is required to have a resolution of the submicron order and it is designed so as to minimize its chromatic aberration with respect to the wavelength of the light used for printing purposes. As a result, if a light which is different in wavelength from the light for printing purposes (the printing light) is used for sensing the alignment marks, the focusing position tends to be shifted considerably due to a high chromatic aberration. As an example, consider a case where the wavelength of the printing light is 436 mm and the alignment mark sensing light has a wavelength of 633 mm. In order to cause the two lights to form image on the same plane on the wafer side, the reticle must be moved in the direction of the optical by an amount which is about 200 times the depth of focus of the projection lens. Then, in order to simultaneously observe the reticle and the wafer by the TTL method, it is most preferable to make the observation by using a light having a wave-length which is the same or close to that of the printing light. However, this observation method is disadvantageous in that the height of the irregularities in the circuit patterns formed on the wafer by the previous steps exceed the depth of focus of the projected image, that the resolution condition is deteriorated by the interference effect between the printing light directed to the wafer and the reflected light from the wafer surface and so on.

Thus, a method is conceivable which comprises forming a first thick layer on the surface of a wafer to smooth the surface, forming on the first layer a second layer containing coloring matters for absorbing a printing light and further applying a photoresist to form a third layer on the second layer. However, this method gives rise to another disadvantage that if a light having the same or the similar wavelength as the wavelength of the printing light is used for alignment observing purposes or the like, the coloring matters in the second layer make it difficult to observe the objects (e.g., the marks provided for aligning purposes) below the second layer and hence it is impossible to ensure accurate alignment. On the other hand, while the absorption by the coloring matters in the second layer can be prevented if the observation is made by the TTL method using a light which is different in wavelength from the printing light, this is, as such, is still impossible to ensure the desired accurate alignment due to the previously mentioned high chromatic aberration of the projection lens.

One of the causes in ② for the registration error, i.e., the distortion is the distortion aberration of the projection optical system. The other of the causes in ② for the registration error, i.e., the magnification error can be reduced by varying the distance between the reticle and the principal point (the principal plane) of the projection optical system if the reticle side light beam of the projection optical system is not telecentric and it can be reduced by relatively shifting in the direction of the optical axis the positions of the component elements inside the projection optical system (e.g., the optical members such as the lenses) if the light beam is telecentric. As a result, the error due to the causes in ② is constant if there is no change in the distance between the reticle and the projection lens and the relative positions of the component elements within the projection optical system and it can be considered as a systematic error.

Then, the error due to ② or the systematic error can be stably maintained at a small value over a long period of time if the apparatus is adjusted so as to maintain the value of the error below a predetermined value while measuring the value and it is also necessary to minimize the value during the adjustment in the manufacture of exposure apparatus. To measure the error due to ②, a method is conceivable in which an image of a reticle containing a pattern of marks at a plurality of predetermined positions, i.e., so-called test reticle is printed in the photoresist on a wafer and the coordinates of the printed resist image of the marks are detected thereby comparing the detected coordinates and the mark coordinates on the reticle. With this method, however, certain labor and time are required for exposing the pattern of the test reticle onto the wafer and developing the pattern and it is also necessary to use an expensive detecting apparatus for detecting the resist images of the marks.

SUMMARY OF THE INVENTION

It is an object of the present invention to provide an exposure apparatus capable of detecting a rotational displacement in a short period of time with a high degree of accuracy and also capable of performing the exposure of successive mask patterns with high registration accuracy and high efficiency.

Thus, in accordance with the present invention there is provided an exposure apparatus including a stage supporting thereon an object to be exposed, such as, a wafer and adapted to make a two-dimensional movement in the directions of the coordinates of a rectangular coordinate system forming a plane of movement thereof, photoelectric sensing means mounted on the stage for sensing predetermined selective portions in an optical image of each mask pattern, e.g., images of marks contained in the mask pattern projected onto the stage, and position sensing means such as laser interferometers for detecting the coordinate positions on the rectangular system of the selective portions sensed by the photoelectric sensing means in response to the movement of the stage from for example a position using, as a reference, the origin of the rectangular coordinate system. In addition to the foregoing, preferably the apparatus includes control means comprising for example a microcomputer so as to collectively perform the desired program control and various computational operations, whereby in accordance with the positional information sensed by the photoelectric sensing means with respect to the optical image selective portions at the plurality of positions which are different from each other the control means computes the amount of rotational displacement (slope) of the mask pattern optical image with respect to the coordinate axes. In accordance with a preferred embodiment of the invention, another rectangular coordinate system is determined whose coordinate axes are rotated with respect to the first rectangular coordinate system so as to cancel the amount of rotary displacement and the stage is moved stepwise to effect the alignment.

In accordance with the invention, instead of reducing the rotational displacement itself of a mask pattern optical image with respect to the moving coordinate axes of the stage, a position control of the stage movement can be performed in such a manner that the presence of any rotational displacement has substantially no effect on the resulting printed pattern.

It is a second object of the invention to provide a projection type exposure apparatus in which a stage supporting thereon an object to be exposed or a wafer and a mask or reticle can be placed in a highly accurate corresponding relation with each other so as to align the relative positions of the wafer and the mask or reticle without observing the images of alignment marks on the wafer and the alignment marks on the mask or reticle through a projection optical system.

It is a third object of the invention to provide an exposure apparatus so designed that the desired alignment can be effected automatically with a high degree of accuracy even if a chromatic aberration is present in a projection optical system due to the difference in wavelength between a printing light and an alignment light for aligning purposes.

More specifically, there is provided an exposure apparatus comprising a stage supporting thereon an object to be exposed and adapted for two dimensional movement, illuminating means for illuminating a reticle containing marks with a light having a given exposure light wavelength and a projection optical system for projecting an image of the illuminated reticle onto the object to be exposed, whereby a photoelectric sensor is arranged on the stage so as to detect mark images of the reticle which are projected through the projection optical system by a light having substantially the same wavelength as the exposure wavelength. In accordance with an embodiment, the stage includes reference marks consisting of light transmitting and reflecting portions and the photoelectric sensor is embedded in the stage so as to detect the mark images of the reticle which are passed through the light transmitting portions of the reference marks.

In accordance with the present invention, by virtue of the fact that the projected images of the marks provided on the reticle are directly detected by the photoelectric sensor included in the stage, it is not necessary to use an optical system for detecting the projected images of the marks as reflected images through the projection optical system and therefore the positions of the reticle and the stage are brought into agreement with extreme accuracy without being affected by the optical transfer function of a detecting optical system, the flare which is not apparent in the designing, etc., thereby very accurately aligning the relative positions of the reticle and the object to be exposed.

It is a fourth object of the invention to provide a projection exposure apparatus capable of detecting the optical characteristics, e.g., projection magnification and projection distortion of a focusing optical system at a high speed with a high degree of accuracy.

In accordance with an embodiment of the projection exposure apparatus designed to detect the characteristics of a focusing optical system, the apparatus includes illuminating means for illuminating a mask containing a given mark at each of a plurality of predetermined positions, photoelectric sensing means for photoelectrically sensing the mark projection images of a mask projected by a focusing optical system to be detected, the sensing means being movable two dimensionally within the projeciton plane of the focusing optical system, and coordinate detecting means responsive to the output from the photoelectric sensing means to detect the coordinates of the projection positions of the mark projection images, whereby detecting the optical characteristics of the focusing optical system in accordance with the projection positive information of the plurality of mark projection images detected and the position information of the marks on the mask.

In accordance with a second embodiment of the projection exposure apparatus designed to detect the characteristics of a focusing optical system, the apparatus projects through the focusing optical system to be detected an image of a mask (reticle) containing a plurality of first marks of preliminarily known positions, and it includes photoelectric sensing means having a plurality of second marks of preliminarily known positions arranged within a plane substantially corresponding with the image forming plane of the focusing optical system and adapted to detect the alignment of the second marks with the projected images of the first marks, position sensing means whereby when the photoelectric sensing means and the projected images of the first marks are relatively moved by for example a stage adapted for two-dimensional movement the positions of the projected images of the first marks on the image forming plane of the focusing optical system are detected in accordance with the photoelectric output of the photoelectric sensing means, and detecting means responsive to the detected projection position information, the position information of the first marks of the mask and the position information of the second marks of the photoelectric sensing means to detect the optical characteristics of the focusing optical system, such as, a magnification error or image distortion.

In accordance with a third embodiment of the projection exposure apparatus designed to detect the characteristics of a focusing optical system, a slit photoelectric sensor is formed with a plurality of slits and also a plurality of fine line elements are arranged in a mask whose image is projected by a focusing optical system. The photoelectric sensor and the optical images of the fine line elements formed by the focusing optical system are relatively moved within a plane vertical to the optical axis so that photoelectric signals are generated when the optical images of the fine line elements are aligned with the slits (small openings) of the photoelectric sensor. The generation of photoelectric signals is repeated several times by varying the distance between the focusing optical system and the slits of the photoelectric sensor. The technical essential point resides in the fact that the position of the image forming plane of the focusing optical system is detected in accordance with the thus generated photoelectric signals.

The above and other objects as well as advantageous features of the invention will become more clear from the following description taken in conjunction with the drawings.

BRIEF DESCRIPTION OF THE DRAWINGS

FIG. 38 is a block diagram showing circuitry of the fourth embodiment for detecting the image positions of the marks on a reticle.

FIG. 39 is a plan view showing the positional relation between the projected image of a mark and slits.

FIG. 40 is a flow chart for detecting the projection positions of marks.

FIG. 43 is a diagram showing the detected data group in a memory.

FIG. 44 is a diagram showing the test reticle mark position data group stored in the memory.

FIG. 45 is a diagram showing the slit member-slit position data group stored in the memory.

FIG. 46 is a diagram for explaining a projection error of a focusing optical system.

FIG. 47 is a plan view showing the relation between the mark projection image and the slits in accordance with a modification of the fourth embodiment of the invention.

FIG. 48 is a waveform diagram of the photoelectric signals generated in the modification of the fourth embodiment.

FIG. 49A and 49B are plan views showing another modifications of the reticle marks.

FIG. 50 is a plan view of a reticle used with a fifth embodiment of invention.

FIG. 51 is a plan view of a slit plate.

FIG. 52 is a sectional view taken along the arrow line of FIG. 51.

FIG. 53 is a block diagram of circuitry for detecting the projection positions of reticle marks and the position of an image plane by means of a photoelectric element and a laser interferometer.

DESCRIPTION OF THE PREFERRED EMBODIMENTS

Figure 1:
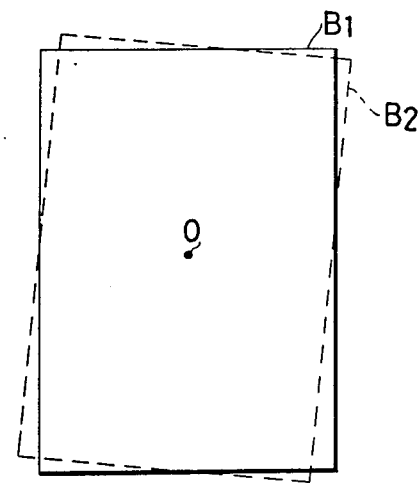
FIG. 1 is a diagram showing the relative rotational displacements of patterns placed one upon another.

FIG. 1 is a diagram showing exaggeratedly the condition in which a rotational displacement has taken place. In the Figure, a solid-line rectangular pattern area $B_1$ is a circuit pattern area previously formed on a wafer and a rectangular pattern area $B_2$ shown by a broken line in a slightly rotated condition with respect to the area $B_1$ is registered, exposed and printed. In this case, assuming that the center O of the diagonal line of the area $B_1$ completely coincides with the center of the diagonal line of the area $B_2$, then a rotational displacement may occur in any other portion of the area $B_2$ than the center O with respect to the area $B_1$.

Figure 2:
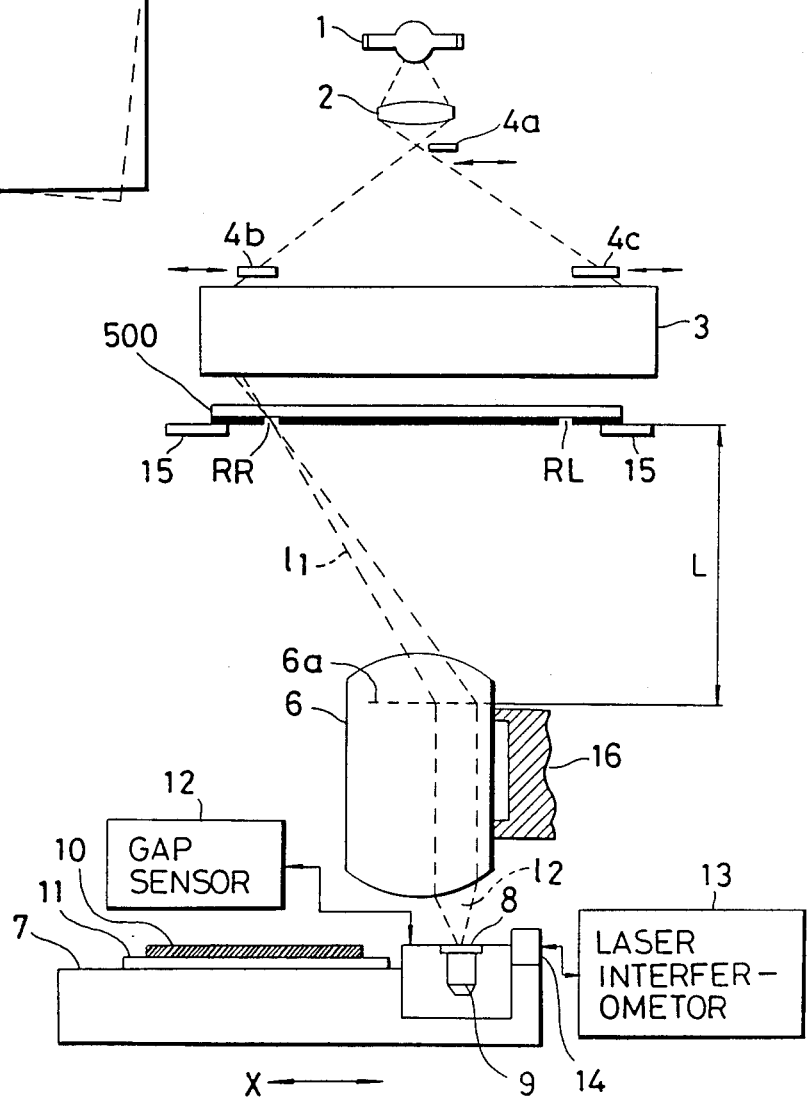
FIG. 2 is a diagram schematically showing the construction of a reduction projection-type exposure apparatus according to the invention.

FIG. 2 is a diagram schematically showing the construction of a reduction projection-type exposure apparatus according to a first embodiment of the invention to which the rotational displacement detection is applied by way of example. In the Figure, the illuminating light from an exposure illuminating light source 1 is first converged by a first condensing lens 2 and then it reaches a second condensing lens 3. Disposed at the light converging position in the light path is a shutter $4_a$ for blocking the passage of the illuminating light at any desired time. The light beam passed through the second condensing lens 3 illuminates a test reticle 500 (hereinafter simply referred to as a reticle) serving as a mask. The light beam passed through the reticle 500 falls on a projection lens 6 forming an imaging or focusing optical system and carried on a holding memember 16. The projection lens 6 forms an optical system whose reticle 500 side or the object side is non-telecentric and image side is telecentric. Disposed just below the projection lens 6 is a stage 7 which normally holds a semiconductor wafer 10 thereon and makes two-dimensional movements in the X and Y direcitons of a first rectangular coordinate system forming its plane of movement. The wafer 10 is placed on a wafer holder 11 which is moved along with the stage 7 for two-dimensional movement. The wafer holder 11 is mounted so as to make slight rotational and vertical movements with respect to the stage 7. The wafer holder 11 is vertically movable such that the projected image of the circuit pattern (not shown) of the reticle 500 through the projection lens 6 is focused on the surface of the wafer 10, that is, the focusing is effected.

In addition to the circuit pattern, the lower surface of the reticle 500 is formed with light transmitting marks RR and RL which are formed at predetermined positions at the left and right ends. When a light beam $l_1$ passed through the mark RR of the reticle 500 is noted, the light beam $l_1$ focused by the projection lens 6 so that it is emitted as a light beam $l_2$ from the image side of the projection lens 6 to form an image of the mark RR on a fine slit member 8 provided on the stage 7. Note that the distance between the lower surface of the reticle 500 and a principal plane $6_a$ of the projection lens 6 is selected L. The fine slit member 8 is combined with a photoelectric sensor 9 serving as photoelectric converting means for receiving the light passed through the fine slit member 8 and generating an electric signal, and also the slitted surface of the fine slit member 8 is arranged at substantially the same level with the height of the surface of the wafer 10 on the stage 7 so that the fine slit member 8 and the photoelectric sensor 9 are vertically movable as a unit in response to the vertical rocking movement of the wafer holder 11 as mentioned previously. For the purpose of this focusing operation, a gap sensor 12 is provided to detect or measure the gap between the projection lens 6 and the surface of the wafer 10 (or the slitted surface of the fine slit member 8). It is possible to effect an automatic focusing control by means of the gap sensor 12 and the lifting mechanism of the wafer holder 11 so that during the printing of the circuit pattern of the reticle 500 on the wafer 10, the height of the surface of the wafer 10 is detected and the transfer of a projection image having high contrast is effected at all times.

On the other hand, the position of the stage 7 on the first rectangular coordinate system XY can be determined by detecting the distance to the reflecting mirrors fixed to the stage 7 by laser interferometers using laser beam. While, in FIG. 2, only a laser interferometer 13 and a reflecting mirror 14 for the X-axis direction (the lateral direction in the Figure) are shown, another combination of a laser interferometer and a reflecting mirror is similarly provided with respect to the Y-axis direction (the vertical direction to the paper plane) which crosses the X axis at right angles to form the moving plane of the stage 7. These laser interferometers successively detect the positional coordinate values of the stage 7 with respect to the origin of the first rectangular coordinate system XY preliminarily set in the apparatus during the stepping movement of the stage 7, and in this embodiment the origin of the first rectangular coordinate system XY is placed on the optical axis of the projection lens 6. As a result, the X-axis and Y-axis laser interferometers are arranged so that the intersections of the two detection axes formed by the laser beams are positioned on the optical axis of the projection lens 6.

A reticle holder 15 holds the reticle 500 and it is movable two-dimensionally on a second rectangular coordinate system xy within a plane parallel to the XY plane of the first rectangular coordinate system, thus effecting the alignment of the reticle 500 in response to the drive control by a reticle alignment control system which will be described later.

Further, shutters 4b and 4c are arranged at the ends on the incident side of the second condensing lens 3 so that in the illuminating light path from the illuminating light source 1 to the reticle 5 only the incident light to the marks RR and RL of the reticle 500 are blocked when occasions demand and their mounting positions are not limited to the illustrated positions.

Figure 3:
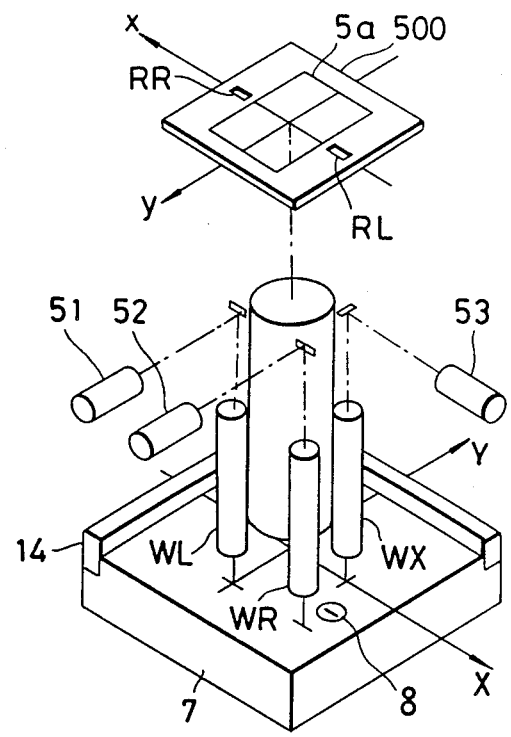
FIG. 3 is a schematic perspective view showing the positions of light transmitting marks in a reticle and the arrangement of three aligning microscopes around a projection lens.

While the reticle 500 is provided with the light transmitting marks RR and RL as mentioned previously, more specifically the marks RR and RL are comprised of light transmitting slits formed in the light shielding portion around a circuit pattern area $5a$ of the reticle 5 to extend for example in the X-axis direction as shown in FIG. 3. While, in the case of FIG. 3, the marks RR and RL are formed at the two positions which are apart from each other on the x axis of the second rectangular coordinate system xy whose origin is the center of the reticle 500, the similar light transmitting marks may also be provided on the y axis.

Note that the image of the pattern of the reticle 500 projected by the projection lens 6 is an inverted image with respect to the x and y coordinates and therefore the directions of the coordinate system xy of the reticle 500 and the coordinate system XY of the stage 7 are reversed in FIG. 3.

As a result, if the plane containing the x axis, the optical axis of the projection axis 6 and the X axis is defined and also another plane containing the y axis, the optical axis of the projection lens 6 and the Y axis is defined when the reticle 500 is fixedly mounted on the reticle holder 15, the rotational displacement of the reticle 500 with respect to the stage 7 is reduced to zero.

Figures 4, 5:
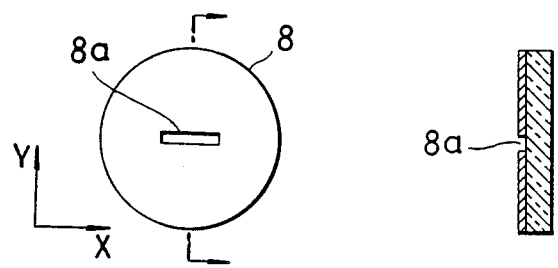
FIG. 4 is a plan view showing an example of a fine slit or opening member.
FIG. 5 is a sectional view taken along the arrow line in FIG. 4.

The stage 7 is provided with the fine slit member 8 for detecting the projected images of the marks RR and RL on the reticle 500 as mentioned previously. As shown in FIG. 4, the fine slit member 8 is formed by evaporating a layer of chromium or the like over the entire surface of a circular glass plate and forming a slit opening 8a in a part of the chromium layer. FIG. 5 is a sectional view taken along the arrow line of FIG. 4 and the longitudinal direction of the slit opening 8a extends in the same direction with the X axis of the first rectangular coordinate system XY. Also, the width of the slit opening 8a in the Y-axis direction is selected in consideration of the reduction ratio of the projection optical system such that when an image of the mark RR or RL is formed on the slitted surface of the member 8a, the slit width becomes substantially equal to the width in the Y-axis direction of the projected image of the mark.

The origin of the first rectangular coordinate system XY lies on the optical axis of the projection lens 6 as mentioned previously. In accordance with the present embodiment, the detection of the position coordinates of the stage 7 by the laser interferometers is effected by a digital counter incorporated in each of the laser interferometers for the X-axis and Y-axis directions using a digital measuring method in the same manner as the conventional method. Each of the counters increases or decreases its count value in response to the movement of the stage 7 and it is necessary to arrange so that when for example the power is supplied to the apparatus, the origin position of the stage 7 is determined and each of the counters is reset to zero or preset to a given value at the origin position. In this case, the orientation of the stage 7 to the origin position can be effected by utilizing the slit opening 8a. In other words, the coincidence between the slit opening 8a and the image of the mark RR (or RL) is detected in accordance with the output of the photoelectric sensor 9 and then the counter in the Y-axis direction laser interferometer or the Y-counter is reset to zero. Precisely, considering the rotational displacement of the reticle 500, in accordance with count values Yr and Ye of the Y-counter attained in response to the alignment of the slit opening 8a with the image of the marks RR and RL, respectively, the Y-counter is reset to zero when the stage 7 is positioned in the Y-axis direction so that the Y-counter attains $(Yr+Yl)/2$ and the Y-axis origin positioning is effected. This is the same with respect to the X-axis direction and it is only necessary to provide a pair of similar light transmitting marks (not shown) along the y axis of the reticle 500 and another slit opening in the fine slit member 8 to extend in a direction perpendicular to the slit 8a and then reset the counter in the X-axis direction laser interferometer or the X-counter by the similar procedure as mentioned previously. In this way, the origin of the coordinate system is set and thereafter the position of the stage 7 is successively detected during its two-dimensional movements in accordance with the position coordinates of the first rectangular coordinate system which is based on the thus determined origin.

The apparatus of this embodiment further includes photoelectric microscopes used for aligning the wafer 10 and these microscopes are arranged as shown in FIG. 3. In other words, these microscopes project light onto wafer marks of particular shapes formed in the wafer 10 for aligning purposes as will be described later and photoelectrically detect the reflected light from the wafer. In other words, as shown in FIG. 3, photoelectric microscope propers 51, 52 and 53 for projecting light and detecting the reflected light and light projecting and detecting lenses WL, WX and WR around the lens barrel of the projection lens 6 are fixedly arranged in the off-axis manner. The first microscope proper 51 is provided to 1detect the position of the wafer 10 in the Y-axis direction and it is arranged such that its center of detection (center of observation) is positioned on the Y axis in the standard condition. The second microscope proper 52 detects the position of the wafer 10 in the X-axis direction and it is arranged so that its center of detection (or center of bbservation) is positioned on the X axis in the standard condition. In this way, the microscope propers 51 and 52 have their centers of detection aligned with the X and Y axes, respectively, for the purpose of eliminating any error due to the aberration in the detection of the position of the wafer 10. The third microscope proper 53 is paired with the first microscope proper 51 so as to detect the rotational deviation of the wafer 10 and it is arranged such that a segment connecting its center of detection (center of observation) and that of the second microscope proper 52 is parallel to the X axis in the standard condition.

These three microscopes are photoelectric microscopes so designed that the wafer marks of special shapes, e.g., short linear wafer marks are transferred and formed by the pattern printing of the first layer inside the circuit pattern on the wafer 10 or on the latticed exterior of the circuit pattern (hereinafter referred to as street lines) for the exposure purposes of the second layer et seg., and the photoelectric microscopes scan the wafer marks by means of oscillatory slits or laser oscillatory beam to detect them. Their centers of detection are determined for example to align with the center of oscillation of the oscillatory slits or the oscillatory beam, and in particular the optical system of the third microscope proper 53 includes for example a rotatable parallel flat glass so as to slightly displace the detection center in the Y-axis direction.

Figure 6:
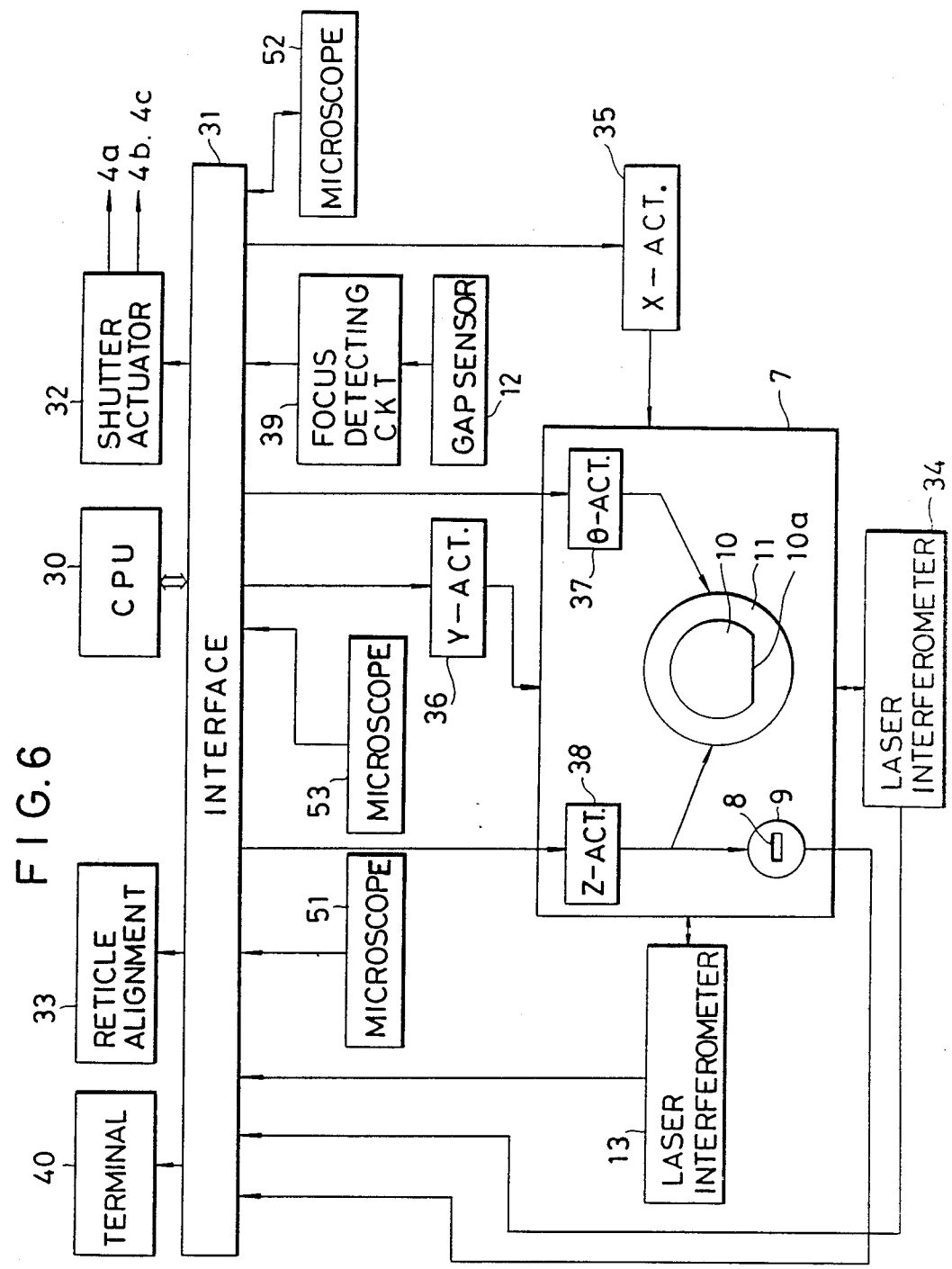
FIG. 6 is a block diagram showing the construction of an exposure apparatus control system according to a first embodiment of the invention.

The block diagram of FIG. 6 shows the principal construction of a control system for controlling the apparatus shown in FIGS. 2 and 3. The apparatus on the whole is collectively controlled by a microcomputer 30 (hereinafter referred to as a CPU) ihcluding memories, etc., so as to perform the controls and various computational operations in accordance with programs. The CPU 30 performs the transmission and reception of various data with peripheral equipment including sensing means, detecting means and actuating means through an interface 31. A shutter actuator 32 is responsive to the commands from the CPU 30 to open and shut the shutters 4a, 4b and 4c, and a reticle alignment 33 moves and aligns the reticle holder 15 so as to place the reticle 500 in position with respect to the optical axis of the projection lens 6. On the other hand, the X-axis direction position data of the stage 7 read by the X-axis laser interferometer 13 and the Y-axis direction position data of the stage 7 read by the Y-axis laser interferometer 34 are sent to the CPU 30 through the interface 31. Also, in order to move the stage 7 two dimensionally, an X-actuator 35 for moving the stage 7 in the X-axis direction and a Y-actuator 36 for moving the stage 7 in the Y-axis direction are provided to operate in response to the commands from the CPU 30. Also, a $\theta$-actuator 37 for causing the wafer holder 11 on the stage 7 to make a small rotary movement and a Z-actuator 38 for vertically moving the wafer holder 11 and the combination of the fine slit member 8 and the photoelectric sensor 9 as a unit are provided to operate in response to the commands from the CPU 30. The photoelectric output signal from the photoelectric sensor 9 is also applied to the CPU 30 through the interface 31, and a focus detecting circuit 39 receives the signal from the gap sensor 12 shown in FIG. 2 and applies an informaiton indicative of the difference between the surface of the wafer 10 (or the slitted surface of the fine slit member 8) and the focusing position of the projection lens 6 to the CPU 30 through the interface 31. Also, an output terminal 40, such as, a monitor CRT display for displaying the detected results and the operating conditions or a printer is connected to the CPU 30 through the interface 31.

Also, as shown in FIG. 3, the microscopes 51, 52 and 53 comprise photoelectric microscopes or laser spot scan-type wafer mark sensing means and each of them applies a mark detection signal to the CPU 30 through the interface 31 when its detection center is aligned with given one of the wafer marks on the wafer 10. Note that the focusing data detected by the gap sensor 12 and the focus detecting circuit 39 is of course applied to the CPU 30 during the detection of the wafer marks by the microscopes 51, 52 and 53.

The microscope 52 includes a parallel flat glass or prism which is controlled by the command from the CPU 30 to rotate or move a desired amount and thereby shift by a small amount the center of oscillation of the oscillatory slit or the oscillatory beam and the light transmitting path of the laser beam in the Y-axis direction.

Figure 7:
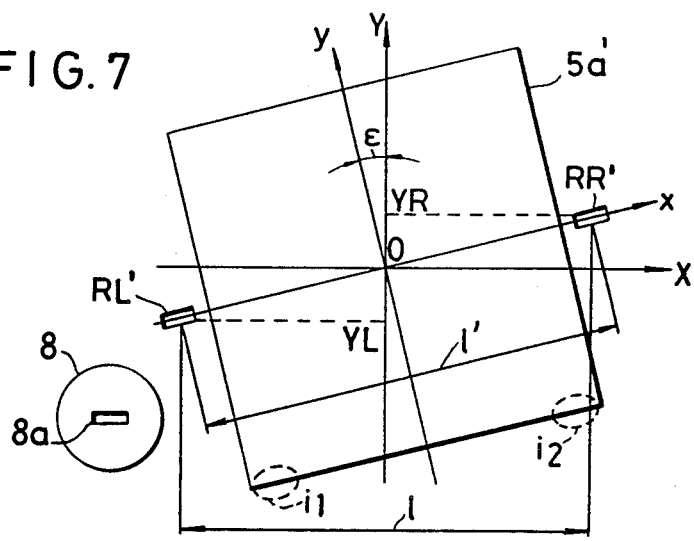
FIG. 7 is an enlarged view showing an image of a circuit pattern of projected onto a wafer.

With the construction described above, after the reticle 500 has been placed on the reticle holder 15 and the reticle 500 has been aligned by the reticle alignment 33, the pattern contained in the reticle 500 is projected onto the wafer 10 and the resulting optical image becomes as shown in FIG. 7.

FIG. 7 shows a projected image 5a' of a pattern area 5a of the reticle 500 with respect to the first rectangular coordinate system XY which is detected by the laser interferometers 13 and 34. Also, the marks RR and RL of the reticle 500 are projected as images RR' and RL' on the both sides of the projected image 5a' along the x axis. Here, it is assumed that the origin of the internal coordinate system xy of the projected image of the reticle 500 is coincident with the origin 0 of the rectangular coordinate system XY of the stage 7 and the distortion aberration in the projection lens 6 is considered negligible. Usually, the second rectangular coordinate system xy involves a registration error due to the rotational displacement with respect to the first rectangular coordinate system XY and FIG. 7 shows the amount of this rotational displacement in an exaggerated manner. The amount of the rotational displacement is represented by an angle e. In accordance with the embodiment of this invention, instead of adjusting the rotational displacement so as to make the angle $\epsilon$ so small as to be negligible, the movement of the stage 7 is controlled so as to substantially eliminate the effect of the angle $\epsilon$ on the printed pattern and thereby prevent the occurrence of any registration error due to the rotational displacement.

In FIG. 7, the mark images RL' and RR' form a part of the projected image of the reticle 500 and it is assumed that their y axis coordinate values are the same. Also, it is assumed that the height of the projection plane of the reticle 500 corresponds to the height of the slitted surface of the fine slit member 8 and the member 8 is adapted for two-dimensional movement within the projection plane along with the movement of the stage 7. Now describing the detecting method of the angle $\epsilon$, the desired focusing is first effected by means of the gap sensor 12, the focus detecting circuit 39 and the Z-actuator 38 in such a manner that the projected image of the reticle 500 is focused on the slitted surface of the fine slit member 8. Then, the stage 7 is moved so that the mark images RR' and RL' are scanned by the slit opening 8a and the positions of the mark images RR' and RL' on the first rectangular coordinate system XY are detected in accordance with the outputs of the photoelectric sensor 9 and the outputs of the laser interferometers 13 and 34. This may for example be accomplished in such a manner that when the slit opening 8a is moved in the Y axis in FIG. 7 to scan the mark image RR' or RL', the photoelectric sensor 9 generates a peak value upon the registration of the slit opening 8a and the mark image and the laser interferometers 13 and 34 detect the position at which the peak value is obtained. Then, if the thus measured Y-coordinate values of the mark images RR' and RL' are respectively represented YR and YL and if l represents the distance between the mark images RR' and RL' obtained from the amount of movement of the stage 7 in the X-axis direction, the angle $\epsilon$ which is usually a small angle is given by the following equation (1)

$$\epsilon = \tan^{-1}(YR - YL)/l \quad (1)$$
$$\approx (YR - YL)/l$$

Also, if the distance between the marks RR and RL on the reticle 500 is already known, a distance l' between the projected images RR' and RL' in the x-axis direction is readily obtained and thus the angle $\epsilon$ can also be given by the following equation (2)

$$\epsilon = \sin^{-1}(YR - YL)/l' \quad (2)$$
$$\approx (YR - YL)/l'$$

In this way, the angle $\epsilon$ is preliminarily obtained and it is used as a direction correction data for the stepping movement of the stage 7 during the following exposure operation by the step-and-repeat method.

In the above description, the detecting accuracy of the rotational displacement (the angle $\epsilon$) is improved as the distance to the circuit pattern area 5a' of the mark images RR' and RL', respectively, increases in FIG. 7. Also, longer is the length of the slit shape of the slit opening 8a of the fine slit member 8 and the mark images RR' and RL', respectively, greater is the amount of light detected with the resulting improvement of the detecting accuracy. Where the length of the distance l or l' is increased, the mark images RR' and RL' are superposed on the adjacent circuit pattern area images which are exposed repeatedly. In such a case, the shutters 4b and 4c are used to selectively block only the incident light to the mark images RR' and RL' from the illuminating light source for the reticle 500 such that the shutters 4b and 4c are opened only during the time that the rotational displacement (the angle $\epsilon$) is detected and the shutters 4b and 4c are shut during the exposure of circuit patterns.

On the other hand, where the detecting accuracy of the rotational displacement needs not to be so high, instead of using any special marks such as the mark images RR' and RL', it is possible to arrange so that the ends of the line parallel to the x axis within the circuit pattern area image 5a', such as, the ends of the image of the boundary line between the pattern area and the surroundings are used to scan the slit opening 8a. For instance, the detection of positions $i_1$ and $i_2$ in FIG. 7 is effected by using the measured values of the laser interferometers 13 and 14 at the center of the rising portion or the falling portion of the output signals generated from the photoelectric sensor 9 in response to the crossing of the light and dark boundary of the positions $i_1$ and $i_2$ by the slit opening 8a.

Next, the exposure operation performed by the apparatus of this embodiment will be described.

Firstly, the exposure operation for printing the first layer of the circuit patterns on the wafer 10 will be described with reference to FIGS. 8, 9 and 10.

In this case, no circuit pattern and aligning marks are present on the surface of the wafer 10 and therefore the wafer 10 is placed and chucked onto the wafer holder 11 on the basis of a facet or flat 10a which is a straight-line cut formed on a part of the outer periphery of the wafer 10 as shown in FIG. 6. In this embodiment, the wafer 10 is aligned so that the straight-line direction of the facet 10a is aligned with the X-axis direction of the stage 7. Then, the surface of the wafer 10 is focused on the projected image forming plane by means of the gap sensor 12, the focus detecting circuit 39 and the Z-actuator 38. Then, the operation of moving the stage 7 by predetermined distances by the laser interferometers 13 and 34, the X-actuator actuator 35 and the Y-actuator 36, opening the shutter 4a a predetermined time and then exposing and transferring a reduced projected image of the pattern area 5a of the reticle 500 onto the wafer 10 is repeated. In this case, the shutters 4b and 4c are closed to prevent the images of the marks RR and RL from being transferred onto the wafer 10. In this way, the reduced image of the pattern area 5a is transferred and printed in a matrix form on substantially the entire surface of the wafer 10.

In this case, if the exposure and transferring operations are performed by the step-and-repeat method while the previously mentioned rotational displacement of the angle $\epsilon$ is present in the reticle 500, when the stage 7 is moved stepwise in the X-axis direction so that the pattern area 5a is successively transferred onto the wafer 10 thus forming pattern areas $P_0$ and $P_1$, the segment connecting the centers of the pattern area $P_0$ and $P_1$ lies on the X axis, each of the transferred pattern areas is rotated by the displacement angle $\epsilon$ with respect to the X axis (or the Y axis).

Therefore, in accordance with the present embodiment, the angle $\epsilon$ preliminarily determined as mentioned previously is used such that another rectangular coordinate system $\alpha\beta$ (hereinafter referred to as a third rectangular coordinate system) rotated by the angle $\epsilon$ with respect to the coordinate system XY and having its origin aligned with that of the latter is preset within the CPU 30 for the wafer 10. Note that during the transfer of the pattern onto the wafer 10, the origins of the rectangular coordinate systems XY and $\alpha\beta$ need not necessarily coincide with each other in the case of the first layer but it is essential that the origins coincide in the case of the second layer et seq.

On the other hand, after the pattern area $P_0$ has been transferred, instead of stepping the stage 7 in the X-axis direction for the transfer of the next pattern $P_1$, the direction of stepping movement of the stage 7 may be turned to go along the $\alpha$ axis thus transferring a pattern area $P_2$ as the next pattern area instead of the pattern area $P_1$. As will be seen from the arrangement of the pattern area $P_2$ and the pattern area $P_0$, the rotational displacement (the angle $\epsilon$) can be substantially cancelled by making the third rectangular coordinate system $\alpha\beta$ to serve as matrix array coordinates for the transferred pattern on the wafer 10.

Thus, by setting the array coordinates within the wafer 10 to the third rectangular coordinate system $\alpha\beta$, the alignment of pattern area exposure positions is effected along the coordinate axes $\alpha$ and $\beta$ and the step positions of the stage 7 are determined by the coordinate transformation between the third rectangular coordinate system and the first rectangular coordinate system.

Figure 9:
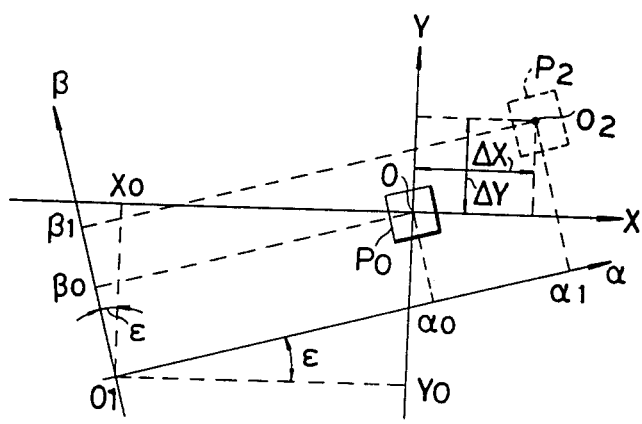
FIG. 9 is a diagram for explaining the aligning coordinate conversion required for the stepping movement of the stage.

Assume now that the pattern area being projected by the projection lens 6 is $P_0$, that the pattern area to be exposed and transferred next is $P_2$ and that the center of the pattern area $P_2$ is represented by $O_2$ as shown in FIG. 9. In this case, the origins of the first rectangular coordinate system XY and the third rectangular coordinate system are arranged separately for purposes of convenience. Also, it is assumed that in the third rectangular coordinate system XY the coordinate values of the center O of the pattern area $P_0$ are $\alpha_0$ and $\beta_0$ and the coordinate values of the center $O_2$ of the pattern area $P_2$ are $\alpha_1$ and $\beta_1$, that the array coordinate system $\alpha\beta$ on the wafer 10 is rotated counterclockwise by the angle $\epsilon$ with respect to the first rectangular coordinate system XY of the stage 7 whose origin is the center of the pattern area $P_0$, and that the origin $O_1$ of the coordinate system $\alpha\beta$ has the coordinate values $X_0$ and $Y_0$ of the coordinate system XY.

Figure 8:
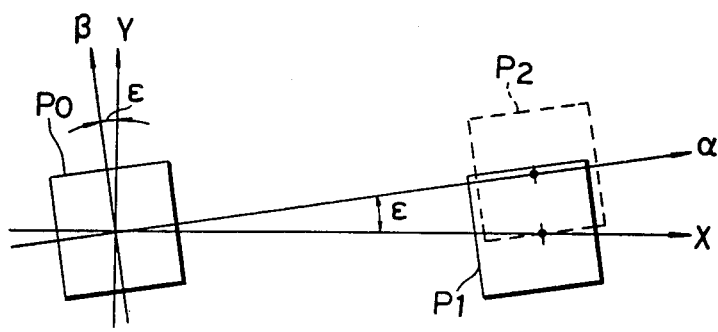
FIG. 8 is a diagram for explaining the rotational displacement between the adjacent transferred patterns produced by successive exposures by the stepping movement of a stage and the cancellation of the rotational displacements.

After the completion of the exposure of the pattern area $P_0$, the center $O_2$ of the pattern area $P_2$ can be aligned with the origin O of the coordinate system XY (the optical axis of the projection lesn 6) by simply shifting the stage 7 from its present position or ($X_0$, $Y_0$) by $\Delta X$ in the X-axis direction and by $\Delta Y$ in the Y-axis direction as shown in FIG. 8. The values of $\Delta X$ and $\Delta Y$ are represented as follows $$\Delta X=(\alpha_1-\alpha_0)\cos\epsilon-(\beta_1-\beta_0)\sin\epsilon$$

$$\Delta Y=(\alpha_1-\alpha_0)\sin\epsilon+(\beta_1-\beta_0)\cos\epsilon$$

If the angle $\epsilon$ is small enough, these values can be approximated as follows:

$$\Delta X=(\alpha_1-\alpha_0)-(\beta_1-\beta_0)\epsilon \quad (3)$$

$$\Delta Y=(\alpha_1-\alpha_0)\epsilon-(\beta_1-\beta_0) \quad (4)$$

The above equations (3) and (4) are programmed into the CPU 30 shown in FIG. 6 and also the center positions of the respective pattern areas to be exposed and transferred are preliminarily stored in terms of the coordinate values of the array coordinate system $\alpha\beta$. Then, the calculations of the equations (3) and (4) are effected using the previously detected angle $\epsilon$ and the stepping movement of the 7 is controlled so as to consequently cancel the angle $\epsilon$. This stepping is effected by shifting the position of the stage 7 in such a manner that the counter measured values of the laser interferometers 13 and 34 are respectively changed by $\Delta X$ and $\Delta Y$ with respect to the present position ($X_0$, $Y_0$) of the stage 7. For example, in order to expose and transfer a row of pattern areas which are parallel to the straight line of the faced 10a of the wafer 10, it is only necessary that of the center coordinate values of the pattern areas the values of $\beta_0$ and $\beta_1$ are made equal to each other and the value of ($\alpha_1-\alpha_0$) is selected as a pitch $E_p$ thereby stepping the stage 7 so as to obtain the following from the equations (3) and (4)

$$\Delta X=E_p$$

$$\Delta Y=E_p \cdot \epsilon$$

Figure 10:
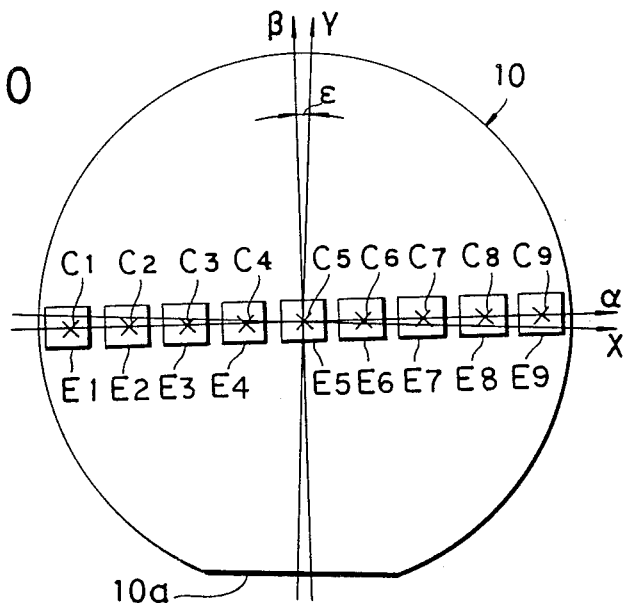
FIG. 10 illustrates an array of transferred pattern areas on a wafer showing the cancellation of the rotational displacements with respect to the transferred pattern of a first layer.

For instance, where nine pattern areas are transferred in a row, as shown in FIG. 10, the respective centers $C_1$ to $C_9$ of a row of pattern areas $E_1$ to $E_9$ all lie along the $\alpha$ axis and each of the pattern areas $E_1$ to $E_9$ is arranged without any rotational displacement with respect to the coordinate system $\alpha\beta$ except that the $\alpha$ axis is inclined by the angle $\epsilon$ with respect to the straight line of the faced 10a which is made parallel to the X axis of the coordinate system XY. By thus similarly arranging the pattern areas for the second and third rows, respectively, on the coordinate system $\alpha\beta$ and exposing and transferring them, it is possible to obtain the transferred patterns which are arranged in arrays over the entire surface of the wafer 10 in accordance with the array coordinate system $\alpha\beta$ without causing any rotational displacement such as shown in FIG. 8. Note that the necessary wafer marks are transferred onto positions within each pattern area or on the adjacent street lines in the same manner as mentioned previously for the registration alignment of the second layer et seq.

It will be seen that even the reticle 500 is in the set condition involving the rotational displacement of the angle $\epsilon$, the angle $\epsilon$ has practically no effect on the respective pattern areas of the first layer which are transferred onto the wafer 10.

The registration exposure and transfer operations for the second layer et seq., will now be described with reference to FIGS. 11 and 12.

Figure 11:
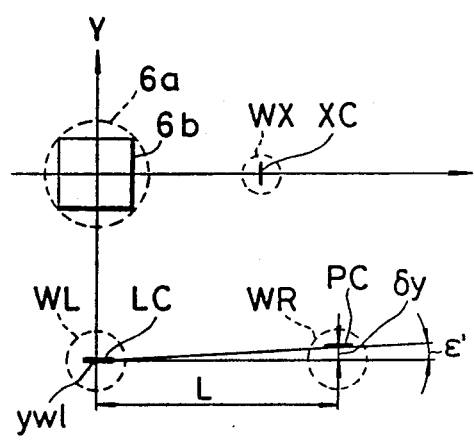
FIG. 11 is a diagram showing the positional relation between a projection lens and aligning microscopes.

FIG. 11 shows the positional relation of the projection lens 6 and the lens WL, WX and WR of FIG. 3 which are arranged on the plane of the first rectangular coordinate system XY and in a maximum exposure area 6a of the projection lens 6 the center of a projection area 6b of the reticle pattern area 5a or the optical axis of the projection lens 6 corresponds exactly to the origin of the first rectangular coordinate system XY. The lenses WL, WX and WR arranged in place around the projection lens 6 are shown in the form of broken-line circles likened to their fields of vision and their centers of detection are respectively designated by LC, XC and RC. The distance between the detection centers LC and RC in the X-axis direciton is designated as L.

Figure 12:
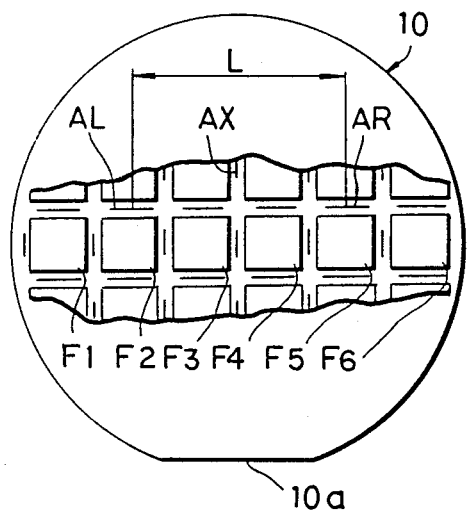
FIG. 12 is a schematic plan view of a wafer having the first layer circuit pattern transferred thereonto.

In FIG. 12 illustrating a plan view schematically showing the wafer 10 onto which the pattern of the first layer has been transferred, only a certain row of pattern areas $F_1$ to $F_6$ and their surroundings within the wafer 10 are illustrated. The narrow aligning wafer marks have already been formed on the street lines along the top, bottom, left and right sides of the pattern areas $F_1$ to $F_6$, respectively. In this case, it is assumed that of these wafer marks the two wafer marks AL and AR which are apart by substantially the distance L on the same street line parallel to the $\alpha$ axis and the single wafer mark AX on the street line parallel to the $\beta$ axis are used for the alignement of the wafer 10 during the registration exposure of the second layer et seq.

Then, prior to the exposure of the second layer pattern, another reticle 500 containing a circuit pattern which is different from that of the first layer is mounted on the reticle holder 15. Therefore, it is necessary to consider again the rotational displacement due to the reticle. Thus, to effect the exposure of the second layer pattern, the stage 7 is moved first so that the projected images of the light transmitting marks RR and RL of the reticle 500 are detected by the fine slit member 8 and the photoelectric sensor 9 and their position coordinates are determined by the laser interferometers 13 and 34 thereby detecting the rotational displacement in terms of an angle $\epsilon$ in accordance with the equation (1) or (2).

Prior to the exposure of the second layer, the detection centers LC and RC of the microscopes 51 and 52 through the lens WL and WR are adjusted. This admustment is effected in such a manner that the segment connecting the detection centers LC and RC of the microscopes 51 and 52 is inclined by an angle $\epsilon'$ with respect to the X axis on the plane of the coordinate system XY as shown in FIG. 11. For this purpose, it is only necessary to shift the detection center RC of the microscope 52 in the Y-axis direction by an amount of displacement $\delta y$ obtained from $\delta y \approx \cdot L \epsilon'$ on the basis of the rotational displacement angle $\epsilon'$ of the second layer reticle. More specifically, such optical component as the Harbing glass or the prism included in the optical system of the microscope 52 may be rotated or shifted to effect the desired fine adjustement. In this case, while separate detecting means may be used to detect the angle of rotation of the Harbing glass, the amount of movement of the prism or the like and thereby displace the detection center RC a given amount, this may be effected conveniently in many ways by means of the laser interferometers 13 and 34. Where the laser interferometers 13 and 34 are utilized, the slit opening 8a of the aligning fine slit member 8 mounted on the stage 7 is utilized. The stage 7 is positioned first so as to align the detection center LC of the microscope 51 with the Y-axis direction center of the slit opening 8a and the resulting Y-coordinate value ywl of the slit opening 8a is detected by the laser interferometer 34. Then, the stage 7 is moved by the distance L in the X-axis direction so as to allow the microscope 52 to detect the slit opening 8a. In this case, the stage 7 is positioned such that the Y-coordinate measured value of the laser interferometer 34 becomes (ywl+$\delta y$) and then the optical component in the optical system of the microscope 52 is rotated or shifted such that the Y-coordinate values of the detection center LC and the center of the slit opening become equal to each other.

After the microscopes 51 and 52 have been adjusted in this way, the wafer 10 (on which the transferred pattern of the first layer has been formed) is placed on the holder 11 and chucked by vacuum or the like. In this case, the wafer 10 is coarsely aligned on the holder 11 by means of the faced 10a of the wafer 10. Then, the stage 7 is positioned in such a manner that the wafer marks AL and AR formed and spaced apart by the distance L on the same street line of the wafer 10 are respectively located within the detection fields of view of the microscopes 51 and 52. Since the position of the wafer 10 relative to the fine slit member 8 on the stage 7 is substantially fixed, the positioning of the stage 7 can be easily effected by storing the coordinate values of the stage 7 which are attained when the detection centers LC and RC of the microscopes 51 and 52 respectively align with the slit opening 8a of the fine slit member 8.

After the wafer marks AL and AR on the wafer 10 have been detected by the microscopes 51 and 52, respectively, the wafer holder 11 is rotated by the $\theta$-actuator 37 in such a manner that the detection center LC of the microscope 51 is aligned with the wafer mark AL and the detection center RC of the microscope 52 is aligned with the wafer mark AR. In this case, if the center of rotation of the wafer holder 11 is selected to come near to the wafer mark AL, then when the holder 11 is rotated, the deviation of the detection center LC of the microscope 51 from the wafer mark AL is reduced to a very small value. In such a case, it is only necessary to rotate the wafer 10 by a small amount or shift the stage 7 by a small amount in the Y-axis direction so that the deviation in the Y-axis direction of the wafer mark AR from the detection center of the microscope 52 is substantially reduced to zero. After the angular position of the wafer 10 has been established with respect to the stage 7, the holder 11 is fixed to the stage 7.

Figure 13:
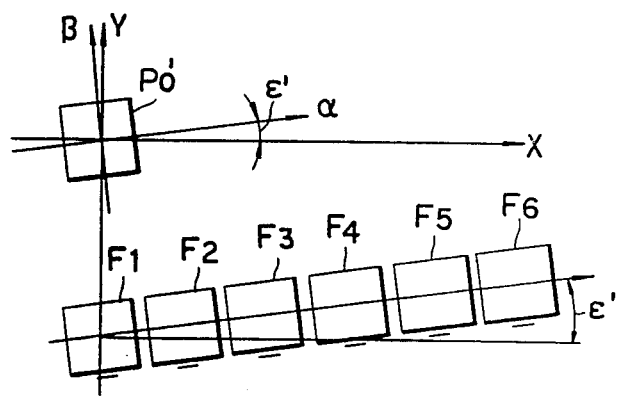
FIG. 13 is a diagram for explaining the registration of the circuit pattern of a second layer.

In this way, the array coordinate system $\alpha\beta$ within the wafer 10 is positioned to incline by the angle $\epsilon'$ with respect to the coordinate system XY of the stage 7 as shown in FIG. 13. As a result, a projected pattern area $P_0$ of the second layer reticle 500 and the pattern areas $F_1$ to $F_6$ of the first layer which are already present on the wafer 10, are respectively established with the angle of inclination $\epsilon'$ in the counterclockwise direction with respect to the X and Y coordinate axes. When the alignment of the wafer 10 is completed in this way, in accordance with the Y-coordinate value of the stage 7 attained upon the alignment of the wafer mark AL with the detection center LC of the microscope 51 and the X-coordinate value of the stage 7 attained upon the alignment of the wafer mark AX with the detection center XC of the microscope 53 the CPU 30 computes the center positional relation between a pattern area $P_o'$ and the pattern areas $F_1$ to $F_6$ on the wafer 10 and the stage 7 is moved so as to register the pattern area $P_o'$ on the pattern area $F_1$. Then, the shutter 4a is opened and the exposure is made. Then, the stepping movement of the stage 7 is effected such that the pattern areas $P_o'$ are successively registered on the pattern $F_2$ et seq., of the first layer pattern areas. In this case, the stage 7 is positioned in accordance with the previously mentioned equations (3) and (4) so that the rotational displacement of the angle $\epsilon'$ of the reticle 500 is cancelled in all the pattern areas on the wafer 10 and thus the pattern areas of the first and second layers are placed in register with one another without any rotational displacement. Then, as regards the third layer et seq., similarly the microscopes 51 and 52 are adjusted and the step-and-repeat printing is accomplished without the occurrence of any rotational displacement.

While, in the above-described embodiment, the adjustment of the microscopes 51 and 52 is effected by means of the fine slit member 8 and the photoelectric sensor 9, if there is the wafer mark AL, the adjustment may be effected by means of the wafer mark AL. In this case, the wafer mark AL is first aligned with the detection center LC of the microscope 51 and then the stage 7 is moved in the Y-axis direction. When the wafer mark AL is caught in the detection field of view of the microscope 52, the stage 7 is stopped and the position of the detection center RC of the microscope 52 is adjusted to align the detection center RC with the wafer mark AL. When this occurs, the segment connecting the detection centers LC and RC of the microscopes 51 and 52 is made parallel to the Y axis. Then, in accordance with the preliminarily computed angle $\epsilon'$ the stage 7 is moved by an amount of $\delta y \approx L\epsilon'$ and positioned. Then, the Harbing glass, the prism or the like included in the optical system of the microcomputer 52 is displaced and the detection center RC of the microscope 52 is again aligned with the wafer mark AL.

Further, while the above-described embodiment is applied to the projection type exposure apparatus, the invention is not limited thereto and it is of course applicable equally to a step-and-repeat exposure apparatus of the so-called proximity type in which the operation of projecting an exposure light beam, X rays or the like from the side of a mask to transfer the pattern image of the mask onto a wafer and then moving the mask parallely by a predetermined distance is repeated.

Figure 14:
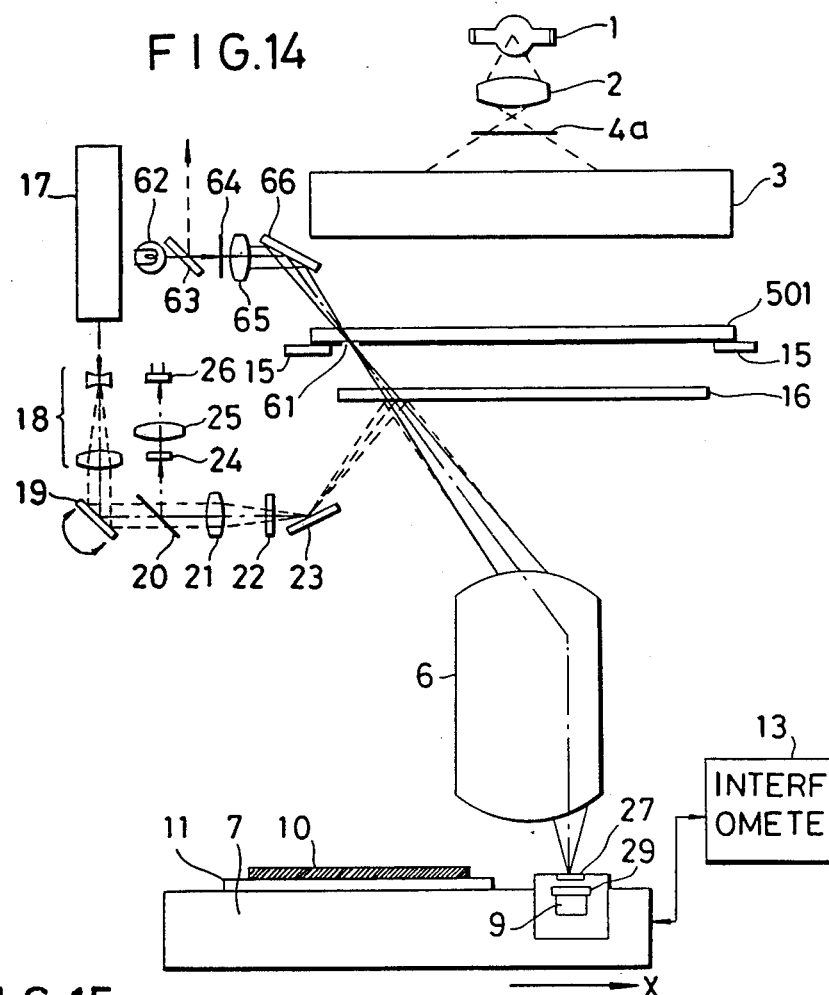
FIG. 14 is a diagram schematically showing the construction of a reduction type exposure apparatus according to a second embodiment of the invention.

FIG. 14 is a diagram schematically showing a projection exposure apparatus according to a second embodiment of the invention. Here, the photoelectric microscope of the laser scan type shown in the first embodiment will be illustrated in detail. In the second embodiment, however, the alignment in the X and Y directions, respectively, is effected in accordance with the laser scanning and detection through a projection lens 6. A lens 2, a shutter 4a, a lens 3, the projection lens 6, a stage 7, a photoelectric sensor 9, a wafer 10, a wafer holder 11 and a reticle holder 15 are the same with their counterparts shown in FIG. 2. A gap sensor 12 which is identical with that shown in FIG. 2 is not shown. The surface of a reticle 501 containing a circuit pattern and the surface of the wafer 10 are arranged in a conjugate relation with respect to the projection lens 6 and this conjugate relation holds only with respect to the printing light of an exposure light source 1 of this embodiment, e.g., gamma rays or light having a similar wavelength such as light having a wavelength $\lambda_1$.

In order to effect the alignment with such light having a wavelength different from that of the printing light, a dichroic mirror 16 of about the same size as the reticle 501 is arranged between the reticle 501 and the projection lens 6 so as to be perpendicular to the optical axis of the projection lens 6. The dichroic mirror 16 has spectral characteristics such that the X-direction aligning light or red light such as helium neon laser beam (light of a wavelength length $\lambda_2$) is reflected and the printing light (the gamma rays) is transmitted. Since the alignment is accomplished by the TTL method through the dichroic mirror 16, a laser light source 17, a beam expander 18 for expanding the beam diameter of a laser beam, an oscillatory mirror 19 for deflecting the laser beam in a simple oscillatory manner, a beam splitter 20, a focusing lens 21, a parallel flat glass 22 (Harbing glass) and a reflecting mirror 23 are provided.

Therefore, the laser beam from the light source 17 is converted to a beam of light having a large beam diameter by the beam expander 18 and it is then deflected by the oscillatory mirror 19 within a plane parallel to the paper plane. The deflected parallel beam is then passed through the beam splitter 20 and focused to a small spot by the focusing lens 21. This spot light is passed through the parallel flat glass 22 and then reflected by the reflecting mirror 23 toward the lower surface of the dichroic mirror 16.

Since the dichroic mirror 16 reflects the helium-neon laser beam, the spot light from the reflecting mirror 23 falls onto the projection lens 6. In this case, it is assumed that the spot light focused by the focusing lens 21 forms an image at the position of the reflecting mirror 23 and the image of the spot light is again formed on the surface of the wafer 10 through the projection lens 6.

Since a high chromatic aberration is present in the projection lens 6, the length of the optical path for the gamma rays from the reticle 501 to the entrance pupil of the porjection lens 6 is different from that of the light path for the laser beam from the image forming position (the reflecting mirror 23) of the spot light by the focusing lens 21 to the entrance pupil of the projection lens 6 and both the pattern image of the reticle 501 and the image of the laser spot light are formed on the same plane on the entrance pupil side of the projection lens 6.

On the other hand, the beam splitter 20 is provided to take out the light information which is returned as the reverse incident light from the projection lens 6. The light information reflected by the beam splitter 20 is passed through a spatial filter 24 for cutting off the regular reflection and then it reaches a photoelectric converting element 26 through a lens 25.

The photoelectric converting element 26 is provided for the purpose of mainly detecting the aligning mark on the wafer 10. Note that the image of the entrance pupil of the projecting lens 6 is formed on the spatial filter 24 and a higher diffraction light is converged onto the photoelectric converting element 26 by the lens 25.

Further, a mark 61 forming a slit-like light path is provided on the reticle 501 for the purpose of alignment.

A lamp 62 generates light having the same or similar wavelength as the printing light and the light is bent by a reflecting mirror 66 via half mirror 63, a shutter 64 and a lens 65 thus illuminating the selected areas including a mark 61. Instead of using the lamp 62, the light from the light source 1 may be supplied by means of optical fibers.

On the other hand, a reference mark 27 which is different from the fine slit member 8 shown in FIGS. 4 and 5, is provided on the stage 7 to detect the image of the mark 61 projected by the projection lens 6 or the laser spot light.

The reference mark 27 is formed by evaporating a light screen material such as chromium on a glass plate and forming light-transmitting fine slit openings or lattice openings in a part of the chromium coating. A photoelectric converting element 9 is embedded below the reference mark 27 to detect the light transmitted via the slits or lattices. The reference mark 27 excluding the slit portions is surface treated so as to increase the reflectance.

Also, the surface of the reference mark 27 is set so that it is flushed with the surface of the wafer 10 placed on the stage 7. Also disposed between the reference mark 27 and the photoelectric converting element 9 is a color glass filter 29 which cuts off the He-Ne laser light (red light) and transmits the printing light or light of the similar wavelength. Simply, the color glass filter 29 maybe of the same type as the dichroic mirror 16.

Note that the oscillatory mirror 19, the beam slitter 20, the focusing lens 21, the parallel flat glass 22 and the reflecting mirror 23 form a laser scan optical system for effecting the X-direction scanning by the spot light and the filter 24, the lens 25 and the photoelectric converting element 26 form a detecting system for detecting the higher diffraction light which is a reverse incident light from the projection lens 6. In fact, another similar laser scan optical system and detecting system (not shown) are provided in the virtical direction to the paper plane of FIG. 14 for the Y-direction scanning and detection purposes. The X-direction scanning and detecting systems correspond to the photoelectric microscope 53 of the first embodiment and similarly the Y-direction scanning and detecting systems corresponds to the photoelectric microscope 51. Thus, the X-direction scanning and detecting systems are represented by the photoelectric microscope 53 and the Y-direction scanning and detecting systems are represented by the photoelectric microscope 51 in the following description.

Also, the mark 61 is not limited to one place of the reticle 501 and thus a similar mark is provided in the peripheral portion perpendicular to the paper plane to enable the alignment in both the X and Y directions. Also, as will be described later, the observing illumination optical system formed by the lamp 62, the half mirror 63, the shutter 64, the lens 65 and reflecting mirror 66 is provided for each of the marks to illuminate it. Similarly as shown in FIG. 2, the reference mark 27, the color glass filter 29 and the photoelectric converting element 9 are vertically movable as a unit along with the wafer 10 and the wafer holder 11.

Figure 15:
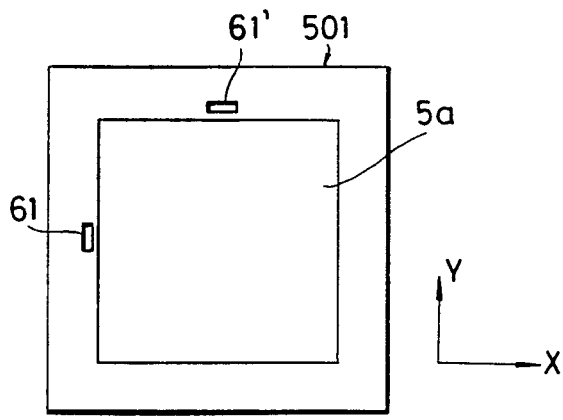
FIG. 15 is a plan view showing a reticle used in the second embodiment of the invention.

FIG. 15 is a plan view of the reticle 501, in which the peripheral portion indicates the light shielding portion consisting of the chromium coating or the like and the inner rectangular area indicates an exposure area 5a containing a circuit pattern. The previously mentioned marks 61 (X direction) and 61' (Y direction) are each formed in the light shielding portion as an elongated fine slit opening extending along the margin of the exposure area 5a of the reticle 501. Note that the marks 61 and 61' may take the form of elongated slits which are radially extended from the center of the reticle 501. Anyway, these marks are provided at two places on the reticle 501 which are spaced apart from each other.

Figure 16:
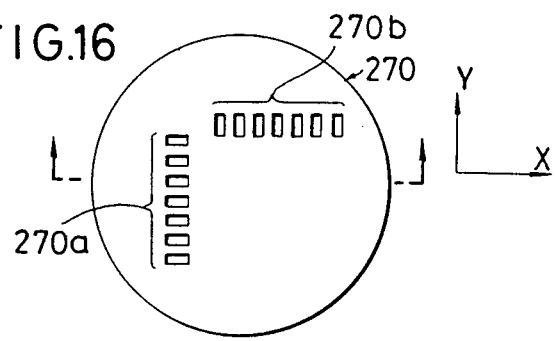
FIG. 16 is a plan view showing the reference mark portions on the stage.
Figure 17:
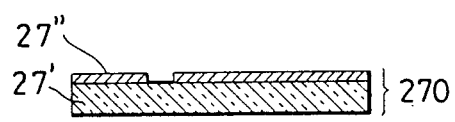
FIG. 17 is a sectional view taken along the arrow line of FIG. 16.

FIG. 16 is an enlarged plan view showing the reference mark 27 in detail and FIG. 17 is a sectional view taken along the arrow line of FIG. 16. In FIGS. 16 and 17, the reference mark 27 comprises an X-marks 27a and a Y-mark 27b each comprising a plurality of fine rectangular lattice elements which are regularly arranged in a part of a chromium coating 27" formed on the entire surface of a transparent glass plate 27'. The X and Y marks 27a and 27b are so arranged that their lattice elements are arranged to cross one another at right angles and also their directions of arrangement correspond exactly with the moving directions X and Y of the stage 7. Further, the sizes of the marks are selected so that when the mark 61 of the reticle 501 is projected on a reduced scale on the reference mark 27 through the projection lens 6, the image of the mark 61 becomes substantially equal in size and shape with the mark 27a. Of course, the sizes of the image of the mark 61' and the Y-mark 27b are also determined in the like manner.

With the present embodiment, the block diagram of its control system is represented by FIG. 6 and will not be shown.

Figure 18:
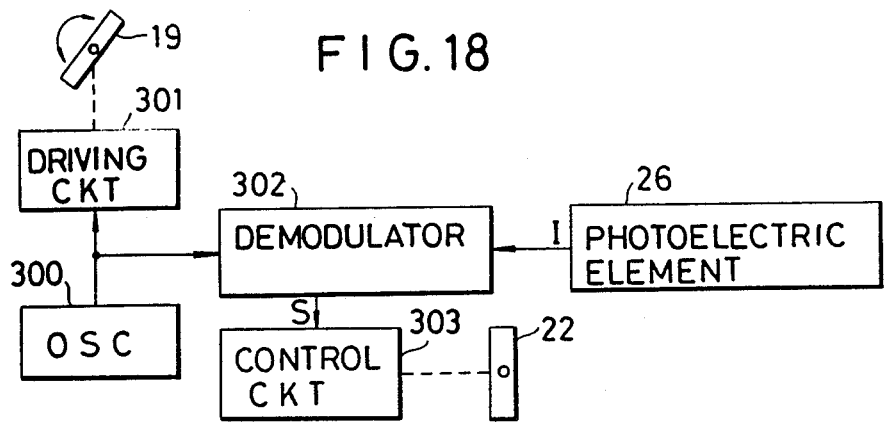
FIG. 18 is block diagram of a laser beam oscillation control system.

FIG. 18 is a block diagram showing a control system for controlling the inclination of the parallel flat glass 22 shown in FIG. 14 so as to displace the center of oscillation of the laser beam. The operation of this control system is controlled by the CPU 30 through the interface 31 shown in FIG. 6. The ac output signal from an oscillator 300 (hereinafter referred to as an OSC) is applied to a driving circuit 301 for driving the oscillatory mirror 19 and to a synchronous detector 302. On the other hand, the output signal from the photoelectric element 26 is also applied to the synchronous detector 302 so that a servo control circuit 303 is operated in accordance with the detection signal of the synchronous detector 302. The servo control circuit 303 tilts the parallel flat glass 22 in such a manner that the detection signal is reduced to zero.

The operation of the present embodiment will now be described with reference to the previously mentioned FIGS.

(1) The alignment system is adjusted first for the chromatic aberration in the projecting lens 6.

A reticle 501 such as shown in FIG. 15 is set in the desired position for exposure by the reticle alignment controller 33. Then, the focus detecting circuit 39 detects the focusing position of the projected image by the projection lens 6 of the mark 61 or 61' on the reticle 501 and the Z-actuator 38 is operated such that the image is formed on the same plane as the reference mark 27.

Then, the shutter 64 is opened to illuminate the mark 61 and the X-actuator 35 and the Y-actuator 36 are operated so as to cause the projected image of the mark 61 to register the X-mark 27a. Then, the state 7 is moved. In this case, the stage 7 is moved in the X direction so that the light passed through the X-mark 27a is detected by the photoelectric converting element 9 and the light intensity distribution of the projected image of the mark 61 is measured. This intensity distribution results in such a waveform as shown in FIG. 19.

Figure 19:
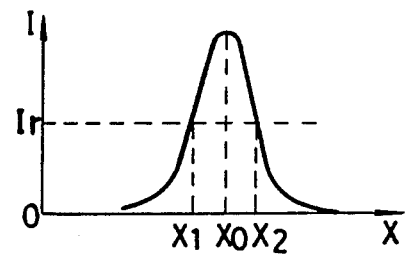
FIGS. 19 and 20 are detection characteristic diagrams of a photoelectric element.

FIG. 19 shows the relationship between the magnitude of the photoelectric signal I from the photoelectric converting element 9 and the position of the stage 7 in the X direction. Thus, while moving the stage 7 in the X direction, its positions in the X direction are detected by the X-interferometer 13 so as to detect its positions $X_1$ and $X_2$ at which the photoelectric signal I crosses a given level $I_r$. Then, the CPU 30 computes the center position $X_0$ between the positions $X_1$ abd $X_2$ or the peak position of the photoelectric signal I and the X-actuator 35 is controlled so as to stop the stage 7 at the position $X_o$. This make the projection position of the mark 61 and the position of the stage 7 in the X direction correspond to each other.

After the stage 7 has been stopped at the position $X_o$, the oscillation center of the laser spot light of the light source 17 for the microscope 53 in FIG. 5 is aligned with the X-mark 27a. In this case, as shown in FIG. 14, the laser beam produced from the reflecting mirror 23 is reflected by the dichroic mirro 16 toward the projecting lens 6 and the light is focused as a spot light on the surface of the reference mark 27. This spot light is scanned by the oscillatory mirror 19 in a direction perpendicular to the extension direction of the X-mark 27a.

Figure 20:
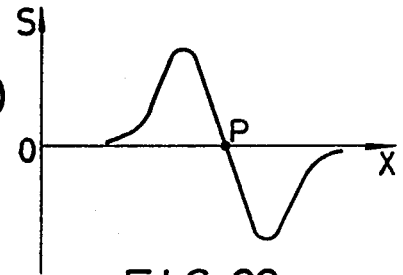

Then, the parallel flat glass 22 is tilted by servo control system using the synchronous detection as shown in FIG. 18. At this time, the illumination of the X-mark 27a with the spot light causes the lattice elements to generate a diffracted light and the photoelectric element 26 receiver only the higher diffraction light. Note that the size of the spot light on the reference mark 27 is selected to become substantially equal to the width of the X-mark 27a (or the Y-mark 27b). In this case, the detection signal S from the synchronous detector 302 of FIG. 18 may have a waveform as shown in FIG. 20. As a result, by adjusting the detection signal S to a zero point P, it is possible to adjust to zero the deviation due to the aberration caused by the difference in wavelength between the projected image of the mark 61 of the reticle 501 by the gammer rays or the light of the approximate wavelength and the detection center of the X-direction alignment by the laser beam. When the detection signal S is adjusted to the zero point P, the inclination of the parallel flat glass 22 is fixed. By virtue of the described operation, the mark 61 of the reticle 501 for the X-direction alignment and the oscillation center of the laser scan optical system are placed in the optically conjugate positions.

On the other hand, the Y-direction adjustment for the aberration is accomplished in all the same manner by means of the mark 61' of the reticle 501 and the Y-mark 27b in the reference mark 27. In this case, the stage 7 is moved in the Y direction. Thus, the adjustments for the laser beam in the X and Y directions have been completed.

Figure 21:
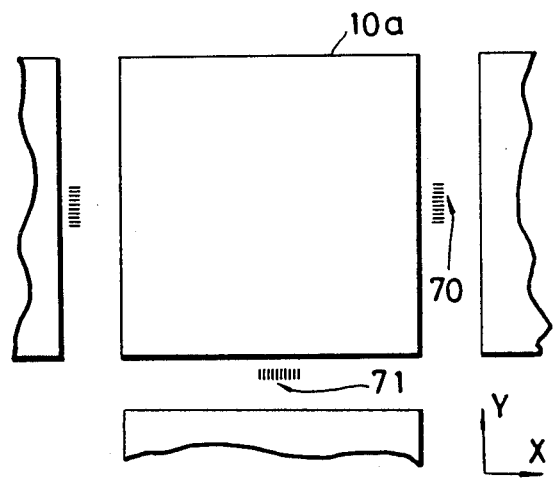
FIG. 21 is an enlarged view showing the marks on a wafer.

(2) Next, the operation of aligning the wafer 10 with respect to the reticle 501 will be described. It is assumed that the first exposure of the wafer 10 has been completed and it is before the second exposure and that by this stage the rotational error of the wafer 10 with respect to the stage 7 has been detected by the photoelectric microscope 52 using the lens WR and the laser light described in connection with the first embodiment and the rotational error has been corrected by the θ-actuator 37. Also, as shown in FIG. 21, the wafer 10 has been formed thereon with a pattern area 10a as well as marks 70 and 71 in the form of groups of lattice elements as the X-mark 27a and the Y-mark 27b by the previous exposure and etching operations. The mark 70 comprises the lattice elements arranged in the Y direction along the right margin of the circuit pattern area 10a and it is used for the X-direction alignment. The mark 71 comprises the lattice elements arranged in the X direction along the lower margin of the circuit pattern area 10a and it is used for the Y-direction alignment. Also, the photoresist has been applied to the surface of the wafer 10 and the shutters 4a and 64 are both closed so as to prevent the photoresist from being exposed.

Then, in order to align the reticle 501 with the circuit pattern area 10a on the wafer 10, the stage 7 is moved first in accordance with the distance from the reference mark 27 to the circuit pattern area 10a to be exposed. In this case, it is assumed that the position of the wafer 10 with respect to the reference mark 27 is substantially constantly repeated. Thus, if the CPU 30 measures the position of the stage 7 in the X and Y directions by the X-interferometer 13 and the Y interferometer 34, respectively, during the adjustment of the oscillation center of the laser scan optical system, the distance from this position to the circuit pattern area 10a to be exposed can be easily determined. The reason is that the position of the wafer 10 with respect to the reference mark 27 as well as the arrangement of the circuit pattern areas on the wafer 10 are preliminarily known.

When the stage 7 is moved in this way, the circuit pattern image by the projection lens 6 and the circuit pattern area 10a on the wafer 10 are aligned with each other with an error of less than several tens μm.

Then, the scanning operations in the X and Y directions are effected by the laser scan optical systems so that the deviation from the zero point P is obtained from the detection signal S of the synchronous detector 302 shown in FIG. 18 for each of the marks 70 and 71 and the alignment error between the circuit pattern image of the reticle 501 and the wafer 10 is measured. In other words, the relative positional difference between the reticle 501 and the wafer 10 is detected. In this case, the laser spot light corresponding to the microscope 53 of FIG. 6 scans the mark 70 by going and returning in the X direction and the laser spot light corresponding to the microscope 51 of FIG. 6 scans the mark 71 by going and returning the Y direction.

Then, in accordance with the measured alignment error the X-actuator 35 and the Y-actuator 36 are operated and the stage 7 is moved very slightly to reduce the error to zero. Then, at this position the shutter 4a is opened for a predetermined time so that the circuit pattern image of the reticle 501 in alignment with the circuit pattern area 10a on the wafer 10 is transferred onto the photoresist.

Then, the stage 7 is moved to the position of the next exposure on the wafer 10 in accordance with the position measurements of the X-interferometer 13 and the Y-interferometer 34. Here, in the like manner as mentioned previously, the laser spot scans in the X and Y direction, respectively, so that the alignment error is detected and the stage 7 is moved very slightly thus effecting the alignment. In this way, the alignment is accomplished for each of the areas to be exposed and the printing over the entire surface of the wafer 10 is completed.

Note that if the surface of the wafer 10 has a taper, the required focus adjustment is effected suitably by means of the focus detecting circuit 39 and the Z-actuator 38.

In accordance with the present embodiment, by virtue of the fact that the reference mark 27 (the X-mark 27a and the Y-mark 27b) provided on the stage 7 is composed of groups of lattice elements as in the case of the marks 70 and 71 on the wafer 10 and that the photoelectric converting element 9 for detecting the light passed through the reference mark 27 is embedded, the mark images of the reticle produced by the gamma rays or light of the similar wavelength are accurately detected by means of the photoelectric converting element 9 and the relative positions of the reticle 501 and the stage 7 are made correspond exactly to each other. Also, the detection by the spot of laser beam can be performed accurately by means of the higher diffraction light. As a result, there is the advantage of readily adjusting the correspondence between the projection position by the gamma rays and the center of the alignment by means of the laser beam or the center of oscillation as the projection position of the light beam.

Figure 22:
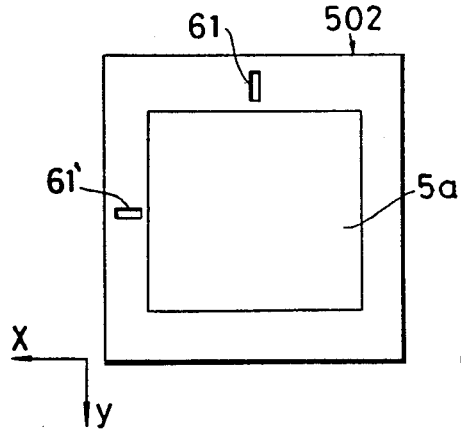
FIG. 22 is a plan view showing another example of the reticle.
Figure 23:
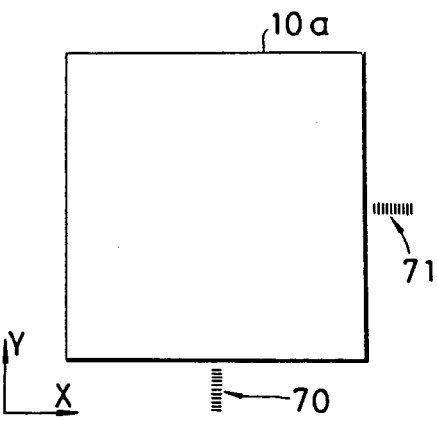
FIG. 23 is an enlarged view showing the marks on a wafer corresponding,, to the marks of the reticle in FIG. 22.

If, in this embodiment, the marks 61 and 61' of the reticle are radially extended from the center of a reticle 502 as shown in FIG. 22, the marks 70 and 71 formed around the circuit pattern area 10a of the wafer 10 should preferably be arranged radially as shown in FIG. 23.

Also, in FIG. 14 the mark 61 of the reticle 501 and the X-mark 27a of the reference mark 27 can be simultaneously observed through the half mirror 63 during the time that the shutter 64 is open. This has the effect that during the adjustment of the oscillation center of the laser beam spot, the adjustment can be confirmed with the human eyes by means of a microscope, television camera or the like and it is also possible to make fine adjustments manually. The same applies to the reticle mark 61' and the Y-mark 27b.

Figure 24:
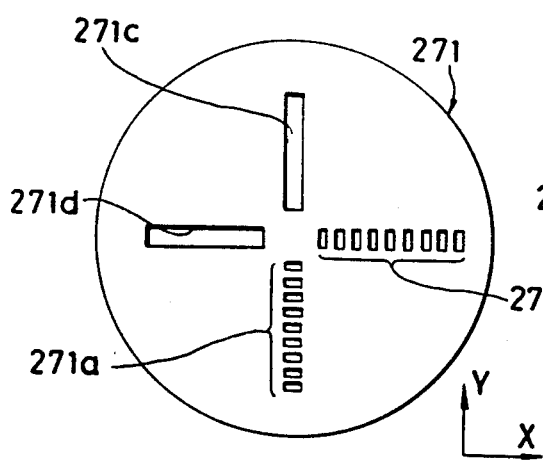
FIG. 24 is a plan view showing another example of the reference marks on the stage.

Modifications of the reference mark 27 used in the second embodiment of the invention will now be described. While the overall construction of an exposure apparatus is substantially the same with the apparatus of FIG. 14, the lamp 62, the half mirror 63, the shutter 64, the lens 65 and the reflecting mirror 66 of FIG. 14 forming the optical system which illuminates only the reticle marks 60 and 61 are all eliminated. It is also constructed so that the area including the reticle marks 61 and 61' is simultaneously illuminated by the exposure illuminating optical system 3. Also, the shape of the reference mark fixedly mounted on the stage 7 is modified as shown in FIG. 24.

In the Figure, in the like manner as the first embodiment, there are provided X-mark 271a and Y-mark 271b comprising lattice elements arranged in the X and Y directions as well as marks 271c and 271d in the form of elongated slits respectively extended in the X and Y directions. The marks 271c and 271d are each selected substantially the same in size with the projected images of the marks on the reticle. The mark 271c detects the X-direction position of the projected image of the reticle mark and the mark 271d detects the Y-direciton position of the projected image of the reticle mark.

Note that the center line of the X-mark 271a extending in the Y direction is aligned with the center line of the 271c extending in the Y direction and also the center line of the Y-mark 271b extending in the X direction is aligned with the center line of the mark 271d extending in the X direction.

Also, since the reticle marks are illuminated by the exposure illuminating optical system 3, the reticle marks are in fact positioned on the inner side of the positions shown in FIG. 22, that is, along the margin within the exposure area 5a.

Now, the procedure for correcting the correspondence between the center of oscillation of the laser scan optical system and the marks 61 and 61' by means of the reference mark 271 is as follows.

The stage 7 is moved in such a manner that the reference mark 271 is positioned just below the projection lens 6 and then the shutter 4a is closed thus illuminating the reticle. Then, the stage 7 is moved in such a manner that the mark 271c scans the projected image of the reticle mark at a constant speed. Thereafter, in the like manner as mentioned in connection with FIGS. 14 to 21, in accordance with the output signal of the photoelectric converting element 9 the stage 7 is moved to a position where the center of the projected image and the center of the mark 271c correspond exactly and the stage 7 is stopped at that position. Then, the laser spot light is projected so as to scan the X-mark 271a in the X direction and the servo control system of FIG. 18 is operated so as to align the oscillation center of the spot light with the center of the X-mark 271a. In this way, the aberration correction is effected for the oscillation center of the X-direction laser spot light with respect to the X direction.

Also, the aberration correction is effected for the oscillation center of the Y-direction laser spot light with respect to the Y direction by means of the reticle mark and the marks 271b and 271d in accordance with the similar procedure.

After the adjustments have been completed by the above-described operations, the printing is accomplished by the step-and-repeat method. In this case, such radial marks 70 and 71 as shown in FIG. 23 have already been provided around each circuit pattern area 10a on the wafer 10 and the marks 70 and 71 are scanned with the laser spot light thereby effecting the alignment.

Figure 25:
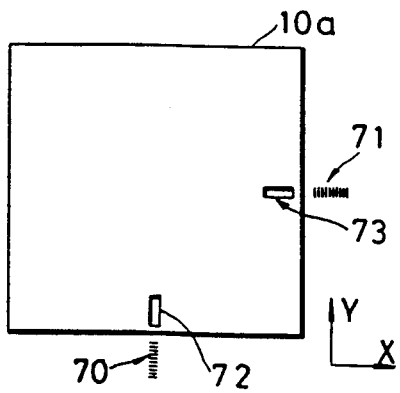
FIG. 25 is an enlarged view showing the formation of the mark images of a reticle on a wafer.

In this way, the projected images of the reticle marks are photoelectrically detected through the slit marks 271c and 271d with the result that the S/N ratio of the photoelectric signal is improved and the adjustment of the detection center for alignment is effected accurately. In addition, since the marks 271c and 271d are each simply a slit, even if the apparatus is chocked with fine dust, the S/N ratio is not much degraded and the positions of the projected images of the reticle marks are detected. Of course, there is another advantage that the construction is simplified due to the elimination of the need to use any optical system for separately illuminating the reticle marks. On the contrary, each time a shot is made, the reticle marks 61 and 61' are transferred as mark images 72 and 73 onto the circuit pattern area 10a of the wafer 10 as shown in FIG. 25. Each of the mark images 72 and 73 must have a length of several tens μm and thus it is necessary that the exposure area of the reticle includes an inhibitory area where the formation of a circuit pattern is inhibited.

Figure 26:
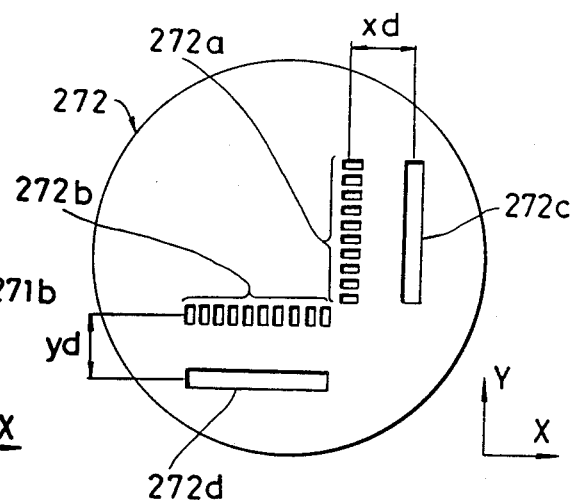
FIG. 26 is a plan view showing still another example of the reference marks on the stage.

A modified reference mark and the corresponding reticle for preventing the reticle mark images from being transferred onto the circuit pattern area 10a will now be described with reference to FIG. 26. In this case, an X-mark 272a, Y-mark 272b and marks 272c and 272d of a reference mark 272 are arranged as shown in FIG. 26 differing from FIG. 24. By so arranging, it is possible to provide the reticle marks on the external area of the exposure area 5a as shown in FIG. 22. Referring now to FIG. 26, the slit-shaped marks 272c and 272d are respectively arranged parallel to the X-mark 272a and the Y-mark 272b and the distances therebetween are respectively selected as xd and yd. To adjust the oscillation center of the laser scan optical system, the stage 7 is moved such that the projection image of the reticle mark registers the mark 272c. Then, the laser spot light scans the X-mark 272a in a reciprocating manner in the X direction and its center of oscillation is aligned with the center of the X-mark 272a. The adjustment with respect to the Y direction is similarly effected by means of the projected image of the reticle mark and the mark 272d and the Y-mark 272b.

Figure 27:
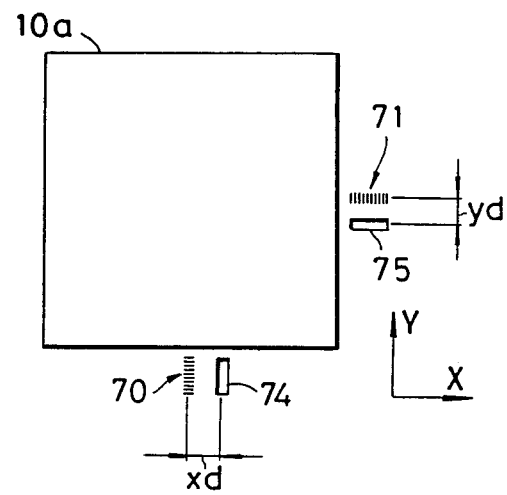
FIG. 27 is an enlarged view showing the formation of the mark images of a reticle on a wafer.

Then, in the course of the printing by the step-and-repeat method, the marks 70 and 71 corresponding to each circuit pattern area 10a on the wafer 10 are detected to effect the alignment. When an exposure is made after the alignment, projected images 74 and 75 of the reticle marks are printed on the outer side of the circuit pattern area 10a as shown in FIG. 27. As a result, there are left on the wafer 10 the pattern of the projected image 74 at the position apart by the distance xd from the mark 70 in the X direction and the pattern of the projected image 75 at the position apart by the distance yd from the mark 71 in the Y direction.

Thus, if the arrangement of the marks with respect to the exposure area of the reticle is analogous to the arrangement of the marks 70 and 71 with respect to the circuit pattern area 10a of the wafer 10, the position of the wafer 10 subjected to the X- and Y-direction alignments by the laser spot light is deviated by the distances xd and yd in the X and Y directions, respectively, with respect to the position of the projected image of the reticle. As a result, the exposure must be made after shifting the stage 7 by the distances xd and yd, respectively. On the contrary, if it is desired to eliminate this shifting operation, it is only necessary to provide the marks 61 and 61' of FIG. 22 in such a manner that the mark 61 is shifted by xd.K in the X direction and the mark 61' is shifted by yd.K in the Y direction. Here, K is the reciprocal of the magnification factor of the projection lens 6 (K = 10 in the case of a 10:1 reduction lens).

In this way, it is possible to prevent the reticle mark images for alignment purposes from being transferred into each circuit pattern area 10a on the wafer 10 but transferred on the narrow areas between the circuit pattern areas or the so-called street lines and thus there is an advantage that there is no need to provide any circuit pattern inhibitory area.

Also, an alignment method may be used in which after the aligning marks 70 and 71 on the wafer 10 have been detected by the laser scanning in the X and Y directions, from that position the stage 7 is moved a predetermined distance $\Delta x$ and $\Delta y$ in the X and Y directions, respectively, and the exposure and printing are effected at the thus shifted position. For this purpose, the positions of the projected images of the marks provided on the reticle are detected by the photoelectric converting element 9 having the openings (the X-mark 272a, the Y-mark 272b, etc.,) and fixedly mounted to the stage 7. Then, the stage 7 is moved from the detected positions by the distances $\Delta x$ and $\Delta y$ so that at the resulting position of the stage 7 the detection centers of the X- and Y-direction scanning spot are adjusted by means of the reference mark 272. As a result, practically there is no limitation to the positions of aligning marks provided on each wafer.

On the other hand, if, in FIG. 24, the X-direction centers of the slit mark 271c and the X-mark 271a are deviated in the X direction or the centers of the slit mark 271d and the Y direction mark 271b or if, in FIG. 26, the distance between the slit mark 272c and the X-mark 272a deviates from the distance xd or the distance between the slit mark 272d and the Y-mark 272b deviates from the distance yd, it is only necessary to do the following on the assumption that the amounts of deviation (errors) are preliminarily known. In other words, from the position where the image positions of the reticle marks are detected by means of the marks 272c and 272d the stage 7 is moved by the amounts corresponding to the errors for correcting purposes and then the detection centers of the X- and Y-direction alignment laser spots are adjusted. In this way, any error caused in the arrangement of the X-mark 272a, the Y-272b and the marks 272c and 272d during the manufacture of the reference mark 272 can be prevented from giving rise to any impediment and the alignment can be effected accurately.

While, in the above-described embodiment of the invention, violet light or ultraviolet light is used for the printing light and the He-Ne laser beam having a wavelength of 635 nm, the laser beam needs not necessarily be used for alignment purposes and it is only necessary to use any intense light source. Also, the wavelength for aligning purposes is not limited to the red light and it is possible to use a light source any wavelength to which the photoresist is not sensitive, such as, a semiconductor laser in the infrared region.

Further, while, the color glass filter 29 is provided between the reference mark 27 and the photoelectric converting element 9 which are fixedly mounted on the stage 7, the color glass filter needs not always be provided if a shutter for blocking the laser beam is included in each of the X- and Y-direction laser scan optical systems.

Still further, the detection of the centers of reticle marks by a light having the same or similar wave-length to that of the printing light is effected by comparing the light intensity distribution with a predetermined level by way of example, other methods such as obtaining the center of gravity of the intensity distributions of the images and obtaining the peak values by means of differentiation may also be used to obtain the same effects.

Still further, the alignment optical system needs not be limited to the method employing the dichroic mirror 16 and it is possible to obtain quite the same effects by using a focusing lens or prism capable of correcting the chromatic aberration of the projection lens 6 or a light path correcting optical system.

While the laser spot light is used in the simple harmonic scanjing, it is also possible to use the laser spot light in the constant-speed liner scanning. Also, the shape of the spot light should preferably be an elongated spot light in conformity with the overall shapes of the X-mark 27a, the x-mark 27b, the marks 70 and 71, etc., rather than a simple circular shape, since this has the effect of improving the S/N ratio of the photoelectric converting element 9 and accomplishing the alignment with a high degree of resolution. Further, the invention is not limited to the method of using the laser spot light for oscillatory scanning purposes and it is possible to arrange so that the spot light itself is not oscillated but the stage 7 is subjected to scan (sweep) and thereby detect the aligning marks, the X-mark and the Y-mark formed on the wafer. In this case, the detection of each mark is effected by detecting the maximum value of the output signal from the photoelectric converting element 9.

Note that in the description of the above embodiment the relative positions of the reticle 501 and the projection lens 6 are assumed to be fixed. On the other hand, a projection exposure apparatus is known in the art in which the alignment of a wafer with a reticle is effected by causing the reticle to make a slight movement in the X and Y directions, respectively, with respect to the optical axis of a projection lens thereby effecting the alignment. A second embodiment of the invention in which the invention is applied to an apparatus for performing this method will now be described with reference to FIG. 28.

Figure 28:
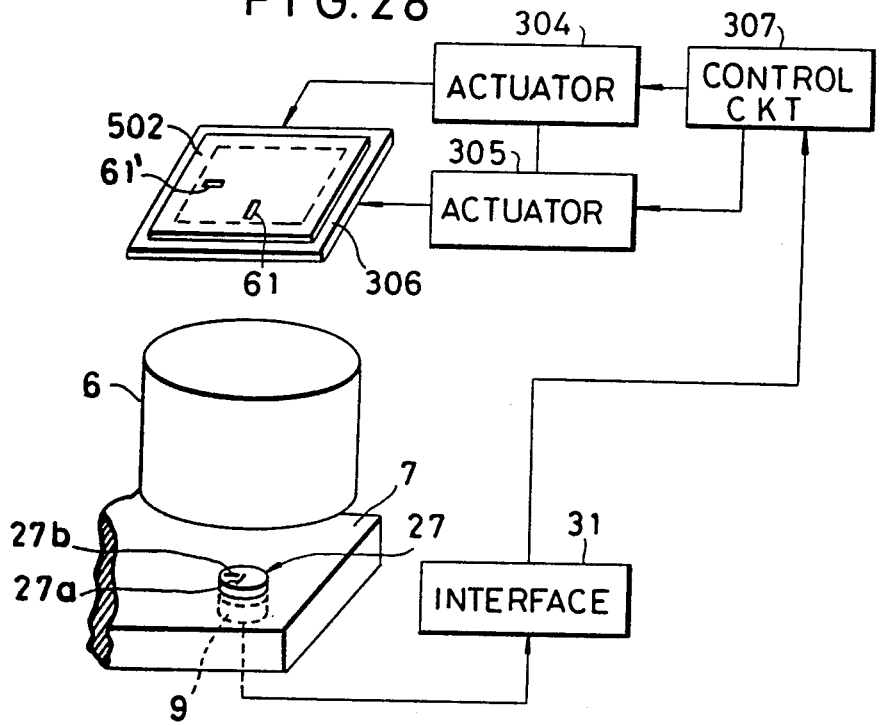
FIG. 28 is a schematic diagram showing a modification of the second embodiment of the invention.

FIG. 28 is a schematic diagram showing the second embodiment in which a reticle 502 is set on a movable holder 306 and the holder 306 is caused to make a slight movement in X and Y directions, respectively, by an X-actuator 305 and a Y-actuator 304 which are controlled by a servo control circuit 307, thereby effecting the desired alignment. The remaining construction is the same with the counterparts of FIG. 14 and its control system is identical with that shown in FIG. 6. In FIG. 28, an interface 31 is the same with the interface 31 of FIG. 6 and only its section is shown which is responsive to the detection input from the photoelectric converting element 9 to apply to the servo control circuit 307 the control signals for moving the reticle in the X and Y directions.

With this embodiment, the stage 7 and the reticle 502 are first subjected to a prealignment operation so that a projected image of an exposure area 5a of the reticle 502 is substantially aligned with the circuit pattern area 10a on the wafer 10.

Then, the stage 7 is moved in such a manner that the oscillation centers of the X- and Y-direction aligning laser spot lights correspond exactly with the X-mark 27a and the Y-mark 27b forming the reference mark 27. The resulting position of the stage 7 is used as a reference position.

Assuming that the reference mark 27 is of the type shown in FIG. 16, the holder 306 supporting the reticle 502 is moved slightly in the X direction such that the projected image of the mark 61 of the reticle 502 through the projection lens 6 corresponds exactly with the mark 27a. When this occurs, the servo control system is temporarily stopped so that the X-direction position of the holder 306 is established and then the similar servo control is effected in such a manner that the image of the mark 61' corresponds exactly to the Y-mark 27b thus establishing the Y direction position of the holder 306.

Thus, the above-described procedure adjusts the relative positional relation between the detection centers of the aligning laser spot light serving as aligning means and the projected images of the marks 61 and 61' of the reticle 502 by the light of the printing light wavelength or the similar wavelength. Thereafter, the stage 7 is moved and the relative alignment of the reticle 502 and the wafer 10 is effected by means of the aligning marks on the wafer 10, thereby effecting the printing by the step-and-repeat method.

Figure 29:
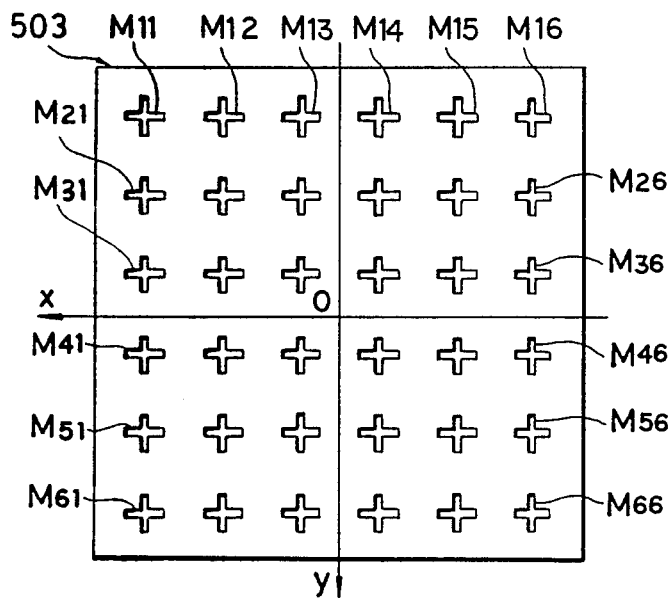
FIG. 29 is a plan view showing a test reticle used with a third embodiment of the invention.

Next, a third embodiment of the present invention will be described. FIG. 29 is a plan view of a reticle 503 used in the third embodiment. The reticle 503 is made by evaporating a layer of chromium or a low reflection layer of chromium all over the lower surface of a glass substrate. Formed in the chromium layer are light transmitting marks $M_{11}$ to $M_{16}$, $M_{21}$ to $M_{26}$, $M_{31}$ to $M_{36}$, $M_{41}$ to $M_{46}$, $M_{51}$ to $M_{56}$ and $M_{61}$ to $M_{66}$ in the form of a $6 \times 6$ square matrix of cross marks. It is assumed that the center position of each of the cross marks has been preliminarily measured in a first rectangular coordinate system on the reticle 503 by any other measuring means with an error of about 0.1 μm or less. Also, the center of each cross mark is determined so that it becomes line symmetrical with respect to the coordinate axes x and y and point symmetrical with respect to the center of the reticle 503 or the origin 0. Note that for the purpose of discriminating these cross marks, they are successively designated such that the topmost row includes the marks $M_{11}$, $M_{12}$, ..., $M_{16}$, the next lower low includes the marks $M_{21}$, $M_{22}$, ..., $M_{26}$ and so on. As a result, the cross marks on the reticle 503 are generally specified by Mij (where i and j are each 1 to 6) and thus the center positions of these cross marks are specified by Pij (where i and j are each 1 to 6) in correspondence to the Mij.

Figure 30:
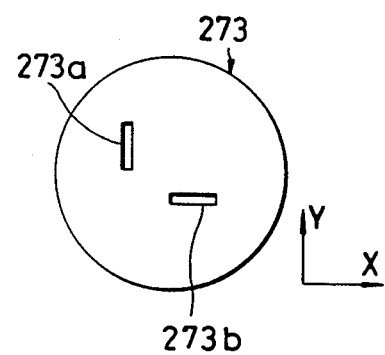
FIG. 30 is a plan view of a light shielding member for forming the small openings provided on the stage of a reduction projection-type exposure apparatus according to the invention.

Referring now to FIG. 30, there is illustrated plan view of a fine slit member 273 mounted on a stage 7 in the third embodiment of the invention. As previously described in connection with FIGS. 4 and 5, the fine slit member 273 is provided by evaporating a layer of chromium on a glass plate to a thickness of about 0.1 μm as shown by the hatched portion in the Figure and forming two slit openings 273a and 273b in some portions of the chromium layer. The thickness of the chromium layer is thin enough as compared with the depth of focus (several μm) of a projection lens 6. The directions of extension of the slit openings 273a and 273b are selected to cross each other at right angles and also to correspond exactly with the directions X and Y of movement of the stage 7. Note that the elongated slit opening 273a extending along the Y-axis direction is used to detect the X-direction positions of the projected images of the cross marks Mij and the elongated slit opening 273b extending along the X-axis direction is used to detect the Y-direction positions of the cross marks Mij.

Also, the widths of the slit openings 273a and 273b are selected to be smaller than the width of the straight line portions in the images of the corss marks Mij. This will be described later in a greater detail.

Next, a description will be made of the operation of detecting the optical characteristics of the projection lens 6 in the third embodiment of the invention using the exposure apparatus shown in FIGS. 2 and 6.

Firstly, the reticle 503 set in the apparatus is positioned by means of the reticle alignment control system 33. In this case, the positioning is effected such that the optical axis of the projection lens 6 passes through the origin 0 of the second rectangular coordinate system xy on the reticle 503. Then, the position of the reticle 503 is determined in such a manner that the axes x and y of the coordinate system xy are extended parallel (including the case of coincidence) to the moving directions X and Y of the stage 7 or the measuring axes X and Y of the laser interferometers 13 and 34, respectively. As a result, the two crossing straight portions of each of the cross marks Mij are respectively extended in the directions corresponding exactly to the moving directions X and Y of the stage 7.

Then, the stage 7 is moved by means of the X-actuator 35 and the Y-actuator 36 so that the height of the surface of the fine slit member 273 is detected by the gap sensor 12 and the focus detecting circuit 39 and in accordance with the detected information the Z-actuator 38 is operated in a manner that the image forming plane of the projection lens 6 and the surface of the fine slit member 273 correspond exactly with each other.

Figure 31:
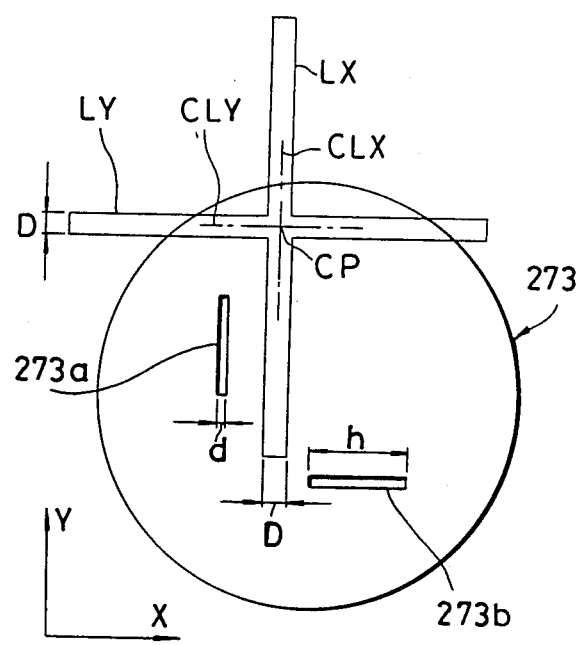
FIG. 31 is a diagram showing the relation between the size of the projected image of the mark on the reticle of FIG. 29 and the size of the small openings or slits.

Then, the shutter 4a is opened by the shutter actuator 32 so that the reticle 503 is illuminated and the images of the cross mark Mij is projected onto the member 273. Then, the X-actuator 35 and the Y-actuator 36 are operated to move the stage 7 such that the positional relation between the image of the cross mark Mij and the slit openings 273a and 273b becomes as shown in FIG. 31, for example. In this case, by preliminarily obtaining the coordinate values measured by the laser interferometers 13 and 34 when the slit openings 273a and 273b are respectively positioned on the optical axis of the projection lens 6, for example, it is possible to easily specify the approximate position of the image of each cross mark Mij.

In this case, the relation between the size of the image of the projected cross mark Mij and that of the slit openings 273a and 273b of the fine slit member 273 becomes as shown in FIG. 31. In other words, in the image of the cross mark Mij the straight portion extended in the Y direction is designated as a slit image LX and the straight portion extended in the X direction to cross the slit image LX at right angles is designated as a slit image LY. Also, the centers of the width D of the slit images LX and LY are respectively designated as center lines CLX and CLY and the intersection of the center lines CLX and CLY or the center of the image of the cross mark Mij is designated as a center CP. Also, it is determined so that there is a relation $d < D < h$ if the width and length of the slit openings 273a and 273b are respectively represented by d and h.

Figure 32:
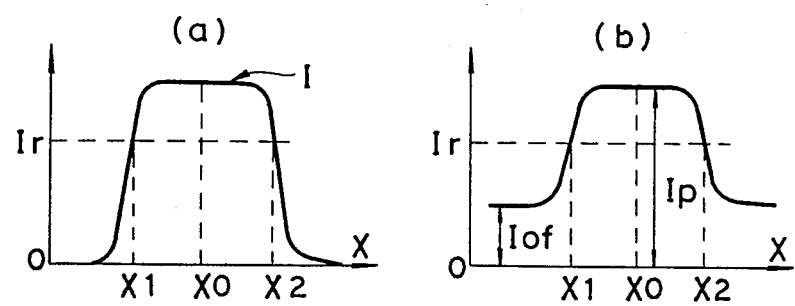
FIG. 32 illustrates diagrams showing the light intensity distributions resulting from the photoelectric detection of the projected images of marks of a reticle.

Then, when the stage 7 is moved at a uniform speed in the X direction from the position shown in FIG. 31 so that the slit image LX is scanned by the slit opening 273a, the photoelectric converting element 9 generates a photoelectric signal I as shown in FIG. 32(a). In FIG. 32(a), the abscissa represents the position of the stage 7 in the X direction and the ordinate represents the magnitude of the photoelectric signal I. This is equivalent to the width-direction light intensity distribution of the slit image LX. Then, the photoelectric signal I is compared with a predetermined reference level Ir so that when the photoelectric signal I and the reference level Ir become equal, the corresponding positions $X_1$ and $X_2$ of the stage 7 are measured by the laser interferometer 13. The resulting measured values are taken into the CPU 30 and the two positions are averaged to obtain a position $X_o$. In other words, the CPU 30 obtains the position $X_o$ of the stage 7 resulting from the calculation of $(X_1+X_2)/2$ as the projection position of the center line CLX of the slit image LX.

On the other hand, as regards the slit image LY, similarly the stage 7 is moved in the Y direction from the position of FIG. 31 so that the slit image LY is scanned by the slit opening 273b and in accordance with the resulting light intensity distribution the desired Y-direction position of the stage 7 is obtained as the projection position of the center line CLY of the slit image LY.

As a result, the coordinate values $(X_o, Y_o)$ of the stage 7 are detected as the projection position of the center CP of the image of the cross mark Mij and then stored in the CPU 30.

In the like manner, the measurement is performed on each of the other cross mark images and the resulting measured values are successively stored in correspondence to the positions Pij of the cross marks Mij on the reticle 503.

Note that the reason for selecting the sizes of the slit openings 273a and 273b and the image of the cross mark Mij to meet the relation $d < D < h$ is that the position detection is still ensured even if the slit opening 273a scans both the slit images LX and LY or the slit opening 273b scans the slit image LX simultaneously with the scanning of the slit image LX by the slit opening 273a during the detection of the projection position in the X direction.

For instance, with the slit opening 273a crossing the slit image LY, if the stage 7 is scanned in the X-direction, the photoelectric signal from the photoelectric converting element 9 results in a signal having the maximum value $I_p$ with a given offset $I_{of}$ in the scan portions of the slit image LY as shown in FIG. 32(b). The magnitude of the offset $I_{of}$ is proportional to the product of the width d of the slit opening 273a and the width D of the slit image LY and the maximum value $I_p$ is proportional to the product of the width d and the length h of the slit opening 273a.

In order to compare such signal with the reference level $I_r$ and obtain the desired positin $X_o$ of the center line CLX of the slit image LX, there must be a relation $I_r > I_{of}$. Therefore, the width D of the slit image LY and the length h of the slit opening 273a must be selected $D < h$ to meet this condition. Also, the reason for selecting the width d of the slit openings 273a and 273b smaller than the width D of the slit images LX and LY is to cause the photoelectric signal to rise and fall rapidly and thus it is selected $d < D$. It is to be noted that the relation between the widths d and D is not limited to $d < D$ and the use of a relation $d = D$ has no substantial effect on the photoelectric detection and the position detection thus making it possible to detect the center position of the image of each cross mark Mij in the same way as described previously.

Then, in accordance withe the measured projection positions of the corss marks Mij and the positions Pij, the CPU 30 computes the optical characteristics, e.g., the projection magnification factor and the amount of distortion of the projection lens 6.

It is assumed now that with Tij representing the projection positions of the images of the cross marks Mij measured as the positions of the stage 7, then the values of Pij are given in terms of coordinate values $x_{ij}$ and $y_{ij}$ and the values of Tij are given in terms of coordinate values Xij and Yij. Thus, the following equation is used for the calculation of a projection magnification N by way of example.

$$N = \frac{1}{2} \left[ \frac{\sum_{i=1}^{6} X_{i1} - \sum_{i=1}^{6} X_{i6}}{\sum_{i=1}^{6} x_{i1} - \sum_{i=1}^{6} x_{i6}} + \frac{\sum_{j=1}^{6} Y_{1j} - \sum_{j=1}^{6} Y_{6j}}{\sum_{j=1}^{6} y_{1j} - \sum_{j=1}^{6} y_{6j}} \right] \quad (5)$$

In the above equation (5), $X_{i1}$ and $x_{i1}$ respectively indicate the X-direction positions on the reticle 503 of the corss marks $M_{11}, M_{21}, M_{31}, \ldots, M_{61}$ forming the left-end column and the X-direction projection positions of these six cross marks in FIG. 29. Also, $X_{i6}$ and $x_{i6}$ respectively indicate the x-direction positions on tbe reticle 503 of the corss marks $M_{16}, M_{26}, \ldots, M_{66}$ forming the right-end column in FIG. 29 and the projection positions of these six cross marks in the X direction. Also, in the equation 5, $Y_{1j}$ and $y_{1j}$ respectively indicate the y-direction positions on the reticle 503 of the cross marks $M_{11}, M_{12}, \ldots, M_{16}$ forming the topmost row in FIG. 29 and the projection positions of these positions in the Y-direction. Also, $Y_{6j}$ and $Y_{6j}$ respectively indicate the Y-direction positions of the cross marks $M_{61}, M_{62}, \ldots, M_{66}$ forming the bottom row and the projection positions of these six marks in the Y direction.

On the other hand, if No represents the projection magnification which is to be set during the manufacture or adjustment of the projection lens 6, then the errors $(\alpha_{ij}, \beta_{ij})$ on the coordinates of the projected cross mark images including the distortion aberration are given as follows $$\alpha_{ij} = X_{ij} - x_{ij} \cdot No$$

$$\beta_{ij} = Y_{ij} - y_{ij} \cdot No$$

However, it is assumed that in this case the origin O of the coordinate system of the reticle 503 and the coordinate system origin of the image of the projected reticle 503 (i.e., the origin of the coordinate values of the stage 7) are corresponding exactly as the result of a suitable calculation. The errors ($\alpha_{ij}$, $\beta_{ij}$) indicate the amounts of projection distortion. The thus calculated results are indicated by the terminal 40.

While, the projection magnification and the projection distortion are obtainable in this way, the above equation (5) is only an example and thus depending on the definition of the magnification the calculation corresponding to the definition is used. For example, it is possible to use only the cross marks $M_{11}$, $M_{16}$, $M_{61}$ and $M_{66}$ at the four corners. Thus, if the calculated projection magnification exceeds the tolerance, the distance L (FIG. 2) between the reticle 503 and the principal plane 6a of the projection lens 6 is adjusted again or the distance between the optical components (lenses) forming the projection lens 6 is adjusted again thereby varying the focal distance. Then, the magnification is measured again by the above-mentioned method and the adjustment and measurement of the projection lens 6 are repeated until the magnification error is reduced to an allowable value. Also, during the measurement of the magnification error the distortion aberration of the projection optical system is measured so as to determine that the aberration is a tolerable one. If the distortion aberration is in excess of the tolerance, the positions of the optical elements within the projection lens 6 are adjusted or the optical elements are replaced with others.

It will be seen from the foregoing description that in accordance with this embodiment it is possible to eliminate the time and labor for exposing and developing the pattern of a test reticle and measuring the resist image with a separate measuring device as has been the practice in the past and the optical characteristics of the projection lens 6 can be detected very easily by simply mounting the mark image detecting photoelectric sensor 9 on the movable stage which is usually included in the conventional projection exposure apparatus. There is another advantage that when it is desired to replace the projection lens 6 with any other projection lens of a different reduction ratio during not only the manufacture of exposure apparatus but also on the site of manufacture of LSIs, there is no need to use any special measuring means and thus there is an advantage that after the replacement the optical characteristics of the lens can be adjusted to the optimum values very efficiently.

While, in the above-described embodiment, the calculations of the optical characteristics is performed by the CPU 30 incorporated in the exposure apparatus, the similar effects can be obtained by indicating only the detected positions of the projected images of the cross marks $M_{ij}$ by the terminal 40 and performing the desired calculations by a separate computer in accordance with the detected position data.

The foregoing description has been made of the case in which the image forming position corresponds exactly with the surface of the member 273. Since the gap sensor 12 shown in FIG. 2 is used with the present embodiment, if the gap sensor 12 has been adjusted and free of any detection error, the gap sensor 12 is used and also the focus detecting circuit 39 is used to detect any focusing error with respect to the slitted surface thereby effecting the focusing.

In the case of a construction where an automatic focus detection is effected by means of a gap sensor, however, upon the manufacture of an apparatus or upon the changing of the projection lenses, generally the forcus detecting circuit 39 generates a detection signal involving an offset with respect to the focus detection and therefore it is impossible to make the projected image focusing plane and the slitted surface corresponds exactly with each other if only the gap sensor is relied on.

Thus, a description will now be made of a case where in the third embodiment of the invention the desired focus detection is accomplished by means of the photoelectric sensor 9 in accordance with the contrast of a projected mark image.

Figure 33:
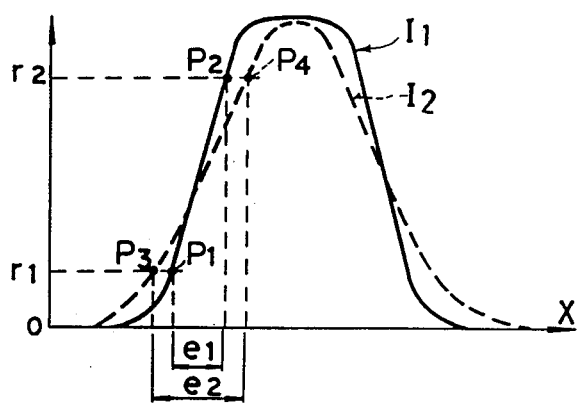
FIGS. 33 anbd 34 are diagrams useful for explaining the detection of a focal point by means of the small openings and the photoelectric sensors.
Figure 34:
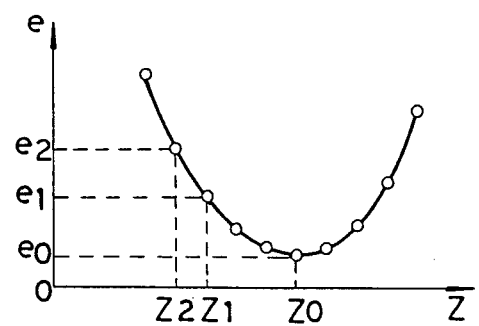

In this case, utilizing the fact that the fine slit member 273 and the photoelectric converting element 9 are simultaneously moved vertically as a unit by the wafer lifting Z-actuator 38, the operation of vertically moving the fine slit member 273 a distance corresponding to one of several equal parts into which is divided the length of the focal depth of the projection lens 6 and then scanning the stage 7 to measure the intensity distribution of the image is performed repeatedly. Then, a focusing condition is detected in which the range of the rising or falling portion in the intensity distribution of the image is minimum. In fact, the intensity distribution of an image of each cross mark on the reticle 503 is examined. FIG. 33 shows the magnitudes of the signals generated as the result of the photoelectric conversion of the mark images passed through the fine slit member 273 in response to the movement of the stage 7. In the Figure, the ordinate represents the magnitude of the signal and the abscissa represents the position of the stage 7 in the X direction. Assuming that the waveform of a photoelectric signal $I_1$ from the photoelectric converting element 9 becomes as shown in FIG. 33 when the slitted surface including the slit opening 273a is close to the image plane, if the slitted surface and the image plane are separated by a greater distance than this condition, the width of the waveform expands and it becomes like a signal $I_2$. As a result, by measuring the amount of expansion of the waveofrm or the slope of the shoulder of the waveform and looking for a condition where the amount of expansion of the waveform is minimized or the slope of the shoulder of the waveform becomes maximum, it is possible to find out the best focusing condition. A specific exmaple of this method will now be described. Two reference levels $r_1$ and $r_2$ are provided as shown in FIG. 33. The magnitudes of the reference levels $r_1$ and $r_2$ are selected to have predetermined ratios to the maximum values of photoelectric signals. Then, the stage 7 is scanned so that coincidence points $P_1$ and $P_2$ of the signal I with the levels $r_1$ and $r_2$ are detected and an amount of waveform expansion $l_1$ is measured in accordance with the distances of the points $P_1$ and $P_2$ in the X direction. The measurement of the distances in the X direction is performed by the CPU 30 which makes the necessary calculations through the stage position measuring laser interferometer 13. Similarly, the positions of points $P_3$ and $P_4$ are detected where the signal $I_2$ attains the levels $r_1$ and $r_2$ and an amount of waveform expansion $e_2$ is measured. FIG. 34 is a graph in which the abscissa represents the vertical position Z of the slitted surface moved by the Z-actuator 38 and the ordinate represents the amount of waveform expansion e of the photoelectric signal. By repeating the operation of vertically moving the slitted surface a predetermined amount, e.g., 0.5 μm, stopping it and then scanning the stage, the amounts of waveform expansion shown in FIG. 33 are measured and the amounts of expansion e with respect to the positions Z are stored as such data in the CPU 30. In FIG. 34, an expansion amount $e_o$ represents a position $Z_o$ where the slitted surface corresponds exactly with the image plane and the expansion amounts at deviated positions $Z_1$ and $Z_2$ from the position $Z_o$ respectively become $e_1$ and $e_2$ as previously described in connection with FIG. 33. The actual focusing is performed by successively measuring and storing the expansion amounts e at the positions $Z_2$, $Z_1, \ldots, Z_o, \ldots$ and operating the Z-actuator 38 so as to return the slitted surface to the position $Z_o$ at which the expansion amount is minimum.

By virtue of the method illustrated and described so far, the exact correspondence can be attained between the projection imaging plane of the projection lens 6 and the slitted surface of the fine slit member 273 and the coordinates of the image can be measured under the focused condition.

From the foregoing it will be seen that since the contrast of the projected image itself is detected by the photoelectric converting element 9 mounted on the stage 7, the S/N ratio of the signal is high and the focus position can be detected accurately. As a result, if the height of the slitted surface corresponding to the maximum contrast of the projected image is detected by the gap sensor 12 of FIG. 2 and adjustments are made such that the detection signal from the focus detecting circuit 39 becomes a focused condition indicative signal, e.g., zero V, that is, if the detection offset is cancelled, irrespective of the adjustment or replacement of the projection lens 6, clear patterns can always be transferred onto the wafer 10. In addition, by examining the focus positions at various positions within the effective exposure area of the projection lens 6 by means of the plurality of cross marks on the reticle 503 shown in FIG. 29, it is possible to readily measure the distribution of fine irregularities, the distribution of focal depths, etc., in the imaging surface within the exposure area. Thus, in accordance with the resulting measured data, it is also possible to confirm the tilting of the optical axis of the projection lens 6 with respect to the plane of movement (the coordinate system XY) of the stage 7.

In accordance with the above-described embodiment, the marks on the reticle 503 are not limited to the cross marks and they may take the form of L-shaped marks as the slit openings 273a and 273b.

Further, while the member 273 includes the two slit openings 273a and 273b, the two may be combined into an L-shaped fine slit. In this case, the sizes of the L-shaped slit opening and the projected images of the cross marks should preferably be selected to ensure the relation $d < D < h$ as mentioned previously.

Also, in addition to the above-mentioned applications for use during the manufacture, servicing or maintenance, the third embodiment of the invention may be included in a part of the ordinary operations of the exposure apparatus when it is desired to make a fine adjustment of the porjection magnification by a given amount. For instance, when the pattern of the (n+1)th layer is to be exposed after the formation of the nth layer pattern, if the wafer on the whole has been elongated uniformly, this can be overcome by realizing an exposure apparatus so designed that any fine adjustment of the distance L in the first embodiment of FIG. 2 can be confirmed easily and that the magnification is variable and also the projection magnification is measurable. In accordance with such exposure apparatus, it is sufficient to vary the projection magnification in accordance with the expansion or contraction of the wafer on the whole. In other words, if the wafer is expanded k times, it is only necessary to vary the projection magnification from the initial N times to kN times. For this purpose, it is necessary to provide actuating means responsive to the commands from the CPU 30 to relatively move the projection lens 6 and the reticle 503 in the optical axis direction so that the measured magnification attains a desired value.

The apparatus having a variable magnification and capable of accurately setting the desired magnification is effective not only in coping with the expansion and contraction of a wafer as mentioned previously but also in these applications where another exposure apparatus such as an X-ray exposure apparatus including a soft X-ray radiation source and adapted to effect a proximity exposure at a finite distance from the radiation source is used in combination with a projection type exposure apparatus for the manufacture of devices of one type.

In other words, where the circuit patterns of some layers are printed on a wafer by an exposure apparatus, e.g., an X-ray exposure apparatus in which the magnification between the size of the pattern on the mask and the size of the pattern printed on the wafer is different from an integer value by a small amount and the circuit patterns of the other layers are printed on the wafer by an optical projection-type exposure apparatus, there is an advantage that even the magnification relation between the two is preset to a perfect integral multiple or integral fraction during the manufacture of masks or reticles, the requirement can be met easily by adjusting the magnificaiton by the projection exposure apparatus making easy the manufacture of masks or reticles.

Figure 35:
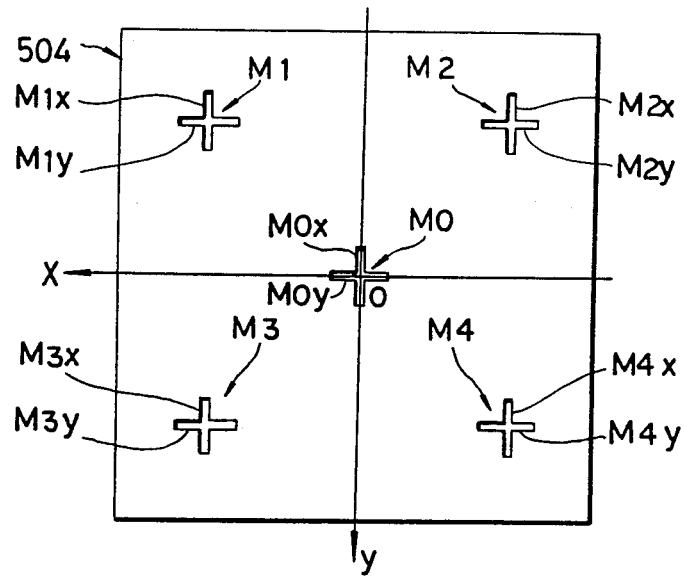
FIG. 35 is a plan view of a test reticle used with a fourth embodiment of the invention.

Next, a fourth embodiment of the invention will be described. Referring now to FIG. 35, there is illustrated a plan view showing the pattern on a reticle 504 used in the fourth embodiment. The reticle 504 is made by forming an opaque portion (the hatched portion in the Figure) of chromium or the like on the entire lower surface (on the side of a projection lens 6) of a glass substrate and then forming light transmitting cross marks $M_0$, $M_1$, $M_2$, $M_3$ and $M_4$.

When a rectangular coordinate system xy having the center of the reticle 504 as its origin is established for the reticle 504, the center of the cross of the mark $M_0$ corresponds exactly with the origin O and the marks $M_1$ to $M_4$ are arranged at positions of substantially the same distance to the origin. These five cross marks are respectively composed of elongated light transmitting portions $M_{0y}$, $M_{1y}$, $M_{2y}$, $M_{3y}$ and $M_{4y}$ extending in the x direction and elongated light transmitting portions $M_{0x}$, $M_{1x}$, $M_{2x}$, $M_{3x}$ and $M_{4x}$ extending in the y direction.

Then, the center positions of the crosses of the five marks have been preliminarily measured by precision position measuring means and have been determined in terms of coordinate values $(x_0, Y_0)$, $(x_1, Y_1)$, $(x_2, Y_2)$, $(x_3, Y_3)$ and $(x_4, Y_4)$ for the marks $M_0$ to $M_4$, respectively. While, of these coordinate values, the coordinate values $(x_0, y_0)$ of the mark $M_0$ will be given as $x_0=0$ and $y_0=0$ if the origin and the center of the corss of the mark $M_o$ are made correspond exactly as shown in FIG. 35, it is not always necessary to determine the coordinate system xy as shown in FIG. 35 and preliminarily obtain the coordinate values of the marks $M_0$ to $M_4$. As a result, the coordinate values of the mark $M_0$ are given in the general form.

Figure 36:
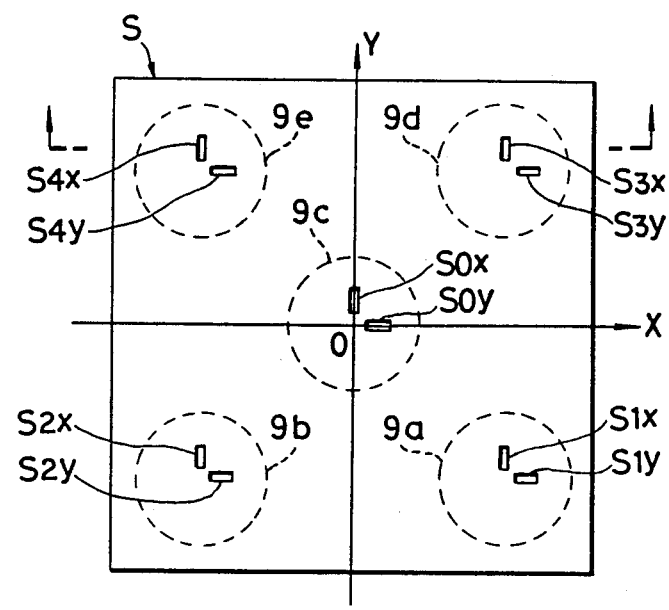
FIG. 36 is a plan view of a slit member S used in a reduction projection type exposure apparatus according to the fourth embodiment of the invention.
Figure 37:
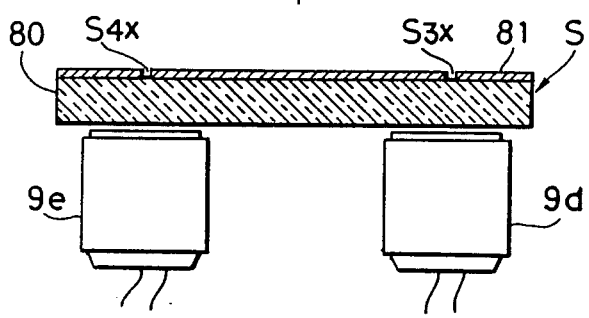
FIG. 37 is a partial secitonal view showing the arrangement of the slit member S and the photoelectric sensors.

On the other hand, FIG. 36 is a plan view of a slit member S. FIG. 37 is a sectional view taken along the arrow line of FIG. 36. The slit member S comprises a transparent substrate 80 such as a low expansion glass or crystal and a layer 8a consisting of an opaque portion (a hatched portion in the Figure) of chromium or the like formed on the surface (on the side of the projection lens 6) of the substrate 80. The layer 81 is formed with a plurality of light transmitting slits in correspondence to the projection positions of the marks $M_0$ to $M_4$ of the reticle 504 projected through the projection 6.

A rectangular coordinate system XY is also established for the slit member S. This coordinate system XY is opposite in axial direction to the coordinate system xy of the reticle 504. The reason is that the projected image of the reticle 504 has its top and bottom and left and right side reversed on the slit member S.

As shown in FIG. 36, there are provided five sets of slits each including two slits respectively extending in the X and Y direcitons so that the projected image of each of the cross marks $M_0$ to $M_4$ is registered on one of the five sets and of these slits the slits $S_{0x}$ and $S_{0y}$ are respectively positioned on the x and y axes. As a result, where the center O of the reticle 504 is positioned to pass through the optical axis of the projection lens 6 and also the center O of the slit member S is positioned to pass through the optical axis of the projection lens 6, the projected images of the light transmitting portions $M_{0x}$ and $M_{0y}$ of the mark $M_0$ are respectively registered on the slits $S_{0x}$ and $S_{0y}$. In the like manner, the projected images of the light transmitting portions $M_{1x}$ and $M_{1y}$ of the mark $M_1$ are placed in register with the slits $S_{1x}$ and $S_{1y}$, the projected images of the light transmitting portions $M_{2x}$ and $M_{2y}$ of the mark $M_2$ in register with the slits $S_{2x}$ and $S_{2y}$, the projected images of the light transmitting portions $M_{3x}$ and $M_{3y}$ of the mark $M_3$ in register with the slits $S_{3x}$ and $S_{3y}$ and the projected images of the light transmitting protions $M_{4x}$ and $M_{4y}$ of the mark $M_4$ in register with the slits $S_{4x}$ and $S_{4y}$.

Also, while the positions of the slits are selected at the ideal positions where the projected images of the marks $M_0$ to $M_4$ are respectively formed, generally the manufacturing error of the order of 0.1 $\mu$m is caused and therefore the slit positions have preliminarily been measured accurately as the coordinate positions on the slit member S by the precision position measuring means as in the case of the marks $M_0$ to $M_4$ on the reticle 504.

Then, the slits $S_{0x}$, $S_{1x}$, $S_{2x}$, $S_{3x}$ and $S_{4x}$ are respectively provided to detect the X-direction projection positions of the light transmitting portions $M_{0x}$, $M_{1x}$, $M_{2x}$, $M_{3x}$ and $M_{4x}$ of the marks $M_0$ to $M_4$ and their X-coordinate values are designated as $a_0$, $a_1$, $a_2$, $a_3$ and $a_4$, respectively. Also, the slits $S_{0y}$, $S_{1y}$, $S_{2y}$, $S_{3y}$ and $S_{4y}$ respectively detect the Y-direction projection positions of the light transmitting portions $M_{0y}$, $M_{1y}$, $M_{2y}$, $M_{3y}$ and $M_{4y}$ of the marks $M_0$ to $M_4$ and their Y-coordinate values are respectively designated as $b_0$, $b_1$, $b_2$, $b_3$ and $b_4$.

Disposed below the above-described slit member S are five photoelectric sensors 9a to 9e.

The photoelectric sensor 9a receives the light passed through the slits $S_{1x}$ and $S_{1y}$, the photoelectric sensor 9b the light passed through the slits $S_{2x}$ and $S_{2y}$, the photoelectric sensor 9c the light passed through the slits $S_{0x}$ and $S_{0y}$, the photoelectric sensor 9d the light passed through the slits $S_{3x}$ and $S_{3y}$ and the photoelectric sensor 9e the light passed through the slits $S_{4x}$ and $S_{4y}$. The slit member S and the photoelectric sensors 9a to 9e form photoelectric sensing means.

The fourth embodiment of the invention will now be described as applied to the projection exposure apparatus shown in FIGS. 2 and 6. In the fourth embodiment of the invention, in addition to the whole control system shown in FIG. 6, a part of the circuits for detection purposes must be included in the interface 31. FIG. 38 shows a specific example of the circuitry. In the FIG., the component parts which are identical with their counterparts in FIG. 6 are designated by the same reference numerals.

A switch 100 is provided which selects one of the photoelectric sensors 9a to 9e in response to a select signal SS from the CPU 30 and the photoelectric signal from the selected photoelectric sensor is amplified by an amplifier 101 which in turn generates a signal I.

A comparator 102 compares the magnitudes of a reference level $I_r$ and the signal I and generates a signal A which has a logical value "1" when $I > I_r$. A latch circuit 103 comes into a latching operation in response to the rising portion of the signal A and a latch circuit 104 comes into a latching operation in response to the rising portion of the inverted signal of the signal A.

The latch is released by a release signal $S_2$ from the CPU 30. The signal A is also read into the CPU 30.

On the other hand, the laser interferometer 13 generates an up/down pulse in response to each unit amount of movement (e.g., 0.01 $\mu$m) of the stage 7 in the X direction and the pulses are counted incrementally or decrementally to detect the position of the stage 7 in the X direction.

Also, the laser interferometer 34 generates the similar up/down pulses and a Y-counter 107 detects the position of the stage 7 in the Y direction.

The X-counter 106 and the Y-counter 107 clear their counts to zero in response to clear signals $CS_1$ and $CS_2$ from the CPU 30.

Also, the count values XC and YC of the X-counter 106 and the Y-counter 107 are read into the CPU 30 through its input/output or I/O port.

A selector switch 108 receives the count values XC and YC and selectively supplies one or the other of the count values XC and YC to the latch circuits 103 and 104, respectively, in response to a select signal $S_1$ from the CPU 30.

As a result, when the count value XC is selected by the selector switch 108, in response to the rising portion of the signal A the latch circuit 103 latches and applies the XC count as a data $LD_1$ to the CPU 30 and the latch circuit 104 latches and applies the count value XC as a data $LD_2$ to the CPU 30.

On the other hand, an RAM 111 is connected to the CPU 30 and the position data of the marks $M_0$ to $M_4$ on the reticle 504 and the position data of the slits of the slit member S on the stage 7 are stored in the form of tables in the RAM 111.

Also, the RAM 111 is used as a temporary memory for the various calculations. Also, digital-to-analog (D/A) converters 112 and 113 are provided to respectively control the X-actuator 36 and the Y-actuator 35 of FIG. 6.

The D/A converter 112 converts a data XM from the CPU 30 to an analog signal and controls the driving speed of the stage 7 in the X direction.

The D/A converter 113 converts a data YM from the CPU 30 to an analog signal and controls the driving speed of the stage 7 in the Y direction.

Each of the data XM and YM can assume either of positive and negative value so that the stage 7 is moved in the positive direction of the coordinate system XY when the data is positive and the stage 7 is moved in the negative direction of the coordinate system XY when the data is negative.

When the data XM and YM are zero, the stage 7 is held at rest.

In addition, the stage 7 is subjected to a positioning loop control by the counters 106 and 107, the D/A converters 112 and 113 and the actuators 36 and 35 through the CPU 30. Note that the laser interferometers 13 and 34, the counters 106 and 107, the selector switch 108 and the latch circuits 103 and 104 form position detecting means.

Next, the operation of detecting the optical characteristics of the projection lens 6 by means of the exposure apparatus will be described.

Firstly, the reticle 504 set in the apparatus is positioned by means of the reticle alignment controller 33. In this case, the positioning is effected in such a manner that the optical axis of the projection lens 6 passes through the origin O of the coordinate system on the reticle 504. Also, the positioning of the reticle 504 including a rotational correction is effected in such a manner that the x and y axes of the coordinate system xy are respectively made parallel or correspond exactly to the directions of movement X and Y of the stage 7 or the measuring axes X and Y of the laser interferometers 13 and 34. In this way, the two crossing light transmitting portions of each of the five cross marks $M_0$ to $M_4$ are respectively extended to correspond exactly with the directions of movement X and Y of the stage 7.

Then, the stage 7 is moved by the X-actuator 35 and the Y-actuator 36 so that the height of the surface of the layer 81 of the slit member S is detected by means of the gap sensor 12 and the focus detecting circuit 39 and in accordance with the detected information the Z-actuator 38 is operated in such a manner that the imaging plane of the projection lens 6 and the surface of the layer 81 correspond exactly with each other.

Then, the shutter 4a is opened by the shutter actuator 32 so that the reticle 504 is illuminated and the images of the marks $M_0$ to $M_4$ are projected. Then, the X-actuator 35 and the Y-actuator 36 are operated to move the stage 7 in such a manner that the positional relation between the projected images of the marks $M_0$ to $M_4$, respectively, and the slits $S_{0x}$ to $S_{4x}$ and $S_{0y}$ to $S_{4y}$ become for example as shown in FIG. 39. FIG. 39 shows the relative positions of a projected image $M_0'$ of the mark $M_0$ of the reticle 504 and the slits $S_{0x}$ and $S_{0y}$ of the slit member S. With the mark $M_0$, $M_{0x}'$ designates the projection portion of an elongated light transmitting portion $M_{0x}$ extending in the Y direction and $M_{0y}'$ designates the projection portion of an elongated light transmitting portion $M_{0y}$ extending in the X direction.

Also, the width dm of the projection portions $M_{0x}'$ and $M_{0y}'$ is selected greater than the width ds of the slits $S_{0x}$ and $S_{0y}$. Then, when the projected image $M_0'$ and the slits $S_{0x}$ and $S_{0y}$ are positioned as shown in FIG. 39, projected images $M_1'$ to $M_4'$ of the other four marks $M_1$ to $M_4$ and the other slits $S_{1x}$ to $S_{4x}$ and $S_{1y}$ to $S_{4y}$ are similarly positioned relative to one another.

Next, the procedure for detecting the position of a center $CP_0$ of the projected image $M_0'$ of the mark $M_0$ with the circuitry of FIG. 38 will be described with reference to the flow chart shown in FIG. 40.

FIG. 40 is a basic and simplest flow chart and it shows the procedure only for one scanning in one direction of the projected image $M_0'$ by the slits $S_{0x}$ and $S_{0y}$ as well as the measurement of the positions of centers $CP_1$ to $CP_4$ of the other projected images $M_1'$ to $M_4'$.

In the Figure, a step 200 stores as a home position the position of the stage 7 at which the projected image $M_0'$ and the slits $S_{0x}$ and $S_{0y}$ are positioned relative to one another as shown in FIG. 39 and in fact the counted number XC of the X-counter 106 and the counted number YC of the Y-counter 107 are stored in the RAM 111.

At the next step 201, the CPU 30 generates a select signal $S_1$ and a release signal $S_2$ so that the selector swtich 108 selects the counted number XC and the latch of the latch circuits 103 and 104, respectively, is released. At a step 202, the CPU 30 applies its data XM to the D/A converter 112 so as to move the stage 7 a predetermined distance in the X direction. Whether the stage 7 has been moved the predetermined distance is determined by successively reading the counted number XC of the X-counter 106 by the CPU 30.

Figure 41:
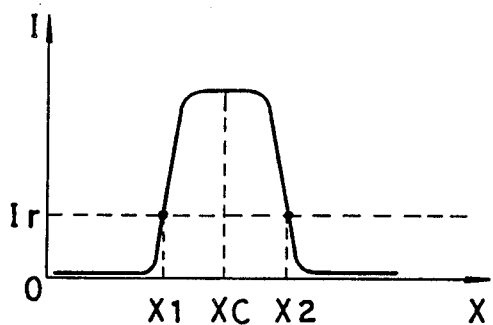
FIG. 41 is a photoelectric signal waveform diagram.

In response to the movement of the stage 7 in the X direction, the projection portion $M_{0x}'$ of the projected image $M_{0x}'$ is scanned by the slit $S_{0x}$ and the output signal I of the amplifier 101 results in a waveform as shown in FIG. 41. In FIG. 41, the ordinate represents the magnitude of the signal I and the abscissa represents the position of the stage 7 in the X direction. Thus, the waveform corresponds to the light intensity distribution of the projection portion $M_{0x}'$ in the width direction thereof.

Thus, when the signal I rises and exceeds a reference level $I_r$ at a position $X_1$ in response to the movement of the stage 7 in the X direction, the signal A goes from the logical value "0" to "1". Consequently, the latch circuit 103 latches the counted number XC corresponding to the position $X_1$. Then, as the scanning proceeds so that the signal I reaches a reference level $I_r$ at a fallen position $X_2$, the signal A goes from the logical value "1" to "0". Thus, the latch circuit 104 latches the counted number XC corresponding to the position $X_2$.

Then, after the projection portion $M_{0x}'$ has been crossed by the slit $S_{0x}$, the scanning of the stage 7 in the X direction is stopped. Then, at a step 203 the CPU 30 reads in the data $LD_1$ and $LD_2$ latched in the latch circuits 103 and 104, respectively, and at a step 204 the CPU 30 performs the calculation of $(LD_1+LD_2)/2$ so as to determine a position $X_c$ of the width-direction center $CL_{xo}$ of the projection portion $M_{0x}'$ as shown in FIG. 39. The data of the thus determined position Xc is stored in the RAM 111. Then, at a step 205, the CPU 30 moves the stages 7 the predetermined distance in the X and Y directions, respectively, so that the slit $S_{0y}$ is placed in a position for scanning the projection portion $M_{0y}'$, e.g., a position below the left end of the projection portion $M_{0y}'$. Since the size of the projected image $M_{0x}'$ is known previously, the positioning can be easily effected by detecting the counted numbers XC and YC of the X-counter 106 and the Y-counter 107.

Then, at a step 206, the CPU 30 generates a select signal $S_1$ and a release signal $S_2$ so that the selector switch 108 selects the counted number YC and also the latch of the latch circuits 103 and 104, respectively, is released.

Then, at a step 207, the CPU 30 applies its data YM to the D/A converter 113 so that the stage 7 is moved the predetermined distance in the Y direction as in the case of the step 202.

In this case, the waveform of the signal I takes the similar form as in FIG. 41 in response to the scanning of the projection portion $M_{0y}'$ by the slit $S_{0y}$. As a result, in response to the scanning of the stage 7 in the Y direction, the latch circuits 103 and 104 respectively latch the counted numbers YC corresponding to positions $Y_1$ and $Y_2$ at which the signal I attains the reference level $I_r$.

Then, at a step 208, the CPU 30 reads in the data $LD_1$ and $LD_2$ latched by the latch circuits 103 and 104, respectively, and at a step 209 the CPU 30 performs the operation of $(LD_1+LD_2)/2$ so that a position $Y_c$ of the center $CL_{yo}$ of the projected image $M_0'$ as shown in FIG. 39 is determined and stored in the RAM 111.

As the result of these steps, the position of the center $CP_0$ of the projected image of the mark $M_0'$ is measured as the coordinate values $X_c$ and $Y_c$ with the resolutions of the laser interferometers 13 and 34.

Thus, by positioning the stage 7 in such a manner that the coordinate positions measured by the X-counter 106 and the Y-counter 107 respectively become the coordinate values $X_c$ and $Y_c$, the center $R_{x0}$ of the slit $S_{0x}$ and the center $CL_{x0}$ of the projection portion $M_{0x}'$ shown in FIG. 39 correspond exactly and also the center $R_{y0}$ of the slit $S_{0y}$ and the center $CL_{y0}$ of projection portion $M_{0y}'$ correspond exactly thus accurately placing the projected image $M_0'$ and the slits $S_{0x}$ and $S_{0y}$ in register.

Then, the CPU 30 performs steps 210 and 211 and the stage 7 is placed at the home position. At a step 212, whether the similar measurement has been made with respect to each of the five marks $M_0$ to $M_4$ is determined so that the program of FIG. 40 is terminated if the measurements are over and a transfer is made to a step 213 if the measurements are not over. At the step 213, the CPU 30 generates a select signal SS so that one of the photoelectric sensors 9a to 9e corresponding to one of the marks $M_0$ to $M_4$ to be detected next is selected and the steps 201 et seq., are performed again thus making the similar measurement.

Note that in FIG. 40, additional steps may be provided such that after the completion of the step 209, the stage 7 is moved such that the projected image $M_0'$ of the mark $M_0$ and the slits $S_{0x}$ and $S_{0y}$ are placed in register and simultaneously the counted numbers of the X-counter 106 and the Y-counter 103 are reduced to zero by the clear signals $CS_1$ and $CS_2$ from the CPU 30. By so doing, there is another advantage that the position of the stage 7 is detected in accordance with the coordinate system whose origin is the center $CP_0$ of the projected image $M_0'$ thus simplifying the various computational operations which will be described later.

Figure 42A:
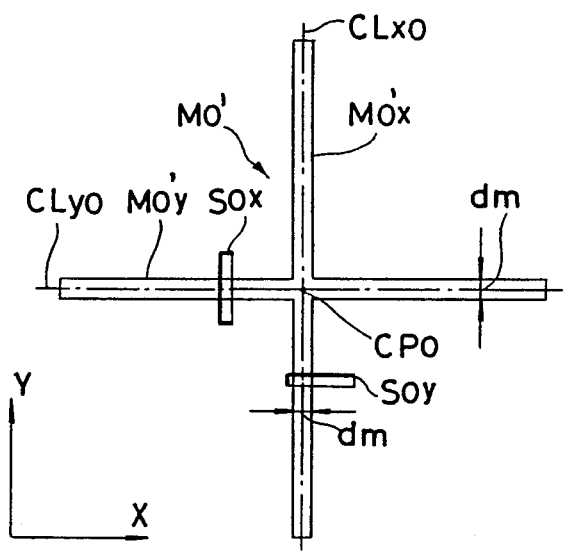
FIG. 42A is a plan view showing another positional relation between the projected image of a mark and slits.
Figure 42B:
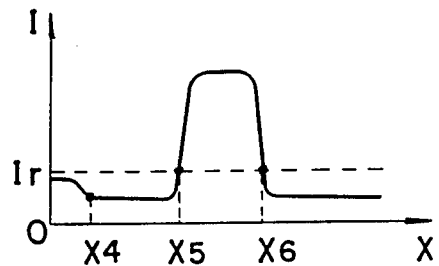
FIG. 42B is a photoelectric signal waveform diagram for the case of FIG. 42A.

Further, while, in the above description, the slit $S_{0y}$ does not scan any portion of the projected image $M_0'$ during the scanning of the projection portion $M_{0x}'$ by the slit $S_{0x}$, this is not always necessary. For instance, if the stage 7 is moved in the X direction from the position at which the slits $S_{0x}$ and $S_{0y}$ and the projected image $M_0'$ are positioned as shown in FIG. 42A, the waveform of the signal I becomes as shown in FIG. 42B. In other words, during the time that the stage 7 is moved from the position of FIG. 42A to a position $X_4$, the slit $S_{0y}$ is crossing the projection portion $M_{0y}'$ and the slit $S_{0y}$ is crossing the projection portion $M_{0x}'$. However, if the length of the slits $S_{0x}$ and $S_{0y}$ is selected sufficiently larger than the width dm of the projection portions $M_{0x}'$ and $M_{0y}'$, then there is no danger of the magnitude of the signal I exceeding the reference level $I_r$.

Also, during the interval between the position $X_4$ and a position $X_5$ only the slit $S_{0x}$ and the projection portion $M_{0y}'$ are registered and the signal I is decreased. Then, the slit $S_{0x}$ and the projection portions $M_{0x}'$ are registered during the interval between the positions $X_5$ and $X_6$ and thus the signal I exceeds the reference level $I_r$ for the first time. Therefore, by suitably selecting the size of the slits $S_{0x}$ and $S_{0y}$ and the size of the projected image $M_0'$, it is possible to make a distinction between the essential registration between the slit and the projection portion and other nonessential registration in accordance with the setting of the referenee level $I_r$.

Now, the thus detected positions of the centers $CP_0$ to $CP_4$ of the projected images $M_0'$ to $M_4'$ are stored in the RAM 111 as coordinate positions $X_{c0}$ and $Y_{c0}$, $X_{c1}$ and $Y_{c1}$, $X_{c2}$ and $Y_{c2}$, $X_{c3}$ and $Y_{c3}$, and $X_{c4}$ and $Y_{c4}$ as shown in FIG. 43. On the other hand, the positions of the marks $M_0$ to $M_4$ on the reticle 504 have been measured preliminarily and stored in the RAM 111 as coordinate values $x_0$ and $y_0$, $x_1$ and $y_1$, $x_2$ and $y_2$, $x_3$ and $y_3$ and $x_4$ and $y_4$, respectively, as shown in FIG. 44. Also, the positions of the five sets of slits $S_0$ to $S_4$ of the slit member S have been preliminarily stored in the RAM 111 as coordinate values $a_0$ and $b_0$, $a_1$ and $b_1$, $a_2$ and $b_2$, $a_3$ and $b_3$ and $a_4$ and $b_4$, respectively, as shown in FIG. 45.

Then, in accordance with the various data in the RAM 111 the amount of difference in position between the measured value and the design value is determined with respect to the position of each of the projected images $M_0'$ to $M_4'$ of the marks $M_0$ to $M_4$.

Now, let it be assumed that the ideal value (or design value) of the projection magnification from the reticle 504 to the imaging plane of the projection lens 6 is represented M $(M<1)$. If the projection lens 6 is a 1/5 reducing lens, then $M=1/5$.

Then, in accordance with the measured and designed values, the position error, if any, of each of the projected images $M_0'$ to $M_4'$ of the marks $M_0$ to $M_4$ is calculated as $\alpha$ and $\beta$ for the x and y directions, respectively, by the CPU 30 forming measuring means in accordance with the following equations $$\alpha i = X_{ci}' - (M \cdot x_i - a_i) \quad (6)$$

$$\beta i = Y_{ci}' - (m \cdot y_i - b_i) \quad (7)$$

where i=0, 1, 2, 3 or 4. The equations (6) and (7) denote that the measured values $X_{ci}$ and $Y_{ci}$ are respectively corrected in accordance with the mark positions $x_i$ and $y_i$ and the slit positions $a_i$ and $b_i$ and the deviation from the imaging condition is obtained.

Then, where the slits $S_0$ to $S_4$ are arranged along the coordinate system XY and FIG. 36, the center $CP_0$ of the projected image $M_0'$ corresponds exactly with the optical axis of the projection lens 6 and therefore the following calculations are performed using the center $CP_0$ as a reference point.

$$\gamma i = \alpha i - \alpha 0 \quad (8)$$

$$\delta i = \beta i - \beta 0 \quad (9)$$

where i=0, 1, 2, 3 or 4.

The values of $\gamma i$ and $\delta i$ given by the equations (8) and (9), respectively, indicate the error of the projection positions of the marks $M_0$ to $M_4$, respectively. For instance, the error of the projection position of the mark $M_1$ is given in terms of vectors such as $\gamma_1$ and $\oplus_1$. As a result, where the ideal exposure area is represented by an area 90 indicated by the broken line in FIG. 46, in accordance with the error ($\gamma i$, $\delta i$) of the projection position the actual exposure area including the projection distortion and magnification error of the projection lens 6 can be determined as an area 91 indicated by the solid line. However, as will be seen from the equations (8) and (9), the error is $(\gamma 0, \delta 0)=(0, 0)$ at the centers of the areas 90 and 91.

On the other hand, when the slit member S is mounted on the stage 7, generally the member S is frequently rotated by a small amount with respect to the moving coordinate system of the stage 7. Then, assuming that the slit member S is rotated by an angle $\theta$ with respect to the coordinate system XY in FIG. 36, the angle $\theta$ is a small amount for the error $(\gamma i, \delta i)$ of the projection position and therefore the correction is made approximately in accordance with the following equations.

$$\gamma i' = \gamma i + \theta \cdot \delta i \quad (10)$$

$$\delta i' = -\theta \cdot \gamma i + \delta i \quad (11)$$

where i=0, 1, 2, 3 or 4.

In accordance with the equations (10) and (11), the value of $\gamma i'$ and $\delta i'$ indicate the error values obtained by subjecting the error $(\gamma i, \delta i)$ to a rotational correction by $-\theta$ and the values $\gamma i'$ and $\delta i'$ represent the required projection position error (the distortion or magnification variation) of the focusing optical system.

It is to be noted that the angle $\theta$ can be obtained by using for example the minimum involution so as to minimize the value of $(\gamma i'^2 + \delta i'^2)$.

While, in the circuitry of FIG. 38, the marks $M_0$ to $M_4$ are respectively measured by successively selecting the photoelectric sensors 9a to 9e, by providing the amplifier 101, the comparator 102 and the latch circuits 103 and 104 for each of the photoelectric sensors 9a to 9e, it is possible to simultaneously measure the positions of the projected images $M_0'$ to $M_4'$ of the marks $M_0$ to $M_4$ by performing the steps 201 to 209 only once and not five times as in the case of FIG. 40.

Further, while the scanning of the projected images $M_0'$ to $M_4'$ by the slits $S_0$ to $S_4$ is effected only once in one direction, it is possible to move the stage 7 to effect a plurality of reciprocating scans and average the resulting position measured values thereby obtaining more accurate values.

Next, a modification of the fourth embodiment of the invention will be described with reference to FIGS. 47 and 48.

While this modification is the same with the fourth embodiment in that the projected images $M_0'$ to $M_4'$ are detected by the slits $S_{0x}$ to $S_{4x}$ and $S_{0y}$ to $S_{4y}$, there is a difference that the single photoelectric sensor 9 is arranged on the lower surface to the slit member S.

FIG. 47 is a plan view showing the relative positions of the projected images $M_0'$ to $M_4'$ of the marks $M_0$ to $M_4$ and the slits $S_0$ to $S_4$. Each of the slits $S_0$ to $S_4$ is intentionally shifted in position so as to not register any of the projected images $M_0$ to $M_4$ at the same position with the others. Noting the X-direction image position detecting slits $S_{0x}$ to $S_{4x}'$ for example, the slits $S_{0x}$ to $S_{04}$ are respectively arranged so as to be shifted in the X direction with respect to the projection portions $M_{0x}'$ to $M_{4x}'$ of the projected images $M_0'$ to $M_4'$ which are extended in slit form in the Y direction. As a result, in the condition of FIG. 47 where none of the slits $S_{0x}$ to $S_{4x}$ is in register with any of the projection portions $M_{0x}'$ to $M_{4x}'$, if the stage 7 is moved at a uniform speed in the X direction, the slit $S_{3x}$ and the projection portion $M_{3x}'$ first come into register and then the registration occurs successively between the slit $S_{0x}$ and the projection portion $M_{0x}'$, between the slit $S_{2x}$ and the projection portion $M_{2x}'$ and between the slit $S_{1x}$ and the projection portion $M_{1x}'$ in this order.

Consequently, signals I are generated as shown in FIG. 48 from the photoelectric sensor 9 which is arranged on the lower surface of the slit member S and having a photosensitive surface of a sufficient size to receive the light from the slits $S_0$ to $S_4$.

In FIG. 48, the ordinate represents the magnitude of the signal I and the abscissa represents the position X. Thus, when the slits $S_{0x}$ and $S_{4x}$ respectively scan the projection portions $M_{0x}'$ to $M_{4x}'$, the resulting signals I from the respective slits $S_{0x}$ and $S_{4x}$ are detectable separately in time or position. Thus, by detecting the center between the rising and falling portions of each of the signals I, it is possible to successively detect positions $X_{c3}$, $X_{c4}$, $X_{c0}$, $X_{c2}$ and $X_{c1}$ of the centers $CP_0$ to $CP_4$ of the projected images $M_0'$ to $M_4'$ in the X direction.

The position detection can be effected similarly by preliminarily shifting the slits $S_{0y}$ to $S_{4y}$ in position in such a manner that these slits successively come into register with the projection portions $M_{0y}'$ to $M_{4y}'$ of the projected images $M_0'$ to $M_4'$ and thereby detecting positions $Y_{c0}$ to $Y_{c4}$ of the centers $CP_0$ to $CP_4$ of the projected images in the Y direction. Thereafter, the projection error of the projection lens 6 can be obtained by performing the calculations shown by the equations (6) to (11). In this way, by shifting the slits $S_{0x}$ to $S_{4x}$ and $S_{0y}$ to $S_{4y}$ in position by a predetermined value such that these slits are not simultaneously in register with the projected images, it is possible to detect the plurality of projected images with the single photoelectric sensor. Thus, as compared with the previously described embodiment which uses a plurality of photoelectric sensors, there is the effect of performing the detection in a short period of time and also ensuring accurate position detection without being affected by the variations in photosensitivity among the photoelectric sensors.

Note that the slits $S_0$ to $S_4$ may be shifted in position in any desired manner. What is important is that the slits or the marks $M_0$ to $M_4$ of the reticle 504 are arranged in such a manner that when the stage 7 is scanned so that any one of the plurality of projected images $M_0'$ to $M_4'$ and one of the slits are registered, the other slits and the other projected images are out of register.

Another modification of the fourth embodiment of the invention is possible in which instead of moving the stage 7, the reticle 504 is used so as to scan the projected images $M_0'$ to $M_4'$ by the slits $S_0$ to $S_4$. In this case, the same effects can be obtained by making the reticle holder 15 movable in the x and y directions and providing position detecting means for measuring the moved positions and using the same in the like manner as the measurements by the laser interferometers 13 and 34.

Further, while the number of the coordinate measuring points within the projection exposure area is five as represented by the marks $M_0$ to $M_4$ and the slits $S_0$ to $S_4$, it is possible to make the measurement at a greater number of points and thereby to obtain the desired projection error more accurately.

Further, the position of each of the projected images $M_0'$ to $M_4'$ of the marks $M_0$ to $M_4$ is detected by slicing the rising and falling portions of a signal I at the reference level $I_r$. However, the operation of sampling the signal I in response to a pulse generated from the laser interferometers 13 and 34, respectively, for every unit distance moved, converting the same to a digital form and storing in a memory successively may be repeated.

Then, the sampled digital data of the signal I may be processed by the CPU 30 thereby detecting the projection position of each mark.

Still another modification is possible in which the marks $M_0$ to $M_4$ on the reticle 504 may be in the form of L-shaped marks instead of the cross marks. Further, the marks may take the form of simple rectangular marks as shown in FIG. 49A or the form of continuous window frame-type narrow marks as shown in FIG. 49B.

In FIGS. 49A and 49B, the hatched portions are light blocking portions. In the case of the continuous narrow marks shown in FIG. 49B, the positions of the plurality of bents and intersections of the narrow lines extending in the x and y directions are significant as the marks at given positions on the reticle 504.

FIG. 50 is a plan view of a reticle 505 used in a fifth embodiment of the invention which is a focus detecting unit for the exposure apparatus shown in FIG. 2. A rectangular coordinate system xy is established using the center 0 of the reticle 505 as its origin and in accordance with this coordinate system xy nine marks M111 to M133 are arranged in the form of a 3×3 square matrix. Each of the marks M111 to M133 comprises two sets of three fine slits extending in the x and y directions, respectively.

For instance, the mark M111 comprises a mark M111a including three fine slits extending in the y direction and arranged in the x direction and a mark M111b including three fine slits extending in the x direction and arranged in the y direction. This is all the same with respect to the other eight marks M112, M113, M121, M122, M123, M131, M132 and M133. As shown in FIG. 50, the central fine slit of each of the marks M112a, M122a and M132a is located on the y axis of the coordinate system xy and the central fine slit of each of the marks M121b, M122b and M123b are located on the x axis. The positions of these nine marks M111 to M133 have been preliminarily measured accurately by precision position measuring means with the resolution of 0.1 μm.

It is to be noted that the marks M111 to M133 are generally hereinafter referred to as marks M1$ij$ (where i and j are respectively 1 to 3).

On the other hand, FIG. 51 is a plan view of a slit plate 274 and FIG. 52 is a sectional view taken along the arrow line in FIG. 51. The slit plate 274 is made by evaporating a chromium layer of about 0.1 μm thick as a light blocking portion on the entire upper surface of a glass plate and then selectively removing the chromium layer by etching or the like to form slit openings or light transmitting portions. As shown in FIG. 51, the slit plate 274 is formed with three fine slit openings 274a extending in the Y direction and three fine slit openings 274b extending in the X direction. The slit width of the slit openings 274a and 274b is selected substantially equal to the minimum line-width that can be resolved by the projection lens 6, e.g., 1 μm.

Also, it is assumed that the X and Y directions of the slit plate 274 are selected to be the same with the moving coordinate system of the stage 7. The slit openings 274a are provided to detect the projected images of the marks M1$ij$a and the slit openings 274b are provided to detect the projected images of the marks M1$ij$b. Positioned on the lower side of the glass plate of the slit plate 274 is the photosensitive surface of the photoelectric sensor 9 shown in FIG. 2.

Referring to FIG. 53, there is illustrated a circuit block diagram showing an example of an imaging plane position detecting circuit included in the interface 31 shown in FIG. 6. In FIG. 53, the component parts which are indentical with those shown in FIG. 6 are designated by the same reference numerals.

An up/down pulse SP (hereinafter simply referred to as a pulse) generated from the laser interferometer 13 for every unit distance moved by the stage 7 in the X direction is applied to and counted by an X-direction position measuring counter 400. Though not shown in the FIG., the similar pulses are generated from the laser interferometer 34 and the pulses are similarly counted by a counter.

Then, the count value of the counter 400 is read as an X-direction position data $D_x$ of the stage 7 into the CPU 30.

On the other hand, the photoelectric signal from the photoelectric sensor 9 is amplified by an amplifier 401 and the resulting signal S is applied to a sample-and-hold circuit 402 (hereinafter referred to as an S/H 402). The S/H 402 samples the signal S in response to each pulse SP from the laser interferometer 13 and the sampled signal S is applied to an analog-to-digital converter 403 (hereinafter referred to as an A/D converter 403) which converts the signal to a digital form in synchronism with the timing of generation of the pulse SP. The A/D converter 403 applies the sampled digital value of the signal S as a data $D_f$ to the CPU 30.

On the other hand, a sensor 404 detects the amount of movement of the Z-actuator 38 so as to detect the vertical position of the slit plate 274 and the holder 11 or the position in the Z direction which is perpendicular to the XY plane and the detected value is applied to an analog-to-digital coverter 405 (hereinafter referred to as an A/D converter 405). The A/D converter 405 applies the digitized Z-direction position of the slit plate 274 and the holder 11 as a data $D_z$ to the CPU 30.

Also, the CPU 30 is connected to a memory circuit 406 (hereinafter referred to as an RAM 406) for storing the various data and calculated values.

The amplifier 401, the S/H 402, the A/D converter 403, the sensor 404, the A/D converter 405 and the CPU 30 form means for detecting the image plane position of the projection optical system.

The operation of detecting the optical characteristics of the projection lens 6 by means of the above-described exposure apparatus will now be described.

Firstly, the reticle 505 set in the apparatus is aligned by means of the reticle alignment controller 33. In this case, the alignment is effected in such a manner that the optical axis of the projection lens 6 passes through the origin 0 of the coordinate system xy on the reticle 505. Also, the position of the reticle 505 is determined such that the x and y axes of the coordinate system xy are made parallel (including the exact correspondence) to the moving directions X and Y of the stage 7 or the measuring axes X and Y of the laser interferometers 13 and 34.

Figure 54:
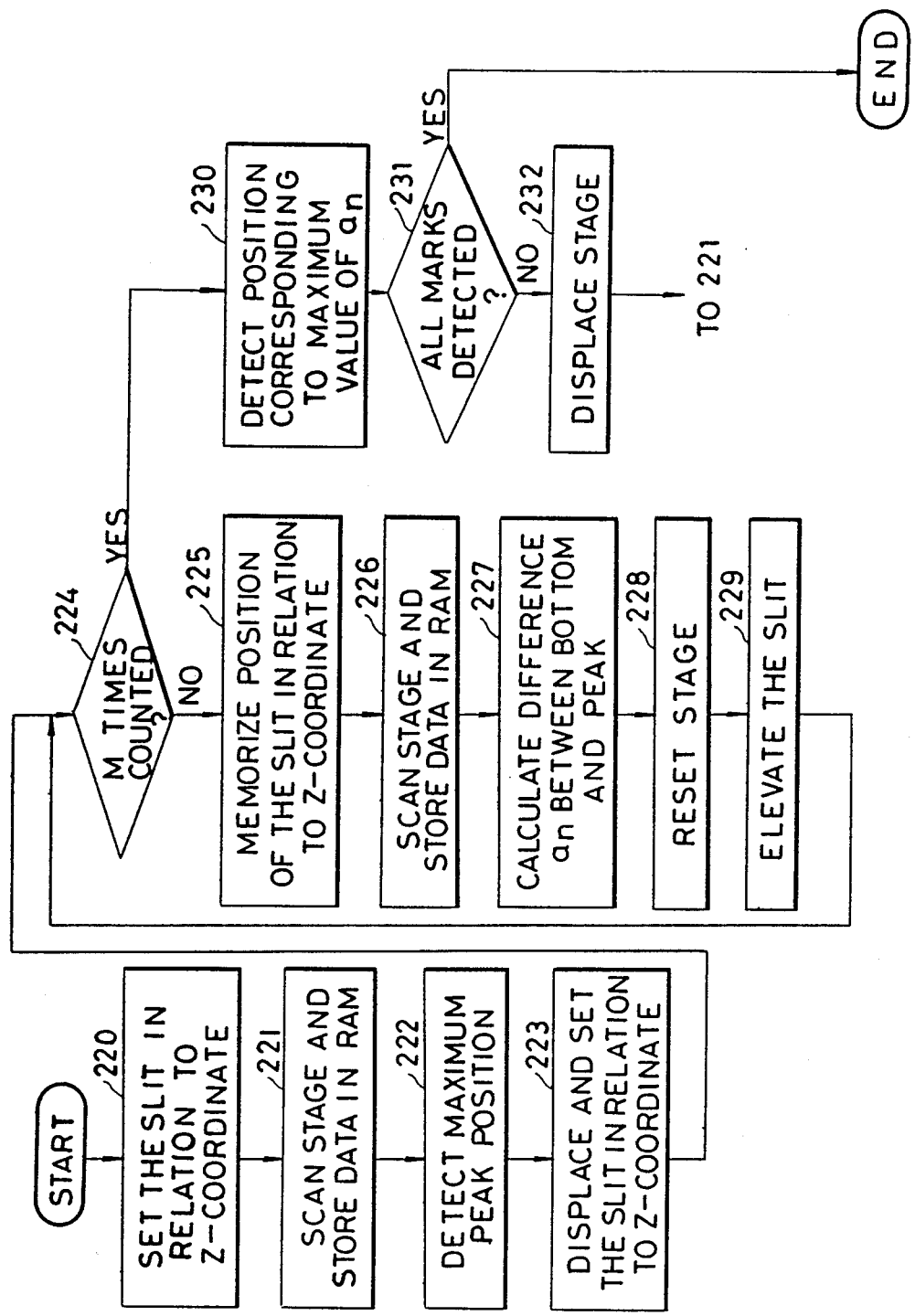
FIG. 54 is a flow chart for detecting the image positions of marks on a reticle in accordance with the fifth embodiment.

Thereafter, the CPU 30 starts the measurement in accordance with the flow chart shown in FIG. 54.

Step 220

In the first place, the CPU 30 reads in the position data from the laser interferometers 13 and 34 and the stage 7 is moved through the operation of the X-actuator 35 and the Y-actuator 36. Then, the stage 7 is positioned so that the slit plate 274 is located just below the gap sensor 12. Thereafter, the height of the surface (the Z-direction position) of the slit plate 274 is detected by the gap sensor 12 and the focus detecting circuit 39 and the CPU 30 operates the Z-actuator 38 in such a manner that a plane which appears to be the image plane of the projecting lens 6 and the surface of the slit plate 274 correspond exactly. By so doing, the slit plate 274 is positioned close to the image plane of the projection lens 6. Then, the shutter 4a is opened by the shutter actuator 32 so that the reticle 505 is illuminated and the image of the mark M1$ij$ is projected.

Step 221

Then, the stage 7 is moved and the projected image M1$ij'$ of the mark M1$ij$ is aligned on the slit plate 274. In this case, the relative positions of the projected image M1$ij'$ and the slit plate 274 are determined as shown in FIG. 55.

Figure 55:
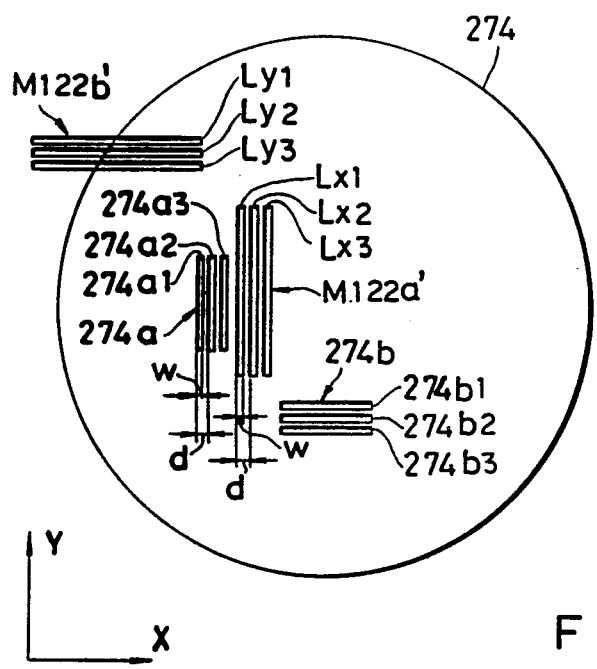
FIG. 55 is a plan view showing the positional relation between the projection images of marks on a reticle and the slit openings in a slit plate.

FIG. 55 shows the relative positions of the projected images M122$a'$ and M122$b'$ of the central mark M122 on the reticle 505 and the slit openings 274$a$ and 274$b$.

The sizes and shapes of the slit openings 274$a$ and 274$b$ and the projected images M1ij will now be described in detail.

The slit openings 274$a$ consist of three slit openings 274$a_1$, 274$a_2$ and 274$a_3$ having the same shape and a width w and arranged regularly with a period d. Similarly, the slit openings 274$b$ consist of three slit openings 274$b_1$, 274$b_2$ and 274$b_3$ having the width w and arranged regularly with the period d.

On the other hand, the projected image M122$a'$ comprises slit-shaped images L$x_1$, L$x_2$ and L$x_3$ having substantially the same width as the width w and arranged with the period d and similarly the projected image M122$b'$ comprises slitshaped images L$y_1$, L$y_2$ and L$y_3$ having substantially the same width as the width w and arranged with the period d.

The slit width w is selected equal to the line-width value of the resolution limit of the projection lens 6, e.g., 1 $\mu$m and the period d is selected two times the width w. While the period d needs not always be selected two times the width w, this is desirable since closer is the value of (d−w) to the linewidth value of the resolution limit, better will be the measurement of the image plane of the projection lens 6 or the sensitivity of focus detection will be more improved. Also, while the number of slits of the slit openings 274$a$ and 274$b$ respectively need not always be selected three and also an increase in the number of slits increases the intensity of photoelectric signals with the resulting improvement of the S/N ratio and the detection accuracy, in this case the number of slits is selected three for purposes of simplification of the description. Also, while the slit openings 274$a_1$, 274$a_2$ and 274$a_3$ need not always have the same width, it is necessary that the image L$x_1$ and the slit opening 247$a_1$ are about the same in width and so the image L$x_2$ and the slit opening 274$a_2$ and the image L$x_3$ and the slit opening 274$a$, respectively.

Next, a description will be made of the signals which are generated from the photoelectric sensor 9 when the stage 7 is moved in the X direction from the position shown in FIG. 55 so that the images L$x_1$, L$x_2$ and L$x_3$ are respectively brought into register with the slit openings 274$a_1$, 274$a_2$ and 274$a_3$ FIGS. 56($a$) and 56($b$) show the X-direction light intensity distributions of the images L$x_1$, L$x_2$ and L$x_3$, that is, FIG. 56($a$) shows the intensity distribution under the in-focus condition and FIG. 56($b$) shows the intensity distributions under the out-of-focus condition. Under the in-focus condition, the intensity distributions of the images L$x_1$, L$x_2$ and L$x_3$ respectively become as shown at I$x_1$, I$x_2$ and I$x_3$ in which the rising and falling portions are sharp, and the bottom portions (the minimum values) of the distributions I$x_1$, I$x_2$ and I$x_4$ are definitely separated from each other.

Figure 56:
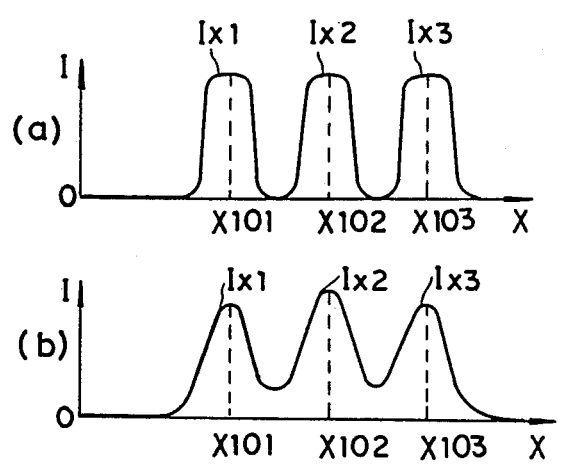
FIGS. 56(a) and (b) are diagrams showing the light intensity distributions of reticle mark projection images.

On the other hand, since the width of the images L$x_1$, L$x_2$ and L$x_3$ is selected equal to the width of the resolution limit, irrespective of its amount, the occurrence of any defocusing causes the rising and falling portions of the distributions I$x_1$, I$x_2$ and I$x_3$ to become gentle and also causes the bottom portions to become continuous without any separation as shown in FIG. 56($b$). It will be apparent that the peak positions X$_{101}$, X$_{102}$ and X$_{103}$ of the distributions I$x_1$, I$x_2$ and I$x_3$ indicate the projection positions of the images L$x_1$, L$x_2$ and L$x_3$ in the X direction.

Figure 57:
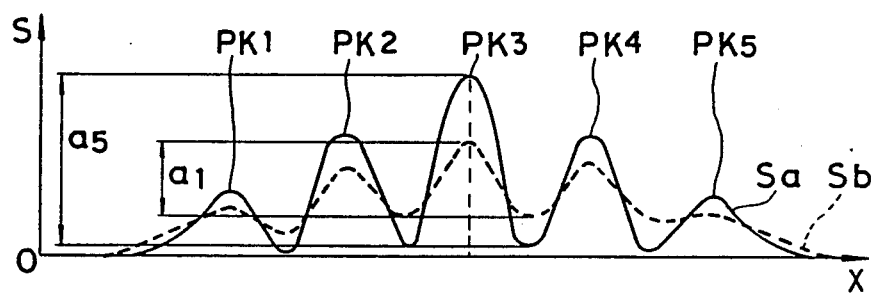
FIG. 57 is a waveform diagram of the photoelectric signals generated in response to the relative movement of the reticle mark projection images and the slit plate.

Then, the projected image M122$a'$ of this light intensity distribution is scanned in the X direction by the slit openings 274$a$. When this occurs, the signal S from the photoelectric sensor 9 attains five peaks PK$_1$ to PK$_5$ as shown in FIG. 57. In FIG. 57, the solid line indicates the signal Sa indicative of the in-focus condition and the broken line indicates the signal Sb indicative of the out-of-focus condition. With the signal S, the peak PK$_1$ is generated in response to the registration between the slit opening 274$a_3$ and the image L$x_1$ alone, and the peak PK$_2$ is generated by the registration between the slit opening 274$a_3$ and the image L$x_2$ and between the slit opening 274$a_2$ and the image L$x_1$. The peak PK$_3$ is generated in response to the registration between the slit openings 274$a_1$ to 274$a_3$ and the images L$x_1$ and L$x_3$, respectively.

Returning again to the description of FIG. 54, when the stage 7 is scanned in the X direction from the position of FIG. 55, the CPU 30 reads in the position data Dx and thereby stores the scanning starting position of the stage 7 in FIG. 55. In response to the pulses SP generated in response to the scanning, the signal S is sampled and the resulting data Df are successively stored at the corresponding addresses in the RAM 406 through (or not through) the CPU 30. In this case, the pulses SP are used for the purpose of updating or accessing the addresses in the RAM 406.

Step 222

Then, the CPU 30 examines the data Df stored in the RAM 406 and obtains the position X$_{100}$ of the peak PK$_3$ which is the maximum among the peaks PK$_1$ to PK$_5$. Since the scanning starting position of the stage 7 has been known previously, the maximum peak position can be calculated easily by counting the number of samples (the number of pulses SP) from the scanning starting position until the peak PK$_3$ is attained.

Step 223

After the position X$_{100}$ of the maximum peak PK$_3$ has been detected, the stage 7 is again set to the scanning starting position and then the slit plate 274 is moved by the Z-actuator 38 downward in the Z-direction (in a direction to move away from the projection lens 6). In this case, the amount of downward shifting in position is limited to less than the depth of focus (e.g., 5 $\mu$m) of the projection lens 6.

Step 224

At this step and the following, the operation of actually measuring exactly the position of the image plane of the projection lens 6 is started. At the step 224, whether the operation of raising the slit plate 274 in the Z direction by ΔZ (a value corresponding to one severalth of the depth of focus, e.g., 0.5 μm) has been repeated m times is determined. If the depth of focus is 5 μm and ΔZ is 0.5 μm, then m=10.

Step 225

Then, the position of the slit plate 274 in the Z direction is stored. This is accomplished by storing the data Dz from the A/D converter 405 in the CPU 30.

Step 226

Then, the stage 7 is scanned so that the sampled data Df is successively stored in the RAM 406 as in the case of the step 221.

Step 227

Then, the CPU 30 calculates the magnitude of a modulated component an of a central peak waveform $PK_3$ in the signal S in accordance with the stored data Df. For instance, the difference $a_1$ between the maximum value of the peak waveform $PK_3$ of the signal Sb shown in FIG. 57 and the minimum value of the bottoms on both sides of the peak waveform $PK_3$ is calculated and stored.

Step 228

Then, the X-actuator 35 is operated and the stage 7 is reset to the scanning starting position.

Step 229

Then, the slit plate 274 is raised by ΔZ by the Z-actuator 38. Then, the program is repeated starting at the step 224. In this way, each time the slit plate 274 is raised by ΔZ, the resulting modulated component an is computed so that when the number of repeats reaches m, a transfer is made to the next step 230.

Step 230

Figure 58:
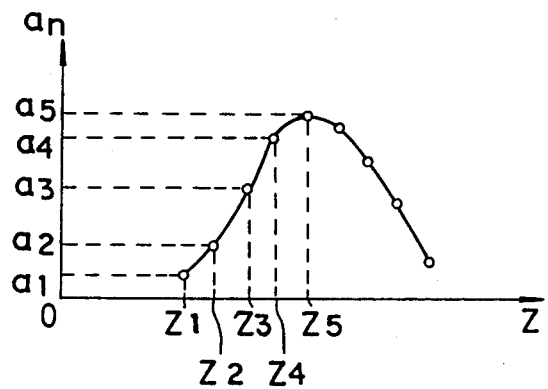
FIG. 58 is a graph showing the relation between the position of the photoelectric sensor in the direction of the optical axis and the magnitude of the modulated component in the photoelectric signal.

FIG. 58 shows the relationship between the thus calculated modulated portion an and the position of the slit plate 274 in the Z direction. Thus, the CPU 30 detects the position $Z_5$ corresponding to the maximum value of the modulated component an and stores the data Dz corresponding to the position $Z_5$.

Step 231

Now, the focusing position of the projected image M122a' of the mark M122 has been detected by the above-mentioned steps. Then, the exactly same detection is performed with respect to each of the other marks M1ija. If the detection has been completed with respect to all the marks, the detection operation is completed. If there is still any mark which has not been measured or detected, a transfer is made to the next step 232.

Step 232

At this step, the stage 7 is moved so that the slit openings 274a and 274b are positioned with respect to the projected image of the mark which has not been detected as shown in FIG. 55. Then, the same measurement is repeated starting at the step 221.

By the above-described operation the plurality of selected Z-direction positions on the image plane of the projection lens 6 have been detected. Also, the foregoing operation has been performed with respect to the marks M1ija and then the stage 7 is moved in such a manner that the projected images M1ijb' of the marks m1ijb are scanned by the slits 274b thereby measuring or detecting the positions of the image plane of the projected image M1ijb'.

Assuming that Zija and Zijb represent the positions of the projected images M1ija' and M1ijb' of the marks M1ij in the Z direction, then the conditions of the projection plane of the projection lens 6, such as, the inclination and bend of the imaging plane can be obtained in accordance with the positions Zija and Zijb. Of course, the positions of the projected images M1ija' and M1ijb' can be obtained from the position of the stage 7 corresponding to the maximum value of the signal S from the photo-electric sensor 9 (e.g., the position $X_{100}$ in FIG. 57) and therefore it is possible to produce maps of the inclinations, bends, etc., of the imaging plane on the basis of the coordinate values of the projected images M1ij' within the projection area of the projection lens 6.

Figure 59:
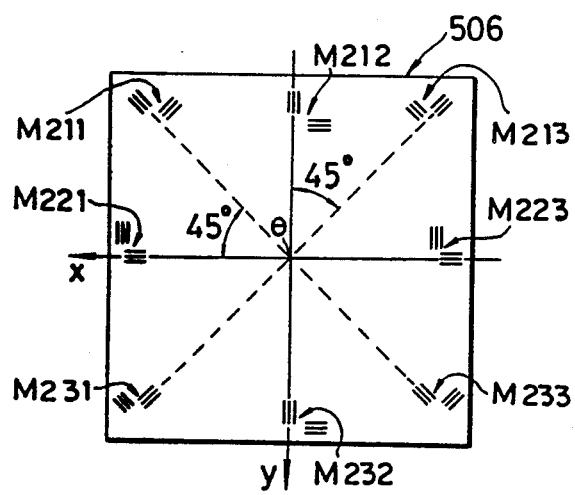
FIG. 59 is a plan view showing a modification of the reticle used with the fifth embodiment of the invention.

Also, while the data relating to the astigmatism can be obtained in accordance with the position data Zija and Zijb, in order to effect the measurements with respect to the astigmatism, it is preferable to arrange marks M211 to M233 positioned outside of the center O of a reticle 506 into two groups one of which extends radially from the center O and the other extends vertically to the center O as shown in FIG. 59.

In FIG. 59, the slits of the marks M211, M213, M231 and M233 are inclined at an angle of 45° or 135° with the axes x and y of the coordinate system xy of the reticle 506.

Figure 60:
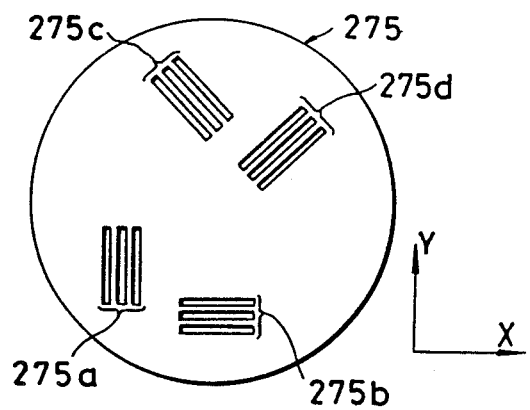
FIGS. 60 and 61 are plan views showing modifications of the slit plate used in the fifth embodiment of the invention.

Thus, where the reticle 506 of this type is used, there are provided slit openings 275c and 275d having the slits extended to incline at an angle of 45° or 135° with respect to a coordinate system XY in addition to slit openings 275a and 275b as shown in FIG. 60. Then, in the detection of the projected images of the marks M211, M213, M231 and M233 in FIG. 59, the focal position of the projection lens 6 can be detected by scanning the slit openings 275c and 275d.

The position of the stage 7 is measured by means of the laser interferometers 13 and 34 and this is for the purpose of accurately detecting the projection positions of the marks of the reticle 506. Thus, where it is desired to simply detect only the position of the image plane of the projection lens 6 in the Z direction, it is not always necessary to use position measuring means such as laser interferometers.

Further, while the number of slits in each reticle mark is selected the same with the number of slits of the respective slit openings on the slit plate, this is of course not always necessary and any combination of the numbers of slits may be used with respect to the slits for the projected images and the slits of the slit plate provided that the photoelectric signal can be generated with a satisfactory S/N ratio.

Still further, while the slits of the reticle marks and the slit openings of the slit plate are arranged with the predetermined pitch, they may be arranged with random pitches. In other words, it is possible to use random pitches such that when the projected image of the reticle mark is accurately aligned with the slit openings, a 1:1 registration takes place between the slit images of the projected image and the slits of the slit openings, whereas when the alignment is inaccurate even a bit, the number of the slits in register is decreased greatly.

Figure 61:
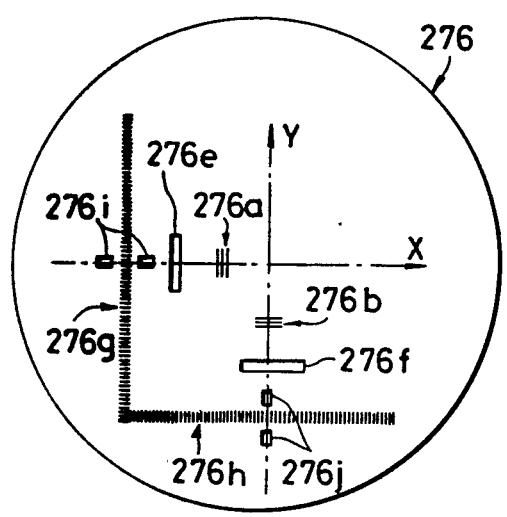

FIG. 61 is a plan view of a modified slit plate 276. In the Figure, slit openings 276a and 276k which are respectively extended parallel to the coordinate system XY established to correspond exactly with the moving coordinate system of the stage 7, are arranged in the same manner as the previously mentioned slit openings 275a and 275b of the slit plate 275. In addition, there are provided a slit 276e and a slit 276f which are respectively extended in the X and Y directions, a lattice pattern 276g comprising fine rectangles arranged regularly in the Y direction and a lattice pattern 276h comprising fine rectangles arranged regularly in the X direction. Also, a mark 276i indicates the Y-direction center of the slit openings 276a the slit 276e and the lattice pattern 276g and a mark 276j indicates the X-direction center of the slit openings 276b, the slit 276f and the lattice pattern 276h.

The above-mentioned slit openings 276a and 276b, the slits 276e and 276f, the lattice patterns 276g and 276h and the marks 276i and 276j are in the form of light transmitting slits formed by removing the chromium layer on the surface of the slit plate 276 by etching or the like.

The slit plate 276 is used in the following manner. The slit openings 276a and 276b are used for detecting the vertical position of the image plane of the projection lens 6 in the like manner as described in conneciton with the first and second embodiments. The slits 276e and 276f are used for adjusting the aligning optical system for the reticle 276 and the optical system for directly observing the condition of registration between the reticle marks and the marks on the wafer 10 through the projection lens 6 (hereinafter referred to as a step monitor optical system), for the positioning of each optical system when it is moved in or out of the optical path and so on. The slits 276e and 276f are picked up by a television camera or the like through the reticle alignment optical system or the step monitor optical system and the automatic detection of positions is effected in accordance with the resulting video signals. For this purpose, the width and length of the slits 276e and 276f are selected to suit the shooting conditions in consideration of the picture resolution of the television camera.

On the other hand, the lattice patterns 276g and 276h are provided so as to correspond exactly with the wafer aligning marks formed on the wafer 10. Generally, the surface of a wafer is formed with irregularities due to a circuit pattern as the manufacturing process proceeds and therefore it is convenient from the alignment point of view to provide the wafer with marks which are different in shape with the circuit patterns. In other words, the exposure apparatus shown in FIG. 2 includes a plurality of wafer aligning microscopes having their optical axes arranged parallel to the optical axis of the projection lens 6 as shown in FIG. 3. Where the wafer is aligned by means of the microscopes or a so-called off-axis alignment is effected, to measure and adjust the distance between the optical axes of the plurality of wafer aligning microscopes and their positions, it is only necessary to detect the diffraction light from the lattice patterns 276g and 276h in the manner described in conneciton with the second embodiment.

As a result, the slit plate 276 shown in FIG. 61 is used not only for detecting the vertical position of the image plane but also as reference marks for establishing a reference for the aligning optical system of the exposure apparatus and for establishing a reference position of the stage 7.

Also, since the inclination of the imaging plane can be detected accurately by means of the slit openings 276a and 276b, in the case of an exposure apparatus incorporating a mechanism for correcting the inclination of the transfer area on a wafer for each exposure of a pattern by the step-and-repeat method or so-called leveling mechanism, it is possible not only to level the wafer surface parallel to the plane of movement of the stage but also to effect the leveling so as to make the image plane and the wafer surface corresond exactly. This is advantageous in that in the case of an exposure apparatus in which the well-focused circuit pattern is always exposed all over each transfer area, in particular a projection lens is used which is small in depth of focus and high in resolution, the production yield of semiconductor devices is improved remarkably.

There is another advantage that by adjusting such that an indication of the in-focus condition is provided by the vertical position data of the slit plate 276 detected by the gap sensor 12 in response to the registration between the position of the image plane and the slit plate 276, it is possible to prevent any deviation of the detection center of the gap sensor 12 due to the drift over a long period, etc.

Figure 62:
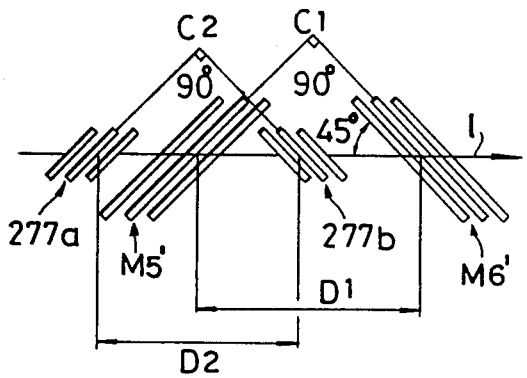
FIG. 62 is a diagram showing another positional relation between the mark projection images and the slit plate in the fifth embodiment of the invention.

While, in FIG. 61, the slit images of the marks and the slit openings 276a and 276b of the slit plate 276 are positioned parallel to one another and the stage 7 is scanned in a direction perpendicular to the direction in which the slits are extended, supposing projected images $M_5'$ and $M_6'$ of the reticle marks which cross each other at right angles as shown in FIG. 62, it is possible to establish a scanning track l which crosses the projected images $M_5'$ and $M_6'$ at an angle of 45° and thereby scan the slit openings 277a and 277b. Also, in this case, the slit openings 277a and 277b are arranged to form an angle of 90° with each other and they also cross the scanning track l at an angle of 45°. Then, the projected image $M_5'$ is detected by the slit openings 277a and the projected image $M_6'$ is detected by the slit openings 277b. If it is desired to detect the projected images separately, the distance $D_1$ between the projected images $M_5'$ and $M_6'$ crossing the scanning track l and the distance $D_2$ between the slit openings 277a and 277b crossing the scanning track l are selected to differ from each other. In this case, it is desirable to arrange such that the distances $D_1$ and $D_2$ are not made equal to each other even if the scanning track l is shifted in a direction perpendicular to the scanning direction thus varying the distance $D_1$.

On the other hand, to concurrently use this slit group for aligning purposes or the like, it is only necessary such that the distances $D_1$ and $D_2$ correspond exactly somewhere within the range of variations of the distance $D_1$ due to the shifting of the scanning track l. In this case, if the stage 7 is moved in such a manner that the intersection $C_2$ of the directions of extension of the slit openings 277a and 277b and the intersection $C_1$ of the directions of extension of the projected images $M_5'$ and $M_6'$ correspond exactly, the photoelectric signal from the photoelectric sensor 9 attains the maximum value. Thus, by detecting that the maximum value is attained, it is possible to effect the alignment or the position detection.

While, in FIGS. 50 to 62, the stage 7 is moved to scan the slit plate and the photoelectric sensor 9, the similar effects can be obtained by adapting the reticle hold 15 to make two-dimensional movements and thereby moving the projected images of the reticle marks relative to the slit plate. Also, where it is desired to detect only the position of the imaging plane of the projection lens 6, it is possible to increase the number of slits in each of the reticle marks fully over the number of slits of the respective slit openings and also arrange such that the position of the slit plate and the photoelectric sensor 9 is varied simultaneously during the scanning of the projected images of the marks by the slit openings. In this case, the signal S has a modulated waveform such as shown in FIG. 63.

Figure 63:
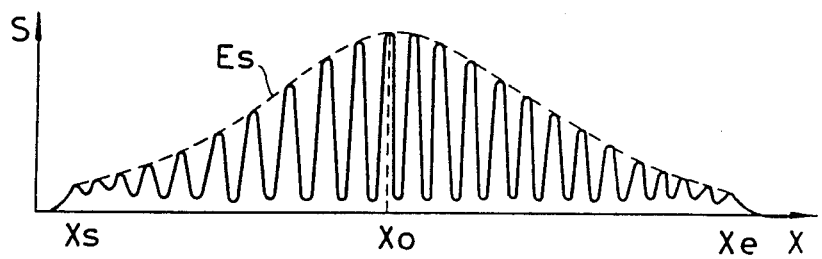
FIG. 63 is a waveform diagram showing the modulated waveform of the photoelectric signals generated in accordance with another embodiment.

In FIG. 63, the abscissa represents for example the position of the slit plate and the photoelectric sensor 9 in the X direction and the ordinate represents the magnitude of the signal S. This modulated waveform is produced when the Z-actuator 38 is operated in such a manner that the slit openings are moved in the direction of the optical axis perpendicular to the imaging surface of the projection lens 6 during the time that the slit openings are scanned from a position $X_s$ to a position $X_e$. Also, in the modulated waveform, each of the peaks is generated in response to the alignment of each slit opening with each of the slit images of the mark. Then, the envelope $E_s$ of the modulated waveform attains the maximum value at a position $X_p$ during the interval from the position $X_s$ to the position $X_e$.

As a result, by detecting the Z-direction position dat $D_2$ of the slit plate corresponding to the maximum value of the envelope $E_s$, it is possible to detect the imaging plane of the projection lens 6. In this case, more specifically with reference to the circuitry of FIG. 53, an ac amplifier is added to receive the signal S from the amplifier 401 so that only the alternating component is taken from the modulated waveform of FIG. 63 and the ac signal is subjected to half-wave or full-wave rectification and smoothed thereby generating a signal corresponding to the envelope $E_s$ or a signal equivalent to such a waveform as shown in FIG. 58. This signal is then read as a digital data into the CPU 30 through the S/H 402 and the A/D converter 403. This is advantageous in that it is required to scan the stage 7 only once thus making it possible to detect the positions of the imaging plane of the projection lens 6 very rapidly with a high degree of accuracy.

What is claimed is:

1. An exposure apparatus for producing semiconductor devices comprising:
   (a) a mask in which a plurality of sets of a first mark and a second mark are placed at predetermined positions, the first marks extending in one direction and the second marks extending in a direction at nearly right angles to said one direction;
   (b) means for illuminating said mask;
   (c) an optical system for forming on a given plane an image of each of a plurality of said first and second marks of said mask illuminated by said illuminating means;
   (d) light intensity detecting means having at least one first detection surface and at least one second detection surface for detecting the images of the plurality of sets of said first mark and said second mark, said at least one first detection surface extending in a determined direction on a rectangular coordinate system intersecting the optical axis of said optical system at nearly right angles, said at least one second detection surface extending in the other direction at nearly right angles to said determined direction, said light intensity detecting means detecting the intensity of light incident on said at least one first detection surface and said at least one second detection surface and producing light intensity signals;
   (e) means for moving said at least one first detection surface and said at least one second detection surface on said given plane; and
   (f) means for detecting optical characteristics of said optical system in response to said light intensity signals.

2. An apparatus according to claim 1, wherein said first detection surface detects the plurality of said first marks and said second detection surface detects the plurality of said second marks.

3. An apparatus according to claim 1, wherein said light intensity detecting means includes at least one photoelectrical conversion element for converting light incident on said at least one first detection surface and said at least one second detection surface to an electric signal.

4. An apparatus according to claim 1, further comprising means for moving said at least one first detection plane and said at least one second detection plane along said optical axis.

5. An apparatus according to claim 4, further comprising means for varying a correlation between said mask and said optical system in such a manner that the center of said mask nearly coincides with said optical axis of said optical system.

6. An apparatus according to claim 4, wherein said optical characteristic detecting means comprises means for detecting a position of said given plane in the direction of said optical axis in accordance with said light intensity signal generated at each of a plurality of positions thereof in said optical axis direction.

7. An apparatus according to claim 1, wherein said light intensity detecting means includes a shading member provided with at least one first opening and at least one second opening, said at least one first opening and said at least one second opening corresponding with said at least one first detection surface and said at least one second detection surface respectively.

8. An exposure apparatus for holding a mask on which at least one mark and a circuit pattern are formed and for exposing an image of said circuit pattern on a light-sensitive surface of a substrate having a predetermined mark, comprising:
   (a) illuminating means for illuminating said at least one mark by light of predetermined wavelength;
   (b) an optical system for forming images of said at least one mark and said circuit pattern on a given plane;
   (c) a stage for supporting said substrate thereon in such a manner that said light-sensitive surface of said substrate substantially corresponds with said given plane;
   (d) first moving means for moving said stage on a two-dimensional coordinate system intersecting an optical axis of said optical system at nearly right angles;
   (e) position detecting means for detecting the position of said stage on said two-dimensional coordinate system and for generating a position signal;
   (f) mask aligning means including light intensity detecting means for detecting an image of said at least one mark obtained by projecting light of said predetermined wavelength through said optical system and second moving means, said light intensity detecting means having a detection surface, which is provided on said stage, and producing a light intensity detection signal in accordance with the light of said predetermined wavelength incident on said detection surface, said second moving means moving said mask on a plane intersecting said optical axis of said optical system at nearly right angles, said mask aligning means controlling said second moving means in compliance with said position signal and said light intensity signal and aligning said mask with said apparatus; and (g) substrate aligning means including projecting means for projecting a light beam of a wavelength different from said predetermined wavelength on said predetermined mark of said substrate supported by said stage, photo information detecting means for detecting photo information generated by projection of said light beam on said predetermined mark and generating an output, said substrate aligning means aligning said substrate with said apparatus in accordance with said position signal and said output generated by said photo information detecting means, said substrate aligning means including a mark, which generates a photo information like that generated by said predetermined mark with respect to said light beam, formed in a predetermined correlated position with respect to said detection surface on said stage, and said substrate aligning menas detecting the position of said light beam on said given surface in accordance with photo information from said mark provided to said stage and said position signal.

9. An apparatus according to claim 8, wherein said detection surface is limited within a predetermined area.

10. An apparatus according to claim 8, wherein said light intensity detecting means includes a shading member having an opening which defines said detection surface.

11. An apparatus according to claim 10, wherein the mark provided on said shading member forms a diffraction grating.

12. An exposure apparatus for exposing a circuit pattern on a light-sensitive surface of a substrate comprising:

(a) a first mask on which a plurality of marks are provided at predetermined positions;

(b) a second mask on which at least one mark and a circuit pattern are formed;

(c) holding means for holding either one of said first and second masks;

(d) an optical system for forming an image of the mask held by said holding means on a given plane;

(e) a stage for supporting said substrate thereon in such a manner that said light-sensitive surface of said substrate substantially corresponds with said given plane;

(f) moving means for moving said stage on a two-dimensional coordinate system intersecting an optical axis of said optical system at nearly right angles;

(g) means for detecting the position of said stage on said two-dimensional coordinate system and generating a position signal;

(h) optical characteristic detecting means including means for detecting images formed by said optical system from said plurality of marks of said first mask held by said holding means, whereby the position of each of said images on said two-dimensional coordinate system of said plurality of marks on said first mask is detected on the basis of the output of said light intensity detecting means and said position signal and thereby the optical characteristic of said optical system is detected;

(i) driving means for driving said holding means so as to move the mask held by said holding means on said two-dimensional coordinate system; and (j) means for controlling said driving means and aligning said second mask with said apparatus so that the image formed by said optical system of said at least one mark on said second mask held by said holding means shall be detected by said light intensity detecting means on said stage at a predetermined position.

13. An exposure apparatus for exposing a circuit pattern formed on a mask onto a light-sensitive surface of a substrate, said mask being formed with first and second marks, said apparatus comprising:

(a) a holding member for holding said mask;

(b) a stage means for supporting said substrate thereon;

(c) a projection optical system for projecting an image of said mask held by said holding member onto the light-sensitive surface of said substrate supported on said stage means, said holding member holding said mask in such a manner that a plane of said mask intersects an optical axis of said projection optical system at nearly right angles, said stage means supporting said substrate thereon in such a manner that the light-sensitive surface of said substrate intersects the optical axis of said projection optical system at nearly right angles;

(d) first moving means for moving said holding member on a first two-dimensional coordinate system intersecting said optical axis at nearly right angles;

(e) second moving means for moving said substrate supported on said stage means on a second two-dimensional coordinate system intersecting said optical axis at nearly right angles;

(f) image detecting means for detecting images of said first and second marks formed by said projection optical system on said second two-dimensional coordinate system, said image detecting means including radiation intensity detecting means having a detection surface, said radiation intensity detecting means detecting the intensity of radiation incident on said detection surface, said detecting means being adapted to detect the images of said first and second marks on said second two-dimensional coordinate system at different times; and (g) control means responsive to said detection signal to control said first moving means.

14. An apparatus according to claim 13, wherein said control means comprises:

means for generating a position signal indicative of a position of said stage means on said second two-dimensional coordinate system;

position detecting means responsive to said position signal and said detection signal to detect a position of each of the images of said first and second marks on said second two-dimensional coordinate system; and means for computing an inclination of a straight line connecting the positions of the images of said first and second marks on said second two-dimensional coordinate system detected by said position detecting means with respect to one of the coordinate axes of said second two-dimensional coordinate system.

15. An apparatus according to claim 14, wherein said second moving means comprises rotating means for rotating said substrate supported on said stage means on said second two-dimensional coordinate system, and wherein said control means controls said rotating means in accordance with said computed inclination.

16. An apparatus according to claim 13, wherein said detection surface is limited within a predetermined area.

17. An apparatus according to claim 13, wherein said radiation intensity detecting means includes a shading member having an opening which defines said detection surface.

18. An exposure apparatus for exposing a circuit pattern of a mask on a light-sensitive surface of a substrate, said circuit pattern being formed by a radiation-transmitting transparent portion and a non-transparent portion, said mask being formed with first and second transparent portions not forming said circuit pattern, said apparatus comprising;
 (a) a holding member for holding said mask in such a manner that a plane of said mask substantially corresponds with a first plane disposed substantially perpendicular to an axis established in said apparatus;
 (b) stage means for supporting said substrate thereon in such a manner that the light-sensitive surface of said substrate substantially corresponds with a second plane disposed substantially perpendicular to said axis;
 (c) radiation means for projecting a radiation onto said mask held by said holding member;
 (d) displacement means for displacing said holding member and said stage means relative to each other so as to maintain a condition in which the plane of said mask held by said holding member substantially corresponds with said first plane and a condition in which the light-sensitive surface of said substrate supported on said stage means substantially corresponds with said second plane; and
 (e) mark detecting means for detecting said radiation transmitted through said first and second transparent portions of said mask held by said holding member on said second plane, said detecting means comprising radiation intensity detecting means for detecting the intensity of the radiation, said mark detecting means being adapted to detect at different times said radiation transmitted through said first transparent portion and said radiation transmitted through said second transparent portion on said second plane.

19. An apparatus according to claim 18, wherein said radiation intensity detecting means has a detection surface provided on said stage means and produce a detection signal.

20. An apparatus according to claim 19, wherein said detection surface is limited within a predetermined area.

21. An apparatus according to claim 20, wherein said radiation intensity detecting means includes a shading member having an opening which defines said detection surface.

22. An apparatus according to claim 21, further comprising control means responsive to said detection signal to control said displacement means.

23. An apparatus according to claim 22, wherein said displacement means comprises means for moving said holding means in such a manner that said mask held by said holding member is moved on a two-dimensional coordinate system substantially perpendicular to said axis.

* * * * *